(12) United States Patent
Yamazaki et al.

(10) Patent No.: US 10,388,538 B2
(45) Date of Patent: Aug. 20, 2019

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Hideyuki Kishida, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/332,198

(22) Filed: Oct. 24, 2016

(65) Prior Publication Data

US 2017/0040181 A1 Feb. 9, 2017

Related U.S. Application Data

(62) Division of application No. 13/034,726, filed on Feb. 25, 2011, now Pat. No. 9,496,404.

(30) Foreign Application Priority Data

Mar. 5, 2010 (JP) .................................. 2010-049263

(51) Int. Cl.
*H01L 21/02* (2006.01)
*H01L 21/477* (2006.01)
(Continued)

(52) U.S. Cl.
CPC ............ *H01L 21/477* (2013.01); *G11C 16/10* (2013.01); *G11C 16/14* (2013.01); *G11C 16/26* (2013.01);
(Continued)

(58) Field of Classification Search
CPC ........... H01L 21/02554; H01L 27/1225; H01L 29/7869; H01L 29/78693; H01L 21/02565; H01L 29/66969
See application file for complete search history.

(56) References Cited

U.S. PATENT DOCUMENTS 5,313,075 A 5/1994 Zhang et al.
5,523,240 A 6/1996 Zhang et al.
(Continued)

FOREIGN PATENT DOCUMENTS

EP 0459763 A 12/1991
EP 1737044 A 12/2006
(Continued)

OTHER PUBLICATIONS

Korean Office Action (Application No. 2012-7026041) dated Mar. 17, 2017.
(Continued)

*Primary Examiner* — Monica D Harrison
*Assistant Examiner* — John Lin
(74) *Attorney, Agent, or Firm* — Robinson Intellectual Property Law Office; Eric J. Robinson

(57) ABSTRACT

An object of the present invention to provide a highly reliable semiconductor device. Another object is to provide a manufacturing method of a highly reliable semiconductor device. Still another object is to provide a semiconductor device having low power consumption. Yet another object is to provide a manufacturing method of a semiconductor device having low power consumption. Furthermore, another object is to provide a semiconductor device which can be manufactured with high mass productivity. Another object is to provide a manufacturing method of a semiconductor device which can be manufactured with high mass productivity. An impurity remaining in an oxide semicon-
(Continued)

ductor layer is removed so that the oxide semiconductor layer is purified to have an extremely high purity. Specifically, after adding a halogen element into the oxide semiconductor layer, heat treatment is performed to remove an impurity from the oxide semiconductor layer. The halogen element is preferably fluorine.

17 Claims, 22 Drawing Sheets

(51) Int. Cl.
| | |
|---|---|
| H01L 21/322 | (2006.01) |
| H01L 27/11521 | (2017.01) |
| H01L 27/1156 | (2017.01) |
| H01L 27/12 | (2006.01) |
| H01L 29/786 | (2006.01) |
| H01L 29/66 | (2006.01) |
| H01L 27/105 | (2006.01) |
| G11C 16/26 | (2006.01) |
| G11C 16/14 | (2006.01) |
| G11C 16/10 | (2006.01) |
| H01L 29/24 | (2006.01) |
| G02F 1/1368 | (2006.01) |
| G09G 3/36 | (2006.01) |
| G02F 1/137 | (2006.01) |
| G02F 1/1343 | (2006.01) |
| G02F 1/1333 | (2006.01) |

(52) U.S. Cl.
CPC .. *H01L 21/02554* (2013.01); *H01L 21/02565* (2013.01); *H01L 21/02631* (2013.01); *H01L 21/3228* (2013.01); *H01L 27/1052* (2013.01); *H01L 27/1156* (2013.01); *H01L 27/11521* (2013.01); *H01L 27/1203* (2013.01); *H01L 27/1225* (2013.01); *H01L 29/247* (2013.01); *H01L 29/66969* (2013.01); *H01L 29/7869* (2013.01); *H01L 29/78693* (2013.01); *H01L 29/78696* (2013.01); *G02F 1/137* (2013.01); *G02F 1/1368* (2013.01); *G02F 1/13439* (2013.01); *G02F 1/133345* (2013.01); *G02F 1/134309* (2013.01); *G02F 2201/121* (2013.01); *G02F 2201/123* (2013.01); *G09G 3/3648* (2013.01); *G09G 2310/08* (2013.01); *G09G 2330/021* (2013.01); *H01L 21/02573* (2013.01); *H01L 21/02614* (2013.01); *H01L 21/02667* (2013.01)

(56) References Cited

U.S. PATENT DOCUMENTS

| | | | |
|---|---|---|---|
| 5,585,949 A | 12/1996 | Yamazaki et al. | |
| 5,620,906 A | 4/1997 | Yamaguchi et al. | |
| 5,731,856 A | 3/1998 | Kim et al. | |
| 5,744,864 A | 4/1998 | Cillessen et al. | |
| 5,897,346 A | 4/1999 | Yamaguchi et al. | |
| 6,160,268 A | 12/2000 | Yamazaki | |
| 6,174,757 B1 | 1/2001 | Yamaguchi et al. | |
| 6,197,624 B1 | 3/2001 | Yamazaki | |
| 6,294,274 B1 | 9/2001 | Kawazoe et al. | |
| 6,380,560 B1 | 4/2002 | Yamazaki et al. | |
| 6,452,211 B1 | 9/2002 | Ohtani et al. | |
| 6,482,697 B1 | 11/2002 | Shirai | |
| 6,563,174 B2 | 5/2003 | Kawasaki et al. | |
| 6,570,552 B2 | 5/2003 | Yamazaki | |
| 6,607,947 B1 | 8/2003 | Zhang et al. | |
| 6,693,300 B2 | 2/2004 | Ohtani et al. | |
| 6,709,906 B2 | 3/2004 | Yamaguchi et al. | |
| 6,727,522 B1 | 4/2004 | Kawasaki et al. | |
| 6,730,932 B2 | 5/2004 | Yamazaki et al. | |
| 6,884,700 B2 | 4/2005 | Aoki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,262,463 B2 | 8/2007 | Hoffman | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,355,202 B2 | 4/2008 | Zhang et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,564,055 B2 | 7/2009 | Hoffman | |
| 7,601,984 B2 * | 10/2009 | Sano | H01L 21/428 257/52 |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,003,981 B2 | 8/2011 | Iwasaki et al. | |
| 8,154,017 B2 | 4/2012 | Yabuta et al. | |
| 8,173,487 B2 | 5/2012 | Urayama et al. | |
| 8,178,926 B2 | 5/2012 | Nakayama | |
| 8,258,023 B2 | 9/2012 | Lee | |
| 8,450,783 B2 | 5/2013 | Yamazaki et al. | |
| 8,461,583 B2 | 6/2013 | Yano et al. | |
| 8,502,222 B2 | 8/2013 | Yabuta et al. | |
| 8,559,220 B2 | 10/2013 | Yamazaki et al. | |
| 8,642,412 B2 | 2/2014 | Yamazaki et al. | |
| 8,723,175 B2 | 5/2014 | Yano et al. | |
| 8,723,182 B2 | 5/2014 | Yamazaki et al. | |
| 8,786,793 B2 | 7/2014 | Yamazaki | |
| 8,791,457 B2 | 7/2014 | Yano et al. | |
| 8,907,333 B2 | 12/2014 | Petrat et al. | |
| 9,389,477 B2 | 7/2016 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0164300 A1 | 8/2004 | Yamazaki et al. | |
| 2005/0017244 A1 | 1/2005 | Hoffman et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038242 A1 * | 2/2006 | Hsu | H01L 29/516 257/407 |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |

(56) References Cited

U.S. PATENT DOCUMENTS

| | | |
|---|---|---|
| 2007/0054507 A1 | 3/2007 | Kaji et al. |
| 2007/0072439 A1* | 3/2007 | Akimoto ............ H01L 27/1225 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0206923 A1 | 8/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0283831 A1 | 11/2008 | Ryu et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0101910 A1 | 4/2009 | Zhang et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1* | 6/2010 | Hayashi ............ H01L 21/28282 257/43 |
| 2010/0276688 A1 | 11/2010 | Yano et al. |
| 2010/0283049 A1 | 11/2010 | Sato et al. |
| 2011/0089417 A1 | 4/2011 | Yamazaki et al. |
| 2011/0256684 A1 | 10/2011 | Iwasaki et al. |
| 2012/0319103 A1 | 12/2012 | Lee |
| 2014/0175437 A1 | 6/2014 | Uchiyama |

FOREIGN PATENT DOCUMENTS

| | | |
|---|---|---|
| EP | 1976018 A | 10/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-268060 A | 10/1989 |
| JP | 04-165679 A | 6/1992 |
| JP | 05-251705 A | 9/1993 |
| JP | 07-288329 A | 10/1995 |
| JP | 08-264794 A | 10/1996 |
| JP | 10-209465 A | 8/1998 |
| JP | 11-074535 A | 3/1999 |
| JP | 11-505377 | 5/1999 |
| JP | 11-168213 A | 6/1999 |
| JP | 11-354443 A | 12/1999 |
| JP | 2000-044236 A | 2/2000 |
| JP | 2000-150900 A | 5/2000 |
| JP | 2001-125141 A | 5/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-318120 A | 11/2003 |
| JP | 2004-103957 A | 4/2004 |
| JP | 2004-273614 A | 9/2004 |
| JP | 2004-273732 A | 9/2004 |
| JP | 2006-058676 A | 3/2006 |
| JP | 2006-165527 A | 6/2006 |
| JP | 2006-165528 A | 6/2006 |
| JP | 2006-165529 A | 6/2006 |
| JP | 2007-096055 A | 4/2007 |
| JP | 2007-519256 | 7/2007 |
| JP | 2007-220816 A | 8/2007 |
| JP | 2007-299913 A | 11/2007 |
| JP | 2008-060313 A | 3/2008 |
| JP | 2008-277326 A | 11/2008 |
| JP | 2009-055011 A | 3/2009 |
| JP | 2009-141002 A | 6/2009 |
| JP | 2009-158663 A | 7/2009 |
| JP | 2009-212476 A | 9/2009 |
| JP | 2010-021170 A | 1/2010 |
| JP | 2010-040552 A | 2/2010 |
| JP | 2010-056539 A | 3/2010 |
| JP | 2010-525602 | 7/2010 |
| KR | 2006-0132659 A | 12/2006 |
| KR | 2008-0114802 A | 12/2008 |
| TW | 200943552 | 10/2009 |
| WO | WO-2004/114391 | 12/2004 |
| WO | WO-2005/015643 | 2/2005 |
| WO | WO-2005/074038 | 8/2005 |
| WO | WO-2007/119386 | 10/2007 |
| WO | WO-2008/126729 | 10/2008 |
| WO | WO-2008/128821 | 10/2008 |
| WO | WO-2008/133220 | 11/2008 |
| WO | WO-2008/133456 | 11/2008 |
| WO | WO-2009/072532 | 6/2009 |
| WO | WO-2009/081885 | 7/2009 |

OTHER PUBLICATIONS

International Search Report (Application No. PCT/JP2011/053614) dated May 31, 2011.
Written Opinion (Application No. PCT/JP2011/053614) dated May 31, 2011.
Fortunato.E et al., "Wide-Bandgap High-Mobility ZnO Thin-Film Transistors Produced at Room Emperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp, 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Compositions for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2: Invited Paper:Fast Electro-Optical Switching in Polymer-Stabilized Liquid Crystallin Blue Phases for Display

(56) References Cited

OTHER PUBLICATIONS

Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park. Sang-Hee et al., "42.3; Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. 13), Oct. 4, 2007, vol. 76, No. 16, pp, 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl, Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Taiwanese Office Action (Application No. 100107165) dated May 20, 2015.
Korean Office Action (Application No. 2018-7015965) dated Jun. 18, 2018.

* cited by examiner

SEMICONDUCTOR DEVICE AND MANUFACTURING METHOD THEREOF

TECHNICAL FIELD

The present invention relates to a semiconductor device including an oxide semiconductor. The present invention also relates to a manufacturing method of the semiconductor device. Note that semiconductor devices herein refer to general elements and devices which function by utilizing semiconductor characteristics.

BACKGROUND ART

A technique in which a transistor is formed using a semiconductor layer formed over a substrate having an insulating surface is known. For example, a technique in which a transistor is formed over a glass substrate using a thin film including a silicon-based semiconductor material and the transistor is applied to a liquid crystal display device or the like is known.

A transistor which is used in a liquid crystal display device is generally formed using a semiconductor material such as amorphous silicon or polycrystalline silicon. Although transistors including amorphous silicon have low field effect mobility, a larger glass substrate can be used in the case of using amorphous silicon. Meanwhile, transistors including polycrystalline silicon have high field effect mobility; however, they need to be subjected to a crystallization step such as laser annealing and thus are not always suitable for larger glass substrates.

As another material, an oxide semiconductor attracts attention. Zinc oxide and a materials including zinc oxide are known as oxide semiconductor materials. Thin film transistors each of which is formed using an amorphous oxide (an oxide semiconductor) having an electron carrier concentration of lower than $10^{18}/cm^3$ are disclosed in Patent Documents 1 to 3.

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

Transistors utilizing semiconductor characteristics preferably have a small variation in threshold voltage, which is caused by degradation over time, a small off-state current, and the like. For example, if a transistor having a large variation in threshold voltage, which is caused by degradation over time, is used in a semiconductor device, reliability of the semiconductor device is lowered. Further, if a transistor having a large off-state current is used in a semiconductor device, power consumption of the semiconductor device is increased.

It is an object of the present invention to provide a highly reliable semiconductor device. It is another object to provide a manufacturing method of a highly reliable semiconductor device.

It is still another object to provide a semiconductor device having low power consumption. It is yet another object to provide a manufacturing method of a semiconductor device having low power consumption.

Furthermore, it is another object to provide a semiconductor device which can be manufactured with high mass productivity. It is another object to provide a manufacturing method of a semiconductor device which can be manufactured with high mass productivity.

In order to achieve the above-described objects, the present inventors focus attention on the fact that in a semiconductor device having a semiconductor layer including an oxide semiconductor, the concentration of impurities included in the oxide semiconductor layer affects the variation in the threshold voltage and the increase in the off-state current. As examples of the impurities, hydrogen and a substance including hydrogen, such as water, can be given. The substance including hydrogen supplies hydrogen to a metal in the oxide semiconductor layer, and the impurity level is formed.

Most of impurities included in the oxide semiconductor layer can be removed by performing heat treatment at high temperature (e.g., 600° C.) after the oxide semiconductor layer is formed. However, an impurity which is strongly bonded to a metal included in the oxide semiconductor (e.g., hydrogen or a hydroxyl group) remains in the oxide semiconductor layer due to the strong bonding force. When a semiconductor layer includes an oxide semiconductor in which an impurity remains, a problem such as an increase in an off-state current arises.

In order to achieve the above-described objects, an impurity remaining in the oxide semiconductor layer is removed so that the oxide semiconductor layer is purified to have an extremely high purity. Specifically, after a substance which can be strongly bonded to an impurity is added into the oxide semiconductor layer, heat treatment is performed to remove a stable substance including hydrogen from the oxide semiconductor layer. The substance which can be strongly bonded to an impurity is preferably a substance including a halogen element, for example. If a halogen element having a high kinetic energy is added to the oxide semiconductor layer, a bond between a metal of the oxide semiconductor and hydrogen, a bond between a metal and a hydroxyl group, or a bond between oxygen and hydrogen in a hydroxyl group that is bonded to a metal can be cut, for example.

When a bond between a metal and an impurity is cut by adding the substance which can be strongly bonded to an impurity into the oxide semiconductor layer, a dangling bond may be generated on a metal atom in some cases. The dangling bond causes generation of carriers, whereby the carrier density is increased. A semiconductor device including an oxide semiconductor layer having a high carrier density is not preferable because it tends to be normally on owing to the decrease in the threshold voltage.

The above-described problem is also solved by adding a halogen element into the oxide semiconductor layer. Since a halogen element bonds to a dangling bond on a metal atom and the dangling bond is terminated, generation of carriers can be reduced.

That is, an embodiment of the present invention is a manufacturing method of a semiconductor device, which includes the steps of forming a gate electrode over a substrate having an insulating surface; forming a gate insulating layer over the gate electrode; forming an oxide semiconductor layer overlapping with the gate electrode and in contact with the gate insulating layer; adding a halogen element into the oxide semiconductor layer; performing first heat treatment on the oxide semiconductor layer into which the halogen element is added; forming a source electrode and a drain electrode each having an end portion overlapping with the gate electrode and in contact with the oxide semiconductor layer on which the heat treatment is performed; and forming an insulating layer overlapping with a channel formation region of the oxide semiconductor layer and in contact with a surface of the oxide semiconductor layer.

Another embodiment of the present invention is a manufacturing method of a semiconductor device, which includes the steps of forming a source electrode and a drain electrode over a substrate having an insulating surface; forming an oxide semiconductor layer covering an end portion of the source electrode and an end portion of the drain electrode; adding a halogen element into the oxide semiconductor layer; performing first heat treatment on the oxide semiconductor layer into which the halogen element is added; forming a gate insulating layer overlapping with the end portion of the source electrode and the end portion of the drain electrode and in contact with the oxide semiconductor layer on which the heat treatment is performed; and forming a gate electrode overlapping with the end portion of the source electrode and the end portion of the drain electrode and in contact with the gate insulating layer.

In the above embodiments of the manufacturing method of a semiconductor device, oxygen may be added into the oxide semiconductor layer after the first heat treatment. It is preferable to add oxygen into the oxide semiconductor layer because oxygen, which is one of main components of the oxide semiconductor, can be supplied. Further, second heat treatment may be performed after the addition of oxygen into the oxide semiconductor layer. By the addition of oxygen and the second heat treatment, impurities which have not been removed by the addition of the halogen element and the first heat treatment can be removed; accordingly, the oxide semiconductor layer can be purified and become an electrically i-type (intrinsic) or substantially i-type oxide semiconductor layer.

In the above embodiments of the manufacturing method of a semiconductor device, the first heat treatment is preferably performed at a temperature higher than or equal to 250° C. and lower than or equal to 600° C.

In the above embodiments of the manufacturing method of a semiconductor device, heat treatment may be performed after the step of forming the oxide semiconductor layer. By the heat treatment performed after the formation of the oxide semiconductor layer, impurities such as hydrogen or moisture in the oxide semiconductor layer may be eliminated and exhausted. In the case where a halogen element is added after the heat treatment, the concentration of impurities included in the oxide semiconductor layer can be further reduced.

Further, another embodiment of the present invention is a manufacturing method of a semiconductor device, which includes the steps of forming a second transistor using any of the above-described embodiments of the manufacturing method of a semiconductor device, over an insulating film formed over a first transistor.

Still another embodiment of the present invention is a semiconductor device including a gate electrode over an insulating surface; a gate insulating layer over the insulating surface and the gate electrode; an oxide semiconductor layer having a halogen element concentration higher than or equal to $10^{15}$ atoms/cm$^3$ and lower than or equal to $10^{18}$ atoms/cm$^3$, over the gate insulating layer; a source electrode and a drain electrode over the gate insulating layer and the oxide semiconductor layer; and an insulating layer in contact with part of the oxide semiconductor layer and over the gate insulating layer, the oxide semiconductor layer, the source electrode, and the drain electrode.

A yet another embodiment of the present invention is a semiconductor device including a source electrode and a drain electrode over an insulating surface; an oxide semiconductor layer having a halogen element concentration higher than or equal to $10^{15}$ atoms/cm$^3$ and lower than or equal to $10^{18}$ atoms/cm$^3$, over the insulating surface, the source electrode, and the drain electrode; a gate insulating layer over the insulating surface, the source electrode, the drain electrode, and the oxide semiconductor layer; and a gate electrode over the gate insulating layer.

In the above embodiments of the semiconductor device, fluorine is preferable as the halogen element. This is because a bond energy between fluorine and hydrogen is higher and more stable than a bond energy between any of the other halogen elements and hydrogen.

An embodiment of the present invention can provide a highly reliable semiconductor device. Further, another embodiment of the present invention can provide a manufacturing method of a highly reliable semiconductor device.

An embodiment of the present invention can provide a semiconductor device having low power consumption. Further, another embodiment of the present invention can provide a manufacturing method of a semiconductor device having low power consumption.

An embodiment of the present invention can provide a semiconductor device which can be manufactured with high mass productivity. Further, an embodiment of the present invention can provide a manufacturing method of a semiconductor device which can be manufactured with high mass productivity.

BEST MODE FOR CARRYING OUT THE INVENTION

Figure 1A:
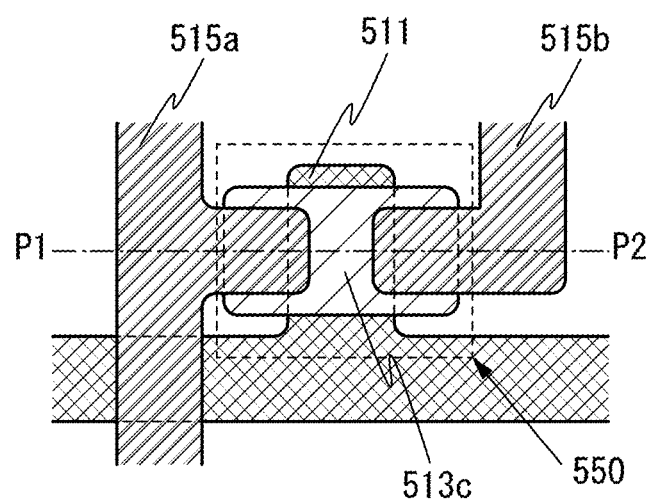
FIGS. 1A and 1B illustrate a structure of a semiconductor device of an embodiment.

Embodiments will be described in detail with reference to the drawings. Note that the invention is not limited to the following description, and it is easily understood by those skilled in the art that modes and details can be changed in various ways without departing from the spirit and scope of the present invention. Therefore, the present invention is not construed as being limited to the description of the embodiments. In structures of the present invention described below, the same portions or portions having similar functions are denoted by the same reference numerals in different drawings, and detailed description thereof is not repeated.

Embodiment 1

In this embodiment, a manufacturing method of a bottom-gate transistor using a method for purifying an oxide semiconductor layer by adding fluorine into an oxide semiconductor layer and then subjecting the oxide semiconductor layer to heat treatment to remove impurities will be described with reference to FIGS. 1A and 1B and FIGS. 2A to 2E.

Figure 1B:
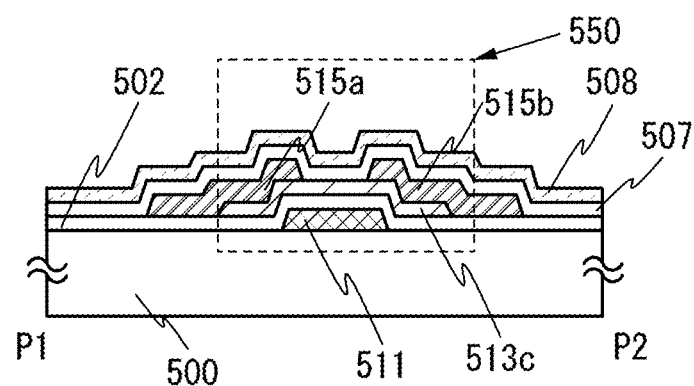

FIGS. 1A and 1B illustrate a structure of a bottom-gate transistor 550 which is manufactured in this embodiment. FIG. 1A is a top view of the transistor 550, and FIG. 1B is a cross-sectional view of the transistor 550. Note that FIG. 1B corresponds to the cross-sectional view taken along line P1-P2 in FIG. 1A.

In the transistor 550, a gate electrode 511 and a gate insulating layer 502 which covers the gate electrode 511 are provided over a substrate 500 having an insulating surface. A purified oxide semiconductor layer 513c which overlaps with the gate electrode 511 is provided over the gate insulating layer 502. In addition, a first electrode 515a and a second electrode 515b which function as a source and a drain electrode are provided in contact with the oxide semiconductor layer 513c so as to each have an end portion overlapping with the gate electrode 511. Further, an insulating layer 507 which is in contact with the oxide semiconductor layer 513c and overlaps with a channel formation region thereof, and a protective insulating layer 508 which covers the transistor 550 are provided.

An oxide semiconductor used in this embodiment is an i-type (intrinsic) oxide semiconductor or a substantially i-type (intrinsic) oxide semiconductor. The i-type (intrinsic) or substantially i-type oxide semiconductor is obtained in such a manner that hydrogen, which functions as an n-type impurity, is removed, and the oxide semiconductor is purified so as to contain as few impurities that are not main components of the oxide semiconductor as possible.

Note that the purified oxide semiconductor includes extremely few carriers, and the carrier concentration thereof is lower than $1 \times 10^{14}/cm^3$, preferably lower than $1 \times 10^{12}/cm^3$, and further preferably $1 \times 10^{11}/cm^3$. Such few carriers enable current in an off state (off-state current) to be sufficiently small.

Specifically, in the transistor including the oxide semiconductor layer, the leakage current density (off-state current density) per micrometer of a channel width between the source and the drain in an off state can be less than or equal to 100 zA/μm ($1 \times 10^{-19}$ A/μm), preferably less than or equal to 10 zA/μm ($1 \times 10^{-20}$ A/μm), and further preferably less than or equal to 1 zA/μm ($1 \times 10^{-21}$ A/μm) at a source-drain voltage of 3.5 V and at ambient temperature (e.g., 25° C.).

In addition, in the transistor including the purified oxide semiconductor layer, the temperature dependence of off-state current is hardly observed, and off-state current remains extremely small even under a high temperature condition.

Next, a manufacturing method of the transistor 550 over the substrate 500 will be described with reference to FIGS. 2A to 2E.

First, after a conductive film is formed over the substrate 500 having an insulating surface, a wiring layer including the gate electrode 511 is formed by a first photolithography step. Note that a resist mask may be formed by an ink-jet method in any of the photolithography steps in a manufacturing process of a transistor described in this specification. Formation of the resist mask by an ink-jet method needs no photomask; thus, manufacturing cost can be reduced.

In this embodiment, a glass substrate is used as the substrate 500 having an insulating surface.

An insulating film serving as a base film may be provided between the substrate 500 and the gate electrode 511. The base film has a function of preventing diffusion of an impurity element (e.g., an alkali metal such as lithium or sodium and an alkaline earth metal such as calcium) from the substrate 500, and can be formed to have a single-layer structure or a stacked structure including one or more of a silicon nitride film, a silicon oxide film, a silicon nitride oxide film, and a silicon oxynitride film.

The gate electrode 511 can be formed to have a single-layer structure or a stacked structure including a metal material such as molybdenum, titanium, tantalum, tungsten, aluminum, copper, neodymium, or scandium, or an alloy material which contains any of these metal materials as its main component.

Note that in the case of using aluminum or copper, they are preferably used in combination with a refractory metal material so as to prevent a heat resistance problem and a corrosive problem. As the refractory metal material, molybdenum, titanium, chromium, tantalum, tungsten, neodymium, scandium, or the like can be used.

In the case of using copper, a structure in which a copper-magnesium-aluminum (Cu—Mg—Al) alloy is provided for the layer serving as a base and copper is formed thereover is preferable. The provision of the Cu—Mg—Al alloy has an effect of increasing adhesiveness between copper and the base such as an oxide film.

Next, the gate insulating layer 502 is formed over the gate electrode 511. The gate insulating layer 502 can be formed to have a single-layer structure or a stacked structure including a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma CVD method, a sputtering method, or the like.

As the oxide semiconductor of this embodiment, an i-type or substantially i-type oxide semiconductor which is obtained by removing impurities is used. Such a purified oxide semiconductor is extremely sensitive to an interface state density and interface charge; thus, an interface between the oxide semiconductor layer and the gate insulating layer is important. For that reason, the gate insulating layer in contact with a purified oxide semiconductor needs to have high quality.

For example, a high-density plasma CVD method using microwaves (e.g., a frequency of 2.45 GHz) is preferably employed because an insulating layer being dense and having high withstand voltage and high quality can be formed. The purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as the method enables formation of a high-quality insulating layer as the gate insulating layer. Further, an insulating layer whose film quality and characteristic of the interface between the insulating layer and an oxide semiconductor are improved by heat treatment performed after formation of the insulating layer may be formed as the gate insulating layer. In any case, any insulating layer may be used as long as the insulating layer can reduce the interface state density of the interface between the insulating layer and an oxide semiconductor and form a favorable interface as well as having favorable film quality as a gate insulating layer.

Note that the gate insulating layer 502 is in contact with the oxide semiconductor layer 513*c* to be formed later. When hydrogen diffuses in the oxide semiconductor layer 513*c*, semiconductor characteristics deteriorate; therefore, it is preferable that the gate insulating layer 502 do not contain hydrogen, a hydroxyl group, and moisture. In order that the gate insulating layer 502 and an oxide semiconductor film contain as little hydrogen, a hydroxyl group, and moisture as possible, it is preferable that as pretreatment of film formation of the oxide semiconductor film, the substrate 500 over which the gate electrode 511 is formed or the substrate 500 over which layers up to the gate insulating layer 502 are formed be preheated in a preheating chamber of a sputtering apparatus, so that impurities such as hydrogen or moisture adsorbed onto the substrate 500 are eliminated and exhausted. As an exhaustion unit provided in the preheating chamber, a cryopump is preferable. Note that this preheating treatment can be omitted. Further, the above preheating may be performed in a similar manner on the substrate 500 in a state where the first electrode 515*a* and the second electrode 515*b* have been formed thereover but the insulating layer 507 has not been formed yet.

Next, an oxide semiconductor film having a thickness of greater than or equal to 2 nm and less than or equal to 200 nm, preferably greater than or equal to 5 nm and less than or equal to 30 nm is formed over the gate insulating layer 502.

Note that before the oxide semiconductor film is formed by a sputtering method, powdery substances (also referred to as particles or dust) which are attached on a surface of the gate insulating layer 502 are preferably removed by reverse sputtering in which an argon gas is introduced and plasma is generated. The reverse sputtering refers to a method in which, without application of a voltage to a target side, a voltage is applied to the substrate side in an argon atmosphere using an RF power source so that plasma is generated in the vicinity of the substrate to modify a surface of the substrate. Note that instead of an argon atmosphere, a nitrogen atmosphere, a helium atmosphere, an oxygen atmosphere, or the like may be used.

The oxide semiconductor film is formed by a sputtering method using a metal oxide target. Moreover, the oxide semiconductor film can be formed by a sputtering method under a rare gas (e.g., argon) atmosphere, an oxygen atmosphere, or a mixed atmosphere containing a rare gas (e.g., argon) and oxygen.

As an oxide semiconductor used for the oxide semiconductor film, any of the following metal oxides can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; and the like. Further, $SiO_2$ may be contained in the above oxide semiconductor. Addition of silicon oxide ($SiO_x$ (x>0)) which hinders crystallization to the oxide semiconductor film can suppress crystallization of the oxide semiconductor film at the time when heat treatment is performed after formation of the oxide semiconductor film in the manufacturing process. Here, for example, an In—Ga—Zn—O-based oxide semiconductor means an oxide film containing indium (In), gallium (Ga), and zinc (Zn), and there is no particular limitation on the composition ratio thereof. The In—Ga—Zn—O-based oxide semiconductor may contain an element other than In, Ga, and Zn.

For the oxide semiconductor film, a thin film represented by a chemical formula of $InMO_3(ZnO)_m$ (m>0, and m is not a natural number) can be used. Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn—O-based oxide semiconductor which has an atomic ratio of In:Zn:O=X:Y:Z, the relation of Z>1.5X+Y is satisfied.

The oxide semiconductor used in this embodiment is preferably an oxide semiconductor containing In, and further preferably an oxide semiconductor containing In and Ga. In order to obtain an i-type (intrinsic) oxide semiconductor layer, dehydration or dehydrogenation is effective. In this embodiment, the oxide semiconductor film is formed using an In—Ga—Zn—O-based oxide target by a sputtering method.

As the target for forming the oxide semiconductor film by a sputtering method, for example, an oxide target containing $In_2O_3$, $Ga_2O_3$, and ZnO in a composition ratio of 1:1:1 [molar ratio] is used to form an In—Ga—Zn—O film. Without limitation to the material and the composition of the above target, for example, an oxide target containing $In_2O_3$, $Ga_2O_3$, and ZnO in a composition ratio of 1:1:2 [molar ratio] or an oxide target containing $In_2O_3$, $Ga_2O_3$, and ZnO in a composition ratio of 1:1:4 [molar ratio] may be used.

The filling rate of the oxide target is higher than or equal to 90% and lower than or equal to 100%, preferably higher than or equal to 95% and lower than or equal to 99.9%. With the use of the metal oxide target having high filling rate, a dense oxide semiconductor film can be formed. Moreover, the purity of the target is preferably higher than or equal to 99.99%, where it is preferable that impurities, for example, an alkali metal such as Li or Na and an alkaline earth metal such as Ca be particularly reduced.

As a sputtering gas used at the time of forming the oxide semiconductor film, a high-purity gas from which impurities such as hydrogen, water, a hydroxyl group, or hydride are removed is preferably used. Specifically, a high-purity gas having a dew point of lower than or equal to −60° C. is preferable.

The substrate is placed in the film formation chamber under reduced pressure, and the substrate temperature is set to a temperature of higher than or equal to 100° C. and lower than or equal to 600° C., preferably higher than or equal to 200° C. and lower than or equal to 400° C. By forming the oxide semiconductor film in a state where the substrate is heated, the concentration of impurities contained in the formed oxide semiconductor film can be reduced. In addition, damage by sputtering can be reduced. Then, a sputtering gas from which hydrogen and moisture are removed is introduced while residual moisture in the film formation chamber is removed, and the oxide semiconductor film is formed over the substrate 500 using the above target. In order to remove the residual moisture in the film formation chamber, an entrapment vacuum pump such as a cryopump, an ion pump, or a titanium sublimation pump is preferably used. The exhaustion unit may be a turbo pump provided with a cold trap. In the film formation chamber which is exhausted with the cryopump, for example, hydrogen, a compound containing hydrogen such as water (further preferably, also a compound containing carbon), and the like are removed, so that the concentration of impurities contained in the oxide semiconductor film formed in the film formation chamber can be reduced.

The atmosphere for a sputtering method may be a rare gas (typically argon) atmosphere, an oxygen atmosphere, or a mixed atmosphere containing a rare gas and oxygen.

As an example of the film formation conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse-direct current power source is preferable because powder substances (also referred to as particles or dust) generated during the film formation can be reduced and the film thickness can be uniform.

Moreover, when the leakage rate of the treatment chamber of the sputtering apparatus is set to less than or equal to $1\times10^{-10}$ Pa·m³/second, entry of impurities such as an alkali metal or hydride into the oxide semiconductor film under formation by a sputtering method can be reduced.

Further, with the use of an entrapment vacuum pump as an exhaustion system, counter flow of impurities such as an alkali metal, hydrogen, water, a hydroxyl group, or hydride from the exhaustion system can be reduced.

Note that impurities, for example, an alkali metal such as Li or Na and an alkaline earth metal such as Ca contained in the oxide semiconductor layer are preferably reduced. Specifically, the impurity concentrations of Li, Na, and K contained in the oxide semiconductor layer are each lower than or equal to $5\times10^{15}$ cm$^{-3}$, preferably lower than or equal to $1\times10^{15}$ cm$^{-3}$ when measured with the use of SIMS.

An alkali metal and an alkaline earth metal are adverse impurities for an oxide semiconductor and are preferably contained little. When an insulating film in contact with the oxide semiconductor is an oxide, an alkali metal, in particular, Na diffuses in the oxide and becomes Na$^+$. In addition, Na cuts the bond between a metal and oxygen or enters the bond in the oxide semiconductor. As a result, deterioration of transistor characteristics (e.g., the shift of a threshold value to the negative side (causing the transistor to be normally on) or a decrease in mobility) is caused. Additionally, this also causes variation in characteristics. Such a problem is significant especially in the case where the hydrogen concentration in the oxide semiconductor is sufficiently low. Therefore, the concentration of an alkali metal is strongly required to set in the above range in the case where the concentration of hydrogen contained in the oxide semiconductor is lower than or equal to $5\times10^{19}$ cm$^{-3}$, particularly lower than or equal to $5\times10^{18}$ cm$^{-3}$.

Next, the oxide semiconductor film is processed into an island-shaped oxide semiconductor layer 513a by a second photolithography step.

In the case where a contact hole is formed in the gate insulating layer 502, a step of forming the contact hole can be performed at the same time as processing of the oxide semiconductor film.

Figure 2A:
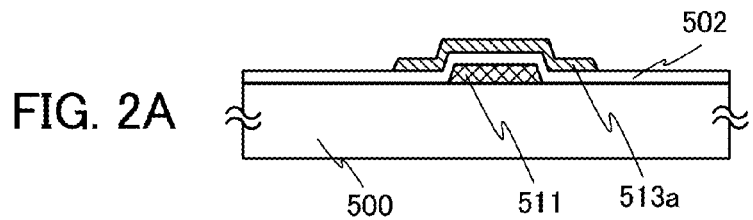
FIGS. 2A to 2E illustrate a manufacturing method of a semiconductor device of an embodiment.

Note that the etching of the oxide semiconductor film may be dry etching, wet etching, or both dry etching and wet etching. As an etchant used for wet etching of the oxide semiconductor film, a mixed solution of phosphoric acid, acetic acid, and nitric acid, or the like can be used, for example. In addition, ITO07N (produced by KANTO CHEMICAL CO., INC.) may also be used. Note that FIG. 2A is a cross-sectional view at this stage.

As an etching gas used for dry etching, a gas containing chlorine (e.g., chlorine ($Cl_2$), boron trichloride ($BCl_3$), silicon tetrachloride ($SiCl_4$), carbon tetrachloride ($CCl_4$), or the like) is preferably used. Alternatively, a gas containing fluorine (e.g., carbon tetrafluoride ($CF_4$), sulfur hexafluoride ($SF_6$), nitrogen trifluoride ($NF_3$), trifluoromethane ($CHF_3$), or the like); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to be able to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

Next, fluorine is added into the oxide semiconductor layer 513a. This addition of fluorine may be performed in the following manner: a gas containing fluorine is made into a plasma state and an ion species included in the plasma is extracted and accelerated so that the ion species in the form of an ion beam is added into the oxide semiconductor layer. For example, the amount of the added fluorine ions may be more than or equal to $10^{-13}$ ion/cm$^2$ and less than or equal to $10^{-15}$ ion/cm$^2$.

As the gas containing fluorine, carbon tetrafluoride ($CF_4$), sulfur hexafluoride ($SF_6$), nitrogen trifluoride ($NF_3$), or trifluoromethane ($CHF_3$); any of these gases into which a rare gas such as helium or argon is added; or the like can be used, for example.

Although an example of adding fluorine is described in this embodiment, an embodiment of the present invention is not limited to this example and other halogen elements may also be added. For example, chlorine may be added using a gas containing chlorine (e.g., chlorine ($Cl_2$), boron trichloride ($BCl_3$), silicon tetrachloride ($SiCl_4$), or carbon tetrachloride ($CCl_4$)).

The pressure at the time of adding fluorine is preferably higher than or equal to $10^{-4}$ Pa and lower than or equal to $10^2$ Pa.

With the use of a plasma doping apparatus, the pressure at the time of adding fluorine can be higher than or equal to $10^{-2}$ Pa and lower than or equal to $10^2$ Pa. As a plasma generation method, an excitation method such as an inductively coupled plasma (ICP) method can be employed. For example, in the case where a plasma doping apparatus employing an ICP excitation method is used, a high-frequency voltage is applied to both an antenna and an electrode on the substrate side, then, high-frequency plasma is generated on the antenna side, and an ion species included in the plasma is accelerated by a bias voltage generated by the high-frequency voltage applied to the electrode on the substrate side. Thus, the ion species in the form of an ion beam can be introduced into the oxide semiconductor layer over the substrate. Alternatively, the addition of fluorine can be similarly performed with a dry etching apparatus.

For example, plasma treatment may be performed for 60 seconds in the following conditions so that fluorine is added: nitrogen trifluoride ($NF_3$) is used as a gas, the electric power applied to the antenna is 600 W, the electric power applied to the electrode on the substrate side is 100 W, the pressure is 1.35 Pa, and the gas flow rate is 70 sccm.

When an ion doping apparatus is used, the pressure at the time of adding fluorine can be higher than or equal to $10^{-3}$ Pa and lower than or equal to $10^{-2}$ Pa. The acceleration voltage can be higher than or equal to 10 keV and lower than or equal to 100 keV. In the case of adding fluorine using an ion doping apparatus, a gas containing fluorine is made into a plasma state, an ion species is extracted from the plasma by an operation of a predetermined electric field, and the extracted ion species is accelerated without mass separation and introduced into the oxide semiconductor layer in the form of an ion beam. An ion doping apparatus enables ion-beam irradiation to a larger area than an ion implantation apparatus which is to be described below, and therefore, when the addition of fluorine is performed using an ion doping apparatus, the takt time can be shortened.

Further, when an ion implantation apparatus is used, the pressure at the time of adding fluorine can be higher than or equal to $10^{-4}$ Pa and lower than or equal to $10^{-3}$ Pa. The acceleration voltage can be higher than or equal to 100 keV and lower than or equal to 300 keV. In the case of adding fluorine using an ion implantation apparatus, a gas containing fluorine is made into a plasma state, an ion species is extracted from the plasma, mass separation is performed, and an ion species having a predetermined mass is accelerated and introduced into the oxide semiconductor layer in the form of an ion beam. When the addition of fluorine is performed using an ion implantation apparatus involving a mass separator, an impurity such as a metal element can be prevented from being added into the oxide semiconductor layer together with fluorine.

Figure 2B:
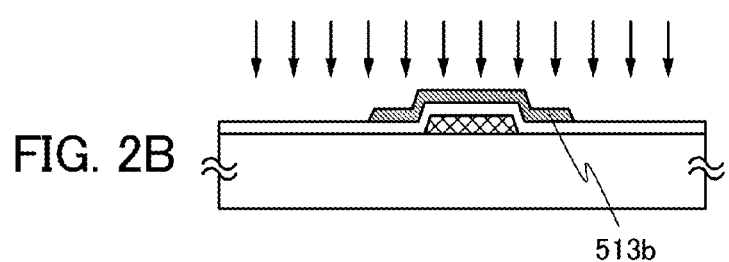

When fluorine is added into the oxide semiconductor layer 513a, a bond between a metal of the oxide semiconductor and hydrogen, a bond between a metal and a hydroxyl group, or a bond between oxygen and hydrogen in a hydroxyl group that is bonded to a metal can be cut, for example. The oxide semiconductor layer 513a becomes an oxide semiconductor layer 513b including an impurity which is detached from a metal (FIG. 2B).

Before the addition of fluorine into the oxide semiconductor layer 513a, preheat treatment may be performed thereon so that an impurity such as hydrogen or moisture in the oxide semiconductor layer 513a can be detached and exhausted. Note that as an exhaustion unit provided in the preheating chamber, a cryopump is preferable. The temperature of the preheat treatment is higher than or equal to 250° C. and lower than or equal to 500° C. In the case where the addition of fluorine is performed after the preheat treatment, the concentration of impurities included in the oxide semiconductor layer can be further reduced.

Then, first heat treatment is performed on the oxide semiconductor layer 513b including an impurity which is detached from a metal. By this first heat treatment, the impurity detached from the metal can be removed from the oxide semiconductor layer. For example, hydrogen fluoride which is generated by a reaction between the added fluorine and hydrogen or a hydroxyl group detached from a metal, or the like can be removed. The method of removing the generated hydrogen fluoride or the like by heating is easier than the method of directly removing hydrogen or a hydroxyl group that is strongly bonded to a metal without addition of a halogen element (e.g., high-temperature heat treatment).

The temperature of the first heat treatment is higher than or equal to 250° C. and lower than or equal to 750° C. In this embodiment, since the addition of fluorine into the oxide semiconductor layer facilitates elimination of an impurity from the oxide semiconductor layer, the first heat treatment can be performed at low temperature. If the first heat treatment is performed at high temperature, the treatment can be performed in a short time.

Figure 2C:
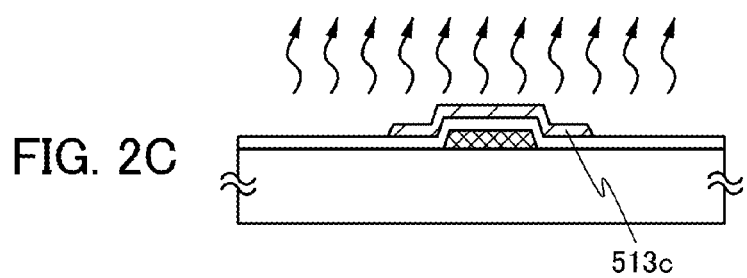

Here, the substrate is introduced into an electric furnace which is one of heat treatment apparatuses, heat treatment is performed on the oxide semiconductor layer at 450° C. under a nitrogen atmosphere for one hour, and then, the oxide semiconductor layer is not exposed to the air so that entry of water and hydrogen into the oxide semiconductor layer is prevented. Thus, the oxide semiconductor layer 513c is obtained (FIG. 2C).

Note that the heat treatment apparatus is not limited to the electric furnace, and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object by heat treatment, such as nitrogen or a rare gas such as argon, is used. When using an RTA (rapid thermal anneal) method for the heat treatment, dehydration or dehydrogenation can be performed in a short time; therefore, treatment can be performed even at a temperature higher than the strain point of a glass substrate.

Note that in the first heat treatment, it is preferable that water, hydrogen, and the like be not contained in the atmosphere of nitrogen or a rare gas such as helium, neon, or argon. The purity of nitrogen or a rare gas such as helium, neon, or argon introduced into the heat treatment apparatus is preferably 6N (99.9999%) or more, preferably 7N (99.99999%) or more (i.e., the impurity concentration is less than or equal to 1 ppm, preferably less than or equal to 0.1 ppm).

In addition, after the oxide semiconductor layer is heated by the first heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb, in the case where measurement is performed with the use of a dew point meter of a cavity ring down laser spectroscopy (CRDS) system) may be introduced into the same furnace. It is preferable that the oxygen gas and the $N_2O$ gas do not include water, hydrogen, and the like. The purity of the oxygen gas or the $N_2O$ gas that is introduced into the heat treatment apparatus is preferably greater than or equal to 6N, further preferably greater than or equal to 7N (i.e., the concentration of impurities in the oxygen gas or the $N_2O$ gas is preferably less than or equal to 1 ppm, further preferably less than or equal to 0.1 ppm). By the action of the oxygen gas or the $N_2O$ gas, oxygen which is one of main components included in an oxide semiconductor and which has been reduced at the same time as the step for removing impurities by dehydration or dehydrogenation is supplied, so that the oxide semiconductor layer can become a purified and electrically i-type (intrinsic) oxide semiconductor.

The addition of fluorine may be performed before the oxide semiconductor film is processed into an island shape. In such a case, the first heat treatment may be performed either before or after the second photolithography step.

Note that the first heat treatment is preferably performed after the addition of fluorine and before formation of another layer over the oxide semiconductor layer. However, the first heat treatment may be performed in any of the following timings instead of the above timing as long as it is after addition of fluorine: after a gate insulating layer is stacked over the oxide semiconductor layer; and after a gate electrode is formed over the gate insulating layer.

In the case where the contact hole is formed in the gate insulating layer 502, a step of forming the contact hole may be performed either before or after the first heat treatment is performed on the oxide semiconductor film.

Through the above steps, the concentration of hydrogen in the oxide semiconductor layer can be reduced and the oxide semiconductor layer can be purified. Accordingly, the oxide semiconductor layer can become stable. In addition, heat treatment makes it possible to form an oxide semiconductor film with a wide band gap in which carrier density is extremely low. Therefore, a transistor can be manufactured using a large-sized substrate, so that productivity can be increased. In addition, by using the purified oxide semiconductor film in which the hydrogen concentration is reduced, it is possible to manufacture a transistor having high withstand voltage and extremely low off-state current. The above heat treatment can be performed at any time as long as it is performed after the oxide semiconductor layer is formed.

Note that in the case where the oxide semiconductor film is heated, although depending on a material or heating conditions of the oxide semiconductor film, in some cases, plate-shaped crystals are formed at the surface of the oxide semiconductor film. The plate-like crystal is preferably a plate-like crystal which is c-axis-aligned in a direction substantially perpendicular to a surface of the oxide semiconductor film.

In addition, as the oxide semiconductor layer, an oxide semiconductor layer having a crystal region (a single crystal region) with a large thickness, that is, a crystal region which is c-axis-aligned perpendicularly to a surface of the film may be formed by performing film formation twice and heat treatment twice, even when any of an oxide, a nitride, a metal, or the like is used for a material of a base component in contact with the oxide semiconductor layer which is formed first. For example, after a first oxide semiconductor film having a thickness of 3 nm to 15 nm inclusive is formed, first addition of fluorine is performed, and then first heat treatment is performed at a temperature of higher than or equal to 450° C. and lower than or equal to 850° C., under a nitrogen, oxygen, rare gas, or dry air atmosphere, whereby a first oxide semiconductor film having a crystal region (including a plate-like crystal) in a region including a surface is formed. Then, after a second oxide semiconductor film which has a larger thickness than the first oxide semiconductor film is formed, second addition of fluorine is performed, and then second heat treatment is performed at a temperature of higher than or equal to 450° C. and lower than or equal to 850° C., whereby crystal growth proceeds upward with the use of the first oxide semiconductor film as a seed of the crystal growth and the entire second oxide semiconductor film is crystallized. At this time, if fluorine is added into the first oxide semiconductor film by the second addition of fluorine, a crystalline region in the first oxide semiconductor film may be reduced or lost. Therefore, it is necessary to select appropriate conditions (e.g., the acceleration voltage) so that fluorine is not added into the first oxide semiconductor film in the second addition of fluorine.

Moreover, an oxide semiconductor layer having a crystal region which is c-axis-aligned perpendicularly to a surface of the film may be formed by forming an oxide semiconductor layer while the substrate is heated to a temperature at which the oxide semiconductor is c-axis aligned. With such a film formation method, the number of steps can be reduced. The temperature for heating the substrate may be set as appropriate in accordance with other film formation conditions which differ depending on a film formation apparatus; for example, when the film formation is performed with a sputtering apparatus, the substrate temperature may be set to a temperature of greater than or equal to 250° C.

Next, a conductive film serving as a source electrode and a drain electrode (including a wiring formed in the same layer as the source electrode and the drain electrode) is formed over the gate insulating layer 502 and the oxide semiconductor layer 513c. As the conductive film used for the source electrode and the drain electrode, for example, a metal film containing an element selected from Al, Cr, Cu, Ta, Ti, Mo, and W, a metal nitride film containing any of the above elements as its main component (a titanium nitride film, a molybdenum nitride film, or a tungsten nitride film), or the like can be used. In the case of employing a metal film of Al, Cu, or the like, in order to prevent problems of heat resistance and corrosion, a film of a refractory metal such as Ti, Mo, W, Cr, Ta, Nd, Sc, or Y or a metal nitride film of any of these refractory metals (a titanium nitride film, a molybdenum nitride film, or a tungsten nitride film) may be stacked on one of or both a lower side and an upper side of the metal film. In particular, it is preferable to provide a conductive film containing titanium on the side in contact with the oxide semiconductor layer.

Further, the conductive film can have a single-layer structure or a stacked structure including two or more layers. For example, a single-layer structure of an aluminum film containing silicon; a two-layer structure of an aluminum film and a titanium film stacked thereover; a three-layer structure in which a titanium film, an aluminum film, and a titanium film are stacked in this order; and the like can be given.

Alternatively, the conductive film may be formed using a conductive metal oxide. As the conductive metal oxide, indium oxide, tin oxide, zinc oxide, an alloy of indium oxide and tin oxide, an alloy of indium oxide and zinc oxide, or any of the metal oxide materials containing silicon or silicon oxide can be used.

Note that in the case where heat treatment is performed after the conductive film is formed, the conductive film preferably has heat resistance high enough to withstand the heat treatment.

Figure 2D:
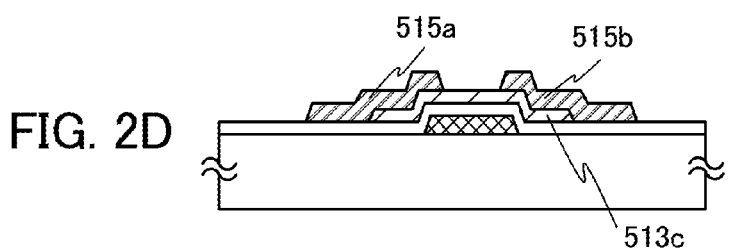

A resist mask is formed over the conductive film by a third photolithography step, the first electrode 515a and the second electrode 515b which each function as a source or drain electrode are formed by selective etching, and then the resist mask is removed (FIG. 2D).

Light exposure at the time of forming the resist mask in the third photolithography step may be performed using ultraviolet light, KrF laser light, or ArF laser light. A channel length L of a transistor to be formed later is determined by a distance between bottom end portions of the first electrode and the second electrode, which are adjacent to each other over the oxide semiconductor layer 513c. In the case where light exposure is performed for a channel length L of less than 25 nm, the light exposure at the time of forming the resist mask in the third photolithography step may be performed using extreme ultraviolet light having an extremely short wavelength of several nanometers to several tens of nanometers. In the light exposure by extreme ultraviolet light, the resolution is high and the focus depth is large. Therefore, the channel length L of the transistor to be formed later can be 10 nm to 1000 nm inclusive, whereby operation speed of a circuit can be increased.

In order to reduce the number of photomasks used in a photolithography step and reduce the number of photolithography steps, an etching step may be performed with the use of a resist mask formed using a multi-tone mask which is a light-exposure mask through which light is transmitted to have various intensities. A resist mask formed with the use of the multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can be also reduced, whereby simplification of a process can be realized.

Note that it is preferable that etching conditions be optimized so as not to etch and divide the oxide semiconductor layer 513c when the conductive film is etched. However, it is difficult to obtain etching conditions in which only the conductive film is etched and the oxide semiconductor layer 513c is not etched at all. In some cases, when the conductive film is etched, only part of the oxide semiconductor layer 513c is etched to be an oxide semiconductor layer 513c having a groove portion (a recessed portion).

In this embodiment, a Ti film is used as the conductive film and the In—Ga—Zn—O-based oxide semiconductor film is used for the oxide semiconductor layer 513c. In the case of such a combination, an ammonium hydrogen peroxide mixture (a mixed solution of ammonia, water, and hydrogen peroxide solution) is used as an etchant, so that the conductive film can be selectively etched.

Next, water or the like adsorbed to a surface of an exposed portion of the oxide semiconductor layer may be removed by plasma treatment using a gas such as $N_2O$, $N_2$, or Ar. Alternatively, plasma treatment may be performed using a mixed gas of oxygen and argon. In the case where the plasma treatment is performed, the insulating layer 507 serving as a protective insulating film in contact with part of the oxide semiconductor layer is formed without exposure to the air.

The insulating layer 507 preferably contains as few impurities such as moisture, hydrogen, and oxygen as possible, and may be formed using an insulating film of a single layer or a plurality of insulating films stacked.

The insulating layer 507 can be formed to a thickness of at least 1 nm by a method by which impurities such as water and hydrogen do not enter the insulating layer 507, such as a sputtering method, as appropriate. When hydrogen is contained in the insulating layer 507, entry of the hydrogen into the oxide semiconductor layer or extraction of oxygen in the oxide semiconductor layer by the hydrogen is caused, whereby a backchannel of the oxide semiconductor layer comes to be n-type (to have a lower resistance); thus, a parasitic channel might be formed. Therefore, it is important that a film formation method in which hydrogen is not used is employed in order to form the insulating layer 507 containing as little hydrogen as possible.

The insulating layer 507 is preferably formed using a material having a high barrier property. For example, a silicon nitride film, a silicon nitride oxide film, an aluminum nitride film, an aluminum nitride oxide film, an aluminum oxide film, a gallium oxide film, or the like can be used as the insulating film having a high barrier property. When the insulating film having a high bather property is used, an impurity such as moisture or hydrogen can be prevented from entering the island-shaped oxide semiconductor layer 513b, the gate insulating layer 502, an interface between the island-shaped oxide semiconductor layer 513b and another insulating layer, and the vicinity thereof.

It is also preferable to use a silicon oxide film, a silicon oxynitride film, an aluminum oxynitride film, or the like for the insulating layer 507.

For example, an insulating film having a structure in which an aluminum oxide film having a thickness of 100 nm formed by a sputtering method is stacked over a gallium oxide film having a thickness of 200 nm formed by a sputtering method may be formed. The substrate temperature during the film formation may be in the range of higher than or equal to room temperature and lower than or equal to 300° C. Further, the insulating film preferably contains much oxygen that exceeds the stoichiometric proportion, preferably at a proportion greater than 1 time and less than twice of the stoichiometric proportion. In the case where the insulating film contains excessive oxygen in such a manner, oxygen can be supplied to the interface with the oxide semiconductor film 513b; thus, oxygen deficiency can be reduced.

In this embodiment, a silicon oxide film is formed to a thickness of 200 nm as the insulating layer 507 by a sputtering method. The substrate temperature during the film formation may be in the range of higher than or equal to room temperature and lower than or equal to 300° C. and is set to 100° C. in this embodiment. The silicon oxide film can be formed by a sputtering method under a rare gas (typically, argon) atmosphere, an oxygen atmosphere, or a mixed atmosphere containing a rare gas and oxygen. As a target, a silicon oxide target or a silicon target can be used. For example, the silicon oxide film can be formed using a silicon target by a sputtering method under an atmosphere containing oxygen.

In order to remove residual moisture in a film formation chamber of the insulating layer 507 at the same time as the film formation of the oxide semiconductor film, an entrapment vacuum pump (such as a cryopump) is preferably used. When the insulating layer 507 is formed in the film formation chamber exhausted using a cryopump, the impurity concentration in the insulating layer 507 can be reduced. In addition, as an exhaustion unit for removing the residual moisture in the film formation chamber of the insulating layer 507, a turbo pump provided with a cold trap may be used.

It is preferable that a high-purity gas from which impurities such as hydrogen, water, a hydroxyl group, or hydride are removed be used as the sputtering gas for the film formation of the insulating layer 507.

Next, second heat treatment (third heat treatment in the case where film formation and heat treatment of the oxide semiconductor layer are each performed twice) may be performed in an inert gas atmosphere or an oxygen gas atmosphere. The heat treatment is performed under an atmosphere of nitrogen, ultra-dry air, or a rare gas (argon, helium, or the like) preferably at a temperature of higher than or equal to 200° C. and lower than or equal to 400° C. It is preferable that the content of water in the gas be less than or equal to 20 ppm, preferably less than or equal to 1 ppm, and further preferably less than or equal to 10 ppb. Alternatively, RTA treatment may be performed at high temperature for a short time as in the first heat treatment. Even when oxygen deficiency is generated in the oxide semiconductor layer 513c by the first heat treatment, by performing heat treatment after the insulating layer 507 containing oxygen is provided, oxygen is supplied to the oxide semiconductor layer 513c from the insulating layer 507. Then, by supplying oxygen to the oxide semiconductor layer 513c, oxygen deficiency that serves as a donor is reduced in the oxide semiconductor layer 513c and the stoichiometric composition ratio can be satisfied. As a result, the oxide semiconductor layer 513c can be made to be substantially i-type and variation of electric characteristics of the transistor due to oxygen deficiency can be reduced, which results in improvement of the electric characteristics. The timing of this second heat treatment is not particularly limited as long as it is after the formation of the insulating layer 507, and this second heat treatment can be performed without increasing the number of steps by doubling as another step such as heat treatment for formation of a resin film or heat treatment for reduction of the resistance of a light-transmitting conductive film, so that the oxide semiconductor layer 513c can be made to be substantially i-type.

Moreover, the oxygen deficiency that serves as a donor in the oxide semiconductor layer 513c may be reduced by subjecting the oxide semiconductor layer 513c to heat treatment under an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under the oxygen atmosphere do not include water, hydrogen, or the like. Alternatively, the purity of the oxygen gas which is introduced into the heat treatment apparatus is preferably higher than or equal to 6N (99.9999%), preferably higher than or equal to 7N (99.99999%) (that is, the impurity concentration in the oxygen is less than or equal to 1 ppm, preferably less than or equal to 0.1 ppm).

In this embodiment, the second heat treatment (preferably at a temperature higher than or equal to 200° C. and lower than or equal to 400° C., and for example at a temperature higher than or equal to 250° C. and lower than or equal to 350° C.) is performed under an inert gas atmosphere or an oxygen gas atmosphere. For example, the second heat treatment is performed at 250° C. under a nitrogen atmosphere for 1 hour.

The second heat treatment has the following effect. By the above first heat treatment, in some cases, whereas an impurity such as hydrogen, moisture, a hydroxyl group, or hydride (also referred to as a hydrogen compound) is intentionally removed from the oxide semiconductor layer, oxygen which is one of main components of the oxide semiconductor is reduced. Since the second heat treatment supplies oxygen to the oxide semiconductor layer subjected to the first heat treatment, the oxide semiconductor layer is purified to become an electrically i-type (intrinsic) semiconductor.

As described above, fluorine is added into the oxide semiconductor film and the first heat treatment is performed after fluorine is added into the oxide semiconductor film, whereby impurities such as hydrogen, moisture, a hydroxyl group, or hydride (also referred to as a hydrogen compound) can be intentionally removed from the oxide semiconductor layer. Accordingly, the oxide semiconductor layer is purified to be an electrically i-type (intrinsic) or substantially i-type semiconductor layer. Through the above process, the transistor 550 is formed.

In some cases, the transistor of this embodiment may include a halogen element in the oxide semiconductor layer. Since the halogen element in the oxide semiconductor layer easily bonds to a dangling bond on a metal atom and the dangling bond is terminated, generation of carriers can be reduced. For example, the oxide semiconductor layer may include fluorine at a concentration higher than or equal to $10^{15}$ atoms/cm$^3$ and lower than or equal to $10^{18}$ atoms/cm$^3$.

When a silicon oxide layer having a lot of defects is used as the insulating layer 507, the second heat treatment after formation of the silicon oxide layer has an effect of diffusing an impurity such as hydrogen or moisture contained in the oxide semiconductor layer to the silicon oxide layer so that the impurity contained in the oxide semiconductor layer can be further reduced.

In the case where a silicon oxide layer including excessive oxygen is used as the insulating layer 507, heat treatment which is performed after the formation of the insulating layer 507 has an effect of moving oxygen in the insulating layer 507 to the oxide semiconductor layer 513b, and improving the oxygen concentration in the oxide semiconductor layer 513b and purifying the oxide semiconductor layer 513b.

Figure 2E:
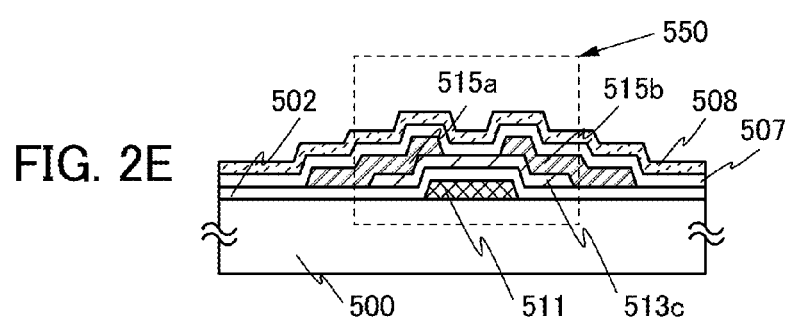

The protective insulating layer 508 may be additionally formed over the insulating layer 507. The protective insulating layer 508 is formed by, for example, an RF sputtering method. Since an RF sputtering method has high mass productivity, it is preferably used as a film formation method of the protective insulating layer. As the protective insulating layer, an inorganic insulating film which does not contain impurities such as moisture and blocks the entry of the impurities from the outside is used; for example, a silicon nitride film or an aluminum nitride film is used. In this embodiment, the protective insulating layer 508 is formed using a silicon nitride film (FIG. 2E).

In this embodiment, as the protective insulating layer 508, a silicon nitride film is formed by heating the substrate 500, over which layers up to the insulating layer 507 are formed, to a temperature of 100° C. to 400° C., introducing a sputtering gas containing high-purity nitrogen from which hydrogen and moisture are removed, and using a target of a silicon semiconductor. In this case also, it is preferable that residual moisture in the treatment chamber be removed in the formation of the protective insulating layer 508 in a manner similar to that of the insulating layer 507.

After the formation of the protective insulating layer, heat treatment may be further performed at a temperature of higher than or equal to 100° C. and lower than or equal to 200° C. in the air for 1 hour to 30 hours inclusive. This heat treatment may be performed at a fixed heating temperature. Alternatively, the following change in the heating temperature may be conducted plural times repeatedly: the heating temperature is increased from room temperature to a temperature of higher than or equal to 100° C. and lower than or equal to 200° C. and then decreased to room temperature.

A transistor including a purified oxide semiconductor layer manufactured using this embodiment has a small variation in the threshold voltage. Therefore, using the manufacturing method of a semiconductor device described as an example in this embodiment, a highly reliable semiconductor device can be provided. Further, a semiconductor device which can be manufactured with high mass productivity can be provided.

Further, a semiconductor device with low power consumption can be provided because off-state current can be reduced.

This embodiment can be combined with any of the other embodiments described in this specification as appropriate.

Embodiment 2

In this embodiment, a manufacturing method of a top-gate transistor using a method for purifying an oxide semiconductor layer by adding fluorine into an oxide semiconductor layer and then subjecting the oxide semiconductor layer to heat treatment to remove impurities will be described with reference to FIGS. 3A and 3B and FIGS. 4A to 4E.

Figure 3A:
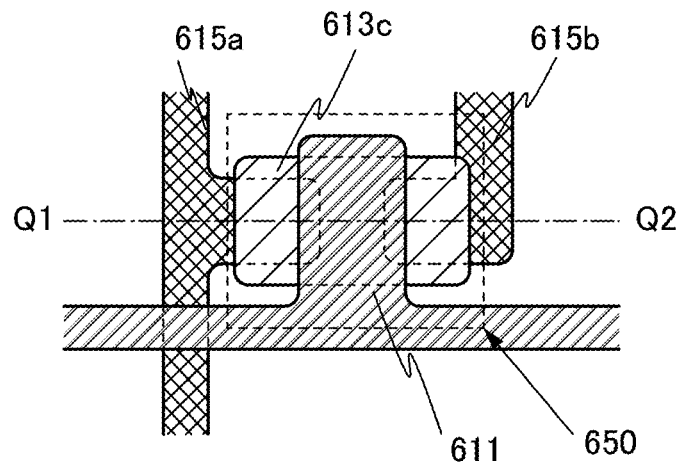
FIGS. 3A and 3B illustrate a structure of a semiconductor device of an embodiment.
Figure 3B:
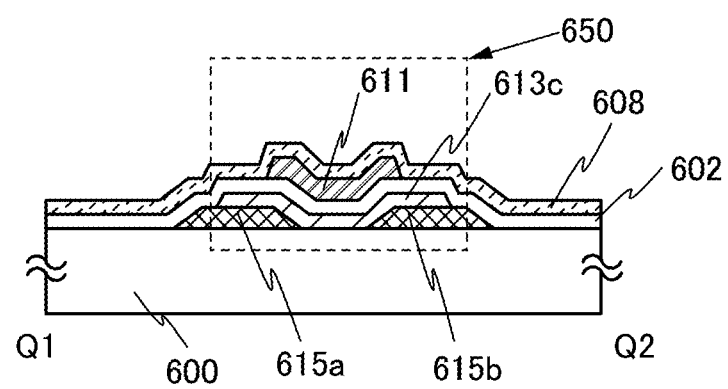

FIGS. 3A and 3B illustrate a structure of a top-gate transistor 650 which is manufactured in this embodiment. FIG. 3A is a top view of the transistor 650, and FIG. 3B is a cross-sectional view of the transistor 650. Note that FIG. 3B corresponds to the cross-sectional view taken along line Q1-Q2 in FIG. 3A.

In the transistor 650, over a substrate 600 having an insulating surface, a first electrode 615a and a second electrode 615b which each function as a source or drain electrode are provided. A purified oxide semiconductor layer 613c which covers end portions of the first electrode 615a and the second electrode 615b, and a gate insulating layer 602 which covers the oxide semiconductor layer 613c are provided. In addition, a gate electrode 611 which is in contact with the gate insulating layer 602 and overlaps with the end portions of the first electrode 615a and the second electrode 615b, and a protective insulating layer 608 which is in contact with the gate electrode 611 and covers the transistor 650 are provided.

Next, a method for manufacturing the transistor 650 over the substrate 600 will be described with reference to FIGS. 4A to 4E.

Next, a conductive film serving as a source electrode and a drain electrode (including a wiring formed in the same layer as the source electrode and the drain electrode) is formed over the substrate 600 having an insulating surface. As the conductive film used for the source electrode and the drain electrode, for example, a metal film containing an element selected from Al, Cr, Cu, Ta, Ti, Mo, and W or a metal nitride film containing any of the above elements as its main component (a titanium nitride film, a molybdenum nitride film, or a tungsten nitride film) can be used. In the case of employing a metal film of Al, Cu, or the like, a film of a refractory metal such as Ti, Mo, W, Cr, Ta, Nd, Sc, or Y or a metal nitride film of any of these refractory metals (a titanium nitride film, a molybdenum nitride film, or a tungsten nitride film) may be stacked on one of or both a lower side and an upper side of the metal film. In particular, it is preferable to provide a conductive film containing titanium on the side in contact with the oxide semiconductor layer.

A resist mask is formed over the conductive film by a first photolithography step, the first electrode 615a and the second electrode 615b which each function as a source or drain electrode are formed by selective etching, and then the resist mask is removed.

In this embodiment, a glass substrate is used as the substrate 600 having an insulating surface.

An insulating film serving as a base film may be provided between the substrate 600 and the first electrode 615a and the second electrode 615b. The base film has a function of preventing diffusion of an impurity element from the substrate 600, and can be formed to have a single-layer structure or a stacked structure including one or more of a silicon nitride film, a silicon oxide film, a silicon nitride oxide film, and a silicon oxynitride film.

Then, an oxide semiconductor film having a thickness of greater than or equal to 2 nm and less than or equal to 200 nm, preferably greater than or equal to 5 nm and less than or equal to 30 nm is formed over the first electrode 615a and the second electrode 615b which each serve as a source or drain electrode.

Note that before the oxide semiconductor film is formed by a sputtering method, powdery substances (also referred to as particles or dust) which are attached on surfaces of the first electrode 615a and the second electrode 615b, and the insulating surface of the exposed portion of the substrate 600 are preferably removed by reverse sputtering in which an argon gas is introduced and plasma is generated.

The oxide semiconductor film described in this embodiment can be formed using a material, a method, and conditions similar to those of the oxide semiconductor film described in Embodiment 1. Specifically, an oxide semiconductor used for the oxide semiconductor film, a film formation method, a target composition, a target filling rate, the purity of a sputtering gas, substrate temperature during the film formation, an exhaustion unit of a sputtering apparatus, a composition of the sputtering gas, and the like may be similar to those of Embodiment 1. Therefore, Embodiment 1 can be referred to for the details.

Next, the oxide semiconductor film is processed into an island-shaped oxide semiconductor layer 613a by a second photolithography step.

Figure 4A:
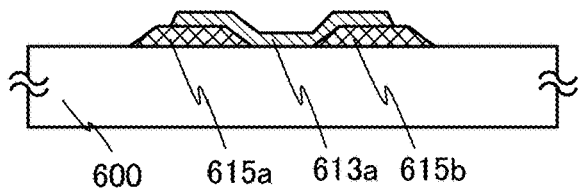
FIGS. 4A to 4E illustrate a manufacturing method of a semiconductor device of an embodiment.

Note that the etching of the oxide semiconductor film may be dry etching, wet etching, or both dry etching and wet etching. As an etchant used for wet etching for the oxide semiconductor film, for example, a mixed solution of phosphoric acid, acetic acid, and nitric acid, or the like can be used. In addition, ITO07N (produced by KANTO CHEMICAL CO., INC.) may also be used. Note that FIG. 4A is the cross-sectional view at this stage.

Figure 4B:
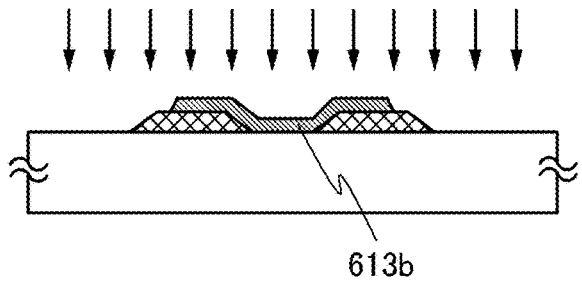

Next, fluorine is added into the oxide semiconductor layer 613a. A material, a method, and a condition similar to those of Embodiment 1 can be applied to the addition of fluorine. Therefore, for the details, Embodiment 1 can be referred to. When fluorine is added into the oxide semiconductor layer 613a, a bond between a metal of the oxide semiconductor and hydrogen, a bond between oxygen and hydrogen in a hydroxyl group that is bonded to a metal, or a bond between a metal and a hydroxyl group can be cut, for example. The oxide semiconductor layer 613a becomes an oxide semiconductor layer 613b including an impurity which is detached from a metal (FIG. 4B).

As in Embodiment 1, preheat treatment may be performed before the addition of fluorine into the oxide semiconductor layer 613a.

Figure 4C:
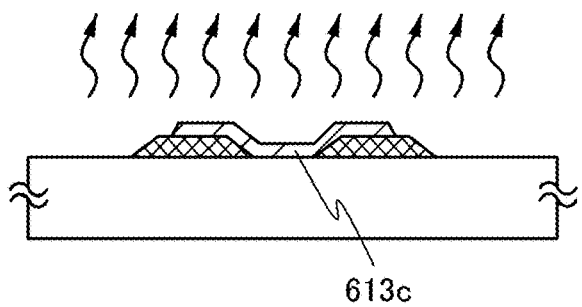

Then, first heat treatment is performed on the oxide semiconductor layer 613b including an impurity which is detached from a metal (FIG. 4C). A method and a condition similar to those of Embodiment 1 can be applied to the first heat treatment. Therefore, as for the details, Embodiment 1 can be referred to. By this first heat treatment, the impurity detached from the metal can be removed from the oxide semiconductor layer 613b. For example, hydrogen fluoride which is generated by a reaction between the added fluorine and hydrogen or a hydroxyl group detached from a metal, or the like can be removed. The method of removing the generated hydrogen fluoride or the like by heating is easier than the method of directly removing hydrogen or a hydroxyl group that is strongly bonded to a metal without addition of a halogen element.

The addition of fluorine may be performed before the oxide semiconductor film is processed into an island shape. In such a case, the first heat treatment may be performed either before or after the second photolithography step.

Note that the first heat treatment is preferably performed after the addition of fluorine and before formation of another layer over the oxide semiconductor layer. However, the first heat treatment may be performed in any of the following timings instead of the above timing as long as it is after addition of fluorine: after a gate insulating layer is stacked over the oxide semiconductor layer; and after a gate electrode is formed over the gate insulating layer.

In addition, as the oxide semiconductor layer, an oxide semiconductor layer having a crystal region (a single crystal region) with a large thickness, that is, a crystal region which is c-axis-aligned perpendicularly to a surface of the film may be formed by performing film formation twice and heat treatment twice, even when any of an oxide, a nitride, a metal, or the like is used for a material of a base component in contact with the oxide semiconductor layer which is formed first. The oxide semiconductor layer having a crystal region can be formed under the formation conditions described in Embodiment 1. Therefore, as for the details, Embodiment 1 can be referred to.

Next, water or the like adsorbed to a surface of an exposed portion of the oxide semiconductor layer may be removed by plasma treatment using a gas such as $N_2O$, $N_2$, or Ar. The gate insulating layer 602 in contact with the oxide semiconductor layer is formed without exposure to the air after the plasma treatment.

As the oxide semiconductor of this embodiment, an i-type or substantially i-type oxide semiconductor is used from which impurities are removed. Such a purified oxide semiconductor is extremely sensitive to an interface state density and interface charge; thus, an interface between the oxide semiconductor layer and the gate insulating layer is important. For that reason, the gate insulating layer in contact with a purified oxide semiconductor layer needs to have high quality.

The gate insulating layer 602 can be formed to a thickness of at least 1 nm by a method by which impurities such as water and hydrogen do not enter the gate insulating layer 602, such as a sputtering method, as appropriate. When hydrogen is contained in the gate insulating layer 602, entry of the hydrogen into the oxide semiconductor layer or extraction of oxygen in the oxide semiconductor layer by the hydrogen is caused, whereby a channel of the oxide semiconductor layer comes to be n-type (to have a lower resistance); thus, a parasitic channel might be formed. Therefore, it is important that a film formation method in which hydrogen is not used is employed in order to form the gate insulating layer 602 containing as little hydrogen as possible.

In this embodiment, a silicon oxide film is formed as the gate insulating layer 602 by a sputtering method. The substrate temperature during the film formation may be in the range of higher than or equal to room temperature and lower than or equal to 300° C. and is set to 100° C. in this embodiment. The silicon oxide film can be formed by a sputtering method under a rare gas (typically, argon) atmosphere, an oxygen atmosphere, or a mixed atmosphere containing a rare gas and oxygen. As a target, a silicon oxide target or a silicon target can be used. For example, the silicon oxide film can be formed using a silicon target by a sputtering method under an atmosphere containing oxygen. As the gate insulating layer 602 which is formed in contact with the oxide semiconductor layer, an inorganic insulating film which does not include impurities such as moisture or hydrogen and blocks entry of these impurities from the outside is used. Typically, a silicon oxide film, a silicon oxynitride film, an aluminum oxide film, an aluminum oxynitride film, or the like is used.

In order to remove residual moisture in the film formation chamber of the gate insulating layer 602 at the same time as the film formation of the oxide semiconductor film, an entrapment vacuum pump (such as a cryopump) is preferably used. When the gate insulating layer 602 is formed in the film formation chamber exhausted using a cryopump, the impurity concentration in the gate insulating layer 602 can be reduced. In addition, as an exhaustion unit for removing the residual moisture in the film formation chamber of the gate insulating layer 602, a turbo pump provided with a cold trap may be used.

Figure 4D:
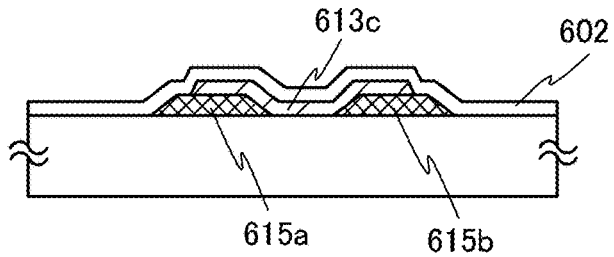

It is preferable that a high-purity gas from which impurities such as hydrogen, water, a hydroxyl group, or hydride are removed be used as the sputtering gas for the film formation of the gate insulating layer 602. Note that FIG. 4D is the cross-sectional view at this stage.

Next, in the case of forming a contact hole in the gate insulating layer 602, a contact hole is formed in the gate insulating layer 602 by a third photolithography step. Note that the contact hole is not illustrated in FIG. 4E.

Then, a conductive film is formed over the gate insulating layer 602, and a wiring layer including the gate electrode 611 is formed through a fourth photolithography step.

The gate electrode 611 can be formed to have a single-layer structure or a stacked structure using a metal material such as molybdenum, titanium, tantalum, tungsten, aluminum, copper, neodymium, or scandium or an alloy material containing any of these materials as its main component. Through the above-described process, the transistor 650 is formed.

In some cases, the transistor of this embodiment may include a halogen element in the oxide semiconductor layer. Since the halogen element in the oxide semiconductor layer easily bonds to a dangling bond on a metal atom and the dangling bond is terminated, generation of carriers can be reduced.

Figure 4E:
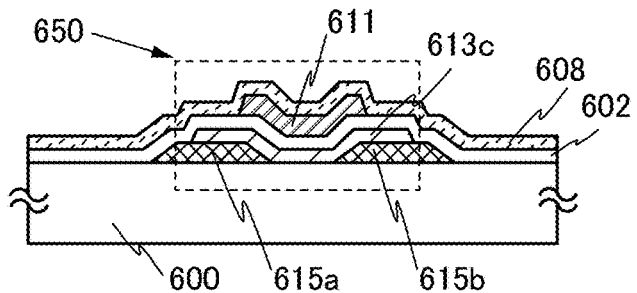

The protective insulating layer 608 may be formed over the gate electrode 611. For example, the protective insulating layer 608 is formed by an RF sputtering method. The RF sputtering method is preferable as a formation method of the protective insulating layer because it achieves high mass productivity. As the protective insulating layer, an inorganic insulating film which does not contain impurities such as moisture and blocks the entry of the impurities from the outside is used; for example, a silicon nitride film or an aluminum nitride film is used. In this embodiment, a silicon nitride film is formed as the protective insulating layer 608. FIG. 4E is a cross-sectional view at this stage.

In this embodiment, as the protective insulating layer 608, a silicon nitride film is formed by heating the substrate 600, over which layers up to the gate electrode 611 are formed, to a temperature of 100° C. to 400° C., introducing a sputtering gas containing high-purity nitrogen from which hydrogen and moisture are removed, and using a target of a silicon semiconductor. In this case also, it is preferable that residual moisture in the treatment chamber be removed in the formation of the protective insulating layer 608 in a manner similar to that of the gate insulating layer 602.

After the formation of the protective insulating layer, heat treatment may be further performed at a temperature of higher than or equal to 100° C. and lower than or equal to 200° C. in the air for 1 hour to 30 hours inclusive. This heat treatment may be performed at a fixed heating temperature. Alternatively, the following change in the heating temperature may be conducted plural times repeatedly: the heating temperature is increased from room temperature to a temperature of higher than or equal to 100° C. and lower than or equal to 200° C. and then decreased to room temperature.

A transistor including a purified oxide semiconductor layer manufactured using this embodiment has a small variation in the threshold voltage. Therefore, using the manufacturing method of a semiconductor device described as an example in this embodiment, a highly reliable semiconductor device can be provided. Further, a semiconductor device which can be manufactured with high mass productivity can be provided.

Further, a semiconductor device with low power consumption can be provided because off-state current can be reduced.

This embodiment can be combined with any of the other embodiments described in this specification as appropriate.

Embodiment 3

In this embodiment, a manufacturing method of a bottom-gate transistor using a method for purifying an oxide semiconductor layer, which is different from the method of Embodiment 1, by adding fluorine into an oxide semiconductor layer and then subjecting the oxide semiconductor layer to heat treatment to remove impurities will be described with reference to FIGS. 10A and 10B, FIGS. 11A to 11C, and FIGS. 12A to 12C.

Figure 10A:
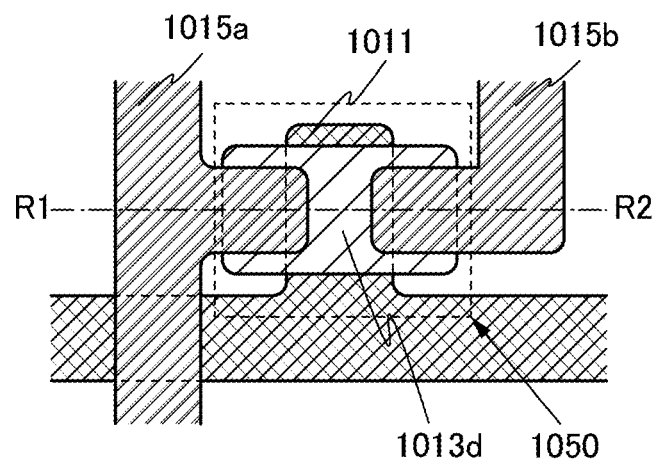
FIGS. 10A and 10B illustrate a structure of a semiconductor device of an embodiment.
Figure 10B:
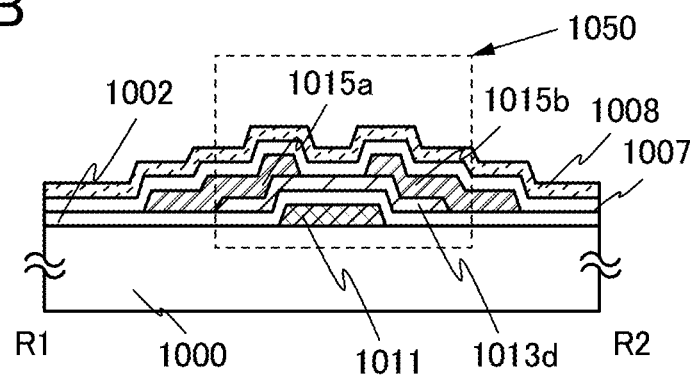

FIGS. 10A and 10B illustrate a structure of a bottom-gate transistor 1050 which is manufactured in this embodiment. FIG. 10A is a top view of the transistor 1050, and FIG. 10B is a cross-sectional view of the transistor 1050. Note that FIG. 10B corresponds to the cross-sectional view taken along line R1-R2 in FIG. 10A.

In the transistor 1050, a gate electrode 1011 and a gate insulating layer 1002 which covers the gate electrode 1011 are provided over a substrate 1000 having an insulating surface. A purified oxide semiconductor layer 1013d which overlaps with the gate electrode 1011 is provided over the gate insulating layer 1002. In addition, a first electrode 1015a and a second electrode 1015b which function as a source and a drain electrode are provided in contact with the oxide semiconductor layer 1013d so as to each have an end portion overlapping with the gate electrode 1011. Further, an insulating layer 1007 which is in contact with the oxide semiconductor layer 1013d and overlaps with a channel formation region thereof, and a protective insulating layer 1008 which covers the transistor 1050 are provided.

Next, a manufacturing method of the transistor 1050 over the substrate 1000 will be described with reference to FIGS. 11A to 11C and FIGS. 12A to 12C.

First, after a conductive film is formed over the substrate 1000 having an insulating surface, a wiring layer including the gate electrode 1011 is formed by a first photolithography step, and the gate insulating layer 1002 is formed over the gate electrode 1011. Methods and conditions similar to those for the gate electrode 511 and the gate insulating layer 502 of Embodiment 1 can be applied to the gate electrode 1011 and the gate insulating layer 1002. Therefore, for the details, Embodiment 1 can be referred to.

Figure 11A:
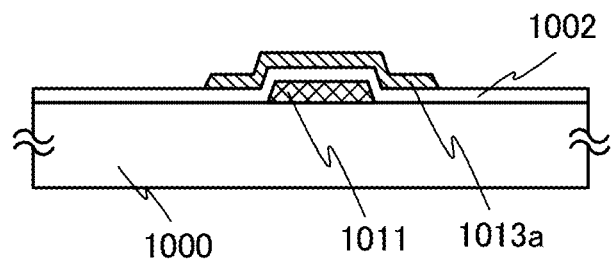
FIGS. 11A to 11C illustrate a manufacturing method of a semiconductor device of an embodiment.

Next, an oxide semiconductor film having a thickness of greater than or equal to 2 nm and less than or equal to 200 nm, preferably greater than or equal to 3 nm and less than or equal to 50 nm is formed over the gate insulating layer 1002, and the oxide semiconductor film is processed into an island-shaped oxide semiconductor layer 1013a by a second photolithography step (FIG. 11A). The oxide semiconductor layer 1013a described as an example in this embodiment can be formed using a material, method, and conditions similar to those of the oxide semiconductor layer 513a described in Embodiment 1. Therefore, as for the details, Embodiment 1 can be referred to.

Figure 11B:
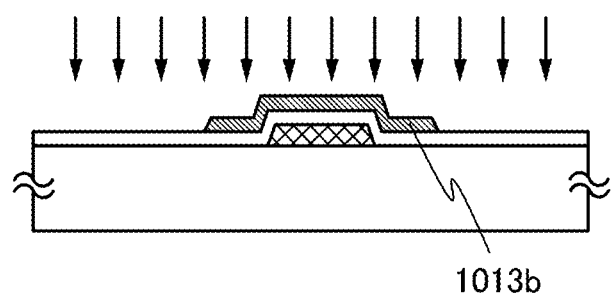

Next, fluorine is added into the oxide semiconductor layer 1013a. As for the addition of fluorine, a material, a method, and a condition similar to those of Embodiment 1 can be applied. Therefore, for the details, Embodiment 1 can be referred to. When fluorine is added into the oxide semiconductor layer 1013a, a bond between a metal of the oxide semiconductor and hydrogen, a bond between oxygen and hydrogen in a hydroxyl group that is bonded to a metal, or a bond between a metal and a hydroxyl group can be cut, for example. Here, the oxide semiconductor layer 1013a becomes an oxide semiconductor layer 1013b including an impurity which is detached from a metal (FIG. 11B).

As in Embodiment 1, preheat treatment may be performed before the addition of fluorine into the oxide semiconductor layer 1013a.

Figure 11C:
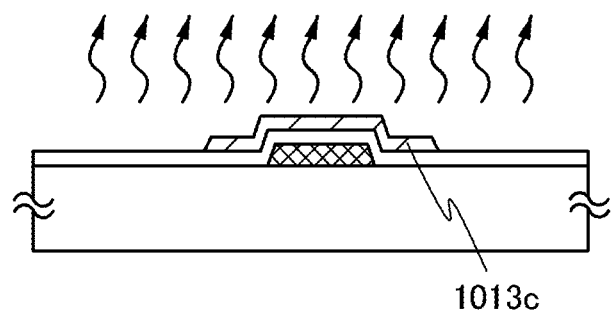

Then, first heat treatment is performed on the oxide semiconductor layer 1013b including an impurity which is detached from a metal, so that an oxide semiconductor layer 1013c is obtained (FIG. 11C). As for the first heat treatment, a method and a condition similar to those of Embodiment 1 can be applied. Therefore, as for the details, Embodiment 1 can be referred to. By this first heat treatment, the impurity detached from the metal can be removed from the oxide semiconductor layer 1013b.

Figure 12A:
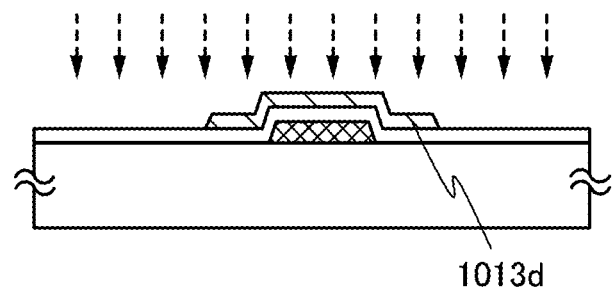
FIGS. 12A to 12C illustrate a manufacturing method of a semiconductor device of an embodiment.

Next, oxygen is added into the oxide semiconductor layer 1013c, so that the oxide semiconductor layer 1013d is obtained (FIG. 12A). Oxygen having high energy can be added by an ion implantation method, an ion doping method, or the like.

In the case where oxygen is added by an ion implantation method using an oxygen gas, the acceleration voltage may be higher than or equal to 5 keV and lower than or equal to 100 keV, and the amount of the added oxygen ions may be more than or equal to $1 \times 10^{14}$ [atoms/cm$^2$] and less than or equal to $5 \times 10^{17}$ [atoms/cm$^2$].

By adding oxygen having high energy into the oxide semiconductor by an ion implantation method, an ion doping method, or the like, oxygen which is one of main components of the oxide semiconductor can be supplied.

After the addition of oxygen, second heat treatment may be performed on the oxide semiconductor layer. By this second heat treatment, the impurity detached from the metal can be removed from the oxide semiconductor layer. For example, water which is generated by a reaction between the added oxygen and hydrogen or a hydroxyl group detached from a metal can be removed. The method of removing the generated water by heating is easier than the method of directly removing hydrogen or a hydroxyl group that is strongly bonded to a metal. By the addition of oxygen and the second heat treatment, impurities which have not been removed by the addition of fluorine and the first heat treatment can be removed; accordingly, the oxide semiconductor layer can be purified and become an electrically i-type (intrinsic) or substantially i-type oxide semiconductor layer.

In addition, as the oxide semiconductor layer, an oxide semiconductor layer having a crystal region (a non-single crystal region) with a large thickness, that is, a crystal region which is c-axis-aligned perpendicularly to a surface of the film may be formed by performing film formation twice and heat treatment twice, even when any of an oxide, a nitride, a metal, or the like is used for a material of a base component in contact with the oxide semiconductor layer which is formed first. For example, after a first oxide semiconductor film having a thickness of 3 nm to 15 nm inclusive is formed, first addition of fluorine is performed, and then first heat treatment is performed at a temperature of higher than or equal to 450° C. and lower than or equal to 850° C., preferably higher than or equal to 550° C. and lower than or equal to 750° C., under a nitrogen, oxygen, rare gas, or dry air atmosphere, whereby a first oxide semiconductor film having a crystal region (including a plate-like crystal) in a region including a surface is formed. Then, after a second oxide semiconductor film which has a larger thickness than the first oxide semiconductor film is formed, second addition of fluorine is performed, and then second heat treatment is performed at a temperature of higher than or equal to 450° C. and lower than or equal to 850° C., preferably higher than or equal to 600° C. and lower than or equal to 700° C., whereby crystal growth proceeds upward with the use of the first oxide semiconductor film as a seed of the crystal growth and the entire second oxide semiconductor film is crystallized. Then, addition of oxygen is performed. Addition of oxygen may also be performed before the second oxide semiconductor film is formed. If fluorine is added into the first oxide semiconductor film by the second addition of fluorine, a crystalline region in the first oxide semiconductor film may be reduced or lost. Therefore, it is necessary to select appropriate conditions (e.g., the acceleration voltage) so that fluorine is not added into the first oxide semiconductor film in the second addition of fluorine.

Figure 12B:
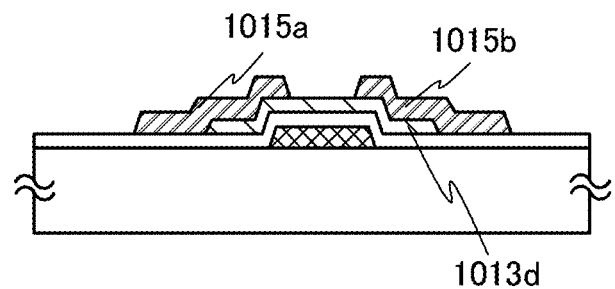

Next, a conductive film serving as a source electrode and a drain electrode (including a wiring formed in the same layer as the source electrode and the drain electrode) is formed over the gate insulating layer 1002 and the oxide semiconductor layer 1013d. Then, a resist mask is formed over the conductive film by a third photolithography step, the first electrode 1015a and the second electrode 1015b which each function as a source or drain electrode are formed by selective etching, and then the resist mask is removed (FIG. 12B). A method and conditions for the first electrode 515a and the second electrode 515b of Embodiment 1 can be applied to those for the first electrode 1015a and the second electrode 1015b. Therefore, for the details, Embodiment 1 can be referred to.

Next, the insulating layer 1007 is formed using a method and a material similar to those of the insulating layer 507 described in Embodiment 1.

Next, second heat treatment (third heat treatment in the case where film formation and heat treatment of the oxide semiconductor layer are each performed twice) may be performed in an inert gas atmosphere or an oxygen gas atmosphere. The heat treatment is preferably performed at a temperature of higher than or equal to 200° C. and lower than or equal to 400° C., for example at a temperature of higher than or equal to 250° C. and lower than or equal to 350°. For example, the second heat treatment is performed at 250° C. for one hour under a nitrogen atmosphere. When the second heat treatment is performed, part of the oxide semiconductor layer is heated in the state of being in contact with the insulating layer 1007.

As described above, fluorine is added into the oxide semiconductor film and the first heat treatment is performed after fluorine is added into the oxide semiconductor film, whereby impurities such as hydrogen, moisture, a hydroxyl group, or hydride (also referred to as a hydrogen compound) can be intentionally removed from the oxide semiconductor layer. By adding oxygen into the oxide semiconductor film, oxygen which is one of main components of the oxide semiconductor layer can be supplied. Accordingly, the oxide semiconductor layer is purified to become an electrically i-type (intrinsic) or substantially i-type semiconductor layer. Through the above process, the transistor 1050 is formed.

In some cases, the transistor of this embodiment may include a halogen element in the oxide semiconductor layer. Since the halogen element in the oxide semiconductor layer easily bonds to a dangling bond on a metal atom and the dangling bond is terminated, generation of carriers can be reduced.

When a silicon oxide layer having a lot of defects is used as the insulating layer 1007, the heat treatment after formation of the silicon oxide layer has an effect of diffusing an impurity such as hydrogen, moisture, or hydride contained in the oxide semiconductor layer to the silicon oxide layer so that the impurity contained in the oxide semiconductor layer can be further reduced.

Figure 12C:
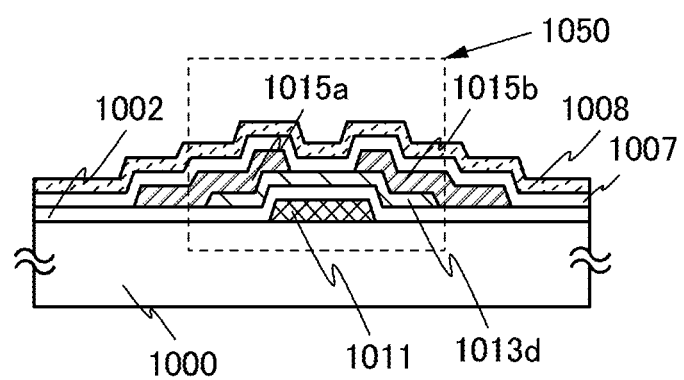

The protective insulating layer 1008 may be additionally formed over the insulating layer 1007. The protective insulating layer 1008 can be formed using a material and a method similar to those of the protective insulating layer 508 described in Embodiment 1. Therefore, for the details, Embodiment 1 can be referred to. In this embodiment, the protective insulating layer 1008 is formed using a silicon nitride film (FIG. 12C).

A transistor including a purified oxide semiconductor layer manufactured using this embodiment has a small variation in the threshold voltage. Therefore, using the manufacturing method of a semiconductor device described as an example in this embodiment, a highly reliable semiconductor device can be provided. Further, a semiconductor device which can be manufactured with high mass productivity can be provided.

Further, a semiconductor device with low power consumption can be provided because off-state current can be reduced.

This embodiment can be combined with any of the other embodiments described in this specification as appropriate.

Embodiment 4

In this embodiment, a structure and a manufacturing method of a semiconductor device according to an embodiment of the present invention will be described with reference to FIGS. 5A and 5B, FIGS. 6A to 6D, FIGS. 7A to 7C, FIGS. 8A to 8D, and FIGS. 9A to 9C. Note that the semiconductor device described as an example in this embodiment can be used as a memory device.

Figure 5A:
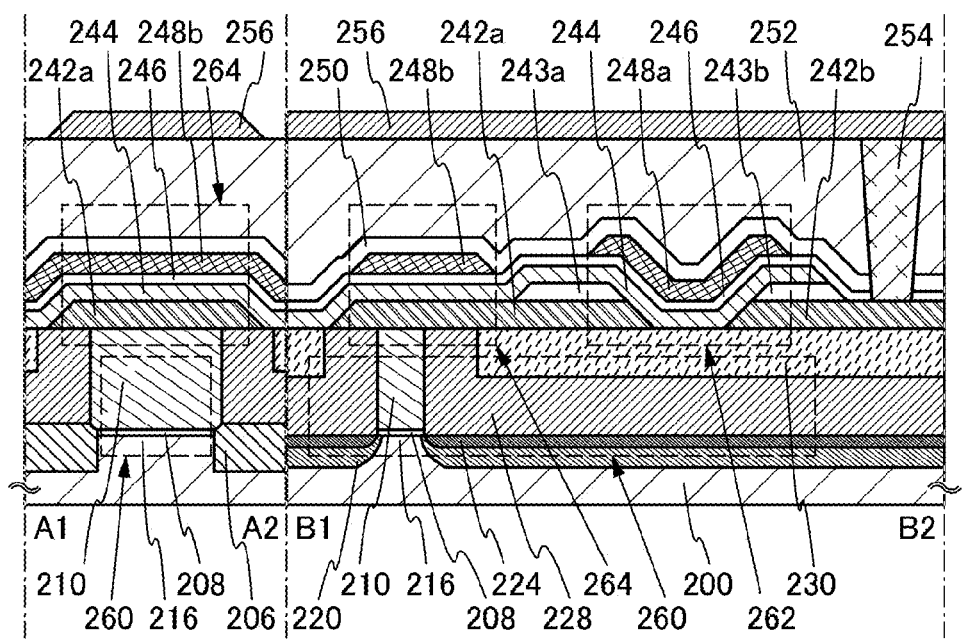
FIGS. 5A and 5B illustrate a structure of a semiconductor device of an embodiment.
Figure 5B:
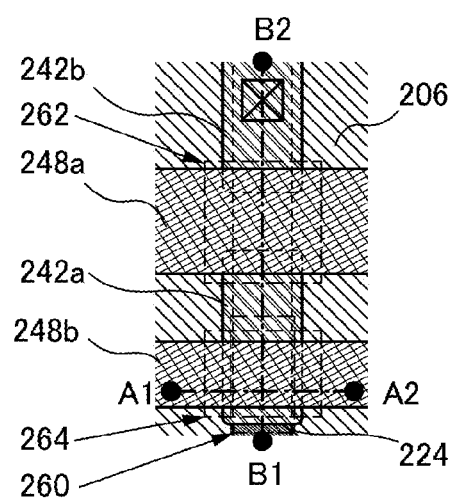

A structure of a semiconductor device described as an example in this embodiment is illustrated in FIGS. 5A and 5B. FIG. 5A is a cross-sectional view of the semiconductor device, and FIG. 5B is a plan view of the semiconductor device. Note that FIG. 5A is a cross-sectional view taken along line A1-A2 and line B1-B2 in FIG. 5B.

The semiconductor device described as an example includes a transistor 260 including a first semiconductor material in a lower portion, a transistor 262 including a second semiconductor material in an upper portion, and a capacitor 264. A gate electrode 210 of the transistor 260 is directly connected to a first electrode 242a of the transistor 262.

In the case where the transistor 262 and the capacitor 264 are provided so as to overlap with the transistor 260, high integration can be achieved. For example, given that the minimum feature size is F, the area occupied by a memory cell can be 15F² to 25F² by devising the connection between a wiring and an electrode.

The first semiconductor material included in the transistor 260 and the second semiconductor material included in the transistor 262 can be different. For example, a single crystal semiconductor can be used as the first semiconductor material to form the transistor 260 capable of high speed driving, and an oxide semiconductor can be used as the second semiconductor material to form the transistor 262 having a sufficiently small off-state current and capable of holding charge for a long time.

As the first semiconductor material and the second semiconductor material, an oxide semiconductor or a semiconductor material other than the oxide semiconductor may be used, for example. As the semiconductor material other than the oxide semiconductor, silicon, germanium, silicon germanium, silicon carbide, gallium arsenide, or the like can be used. Alternatively, an organic semiconductor material or the like can be used.

In this embodiment, a case where single crystal silicon is used as the first semiconductor material so that the transistor 260 can be driven at high speed and an oxide semiconductor is used as the second semiconductor material so that the transistor 262 can have a small off-state current will be described.

A semiconductor device having such a structure that the gate electrode 210 of the transistor 260 is connected to the first electrode 242a of the transistor 262 is favorable as a memory device. When the transistor 262 is in an off state, the potential of the gate electrode 210 of the transistor 260 can be held for an extremely long time. When the capacitor 264 is provided, charge supplied to the gate electrode 210 of the transistor 260 can be held easily and reading of the held data can be performed easily. In addition, with the transistor 260 including such a semiconductor material and capable of operating at high speed, data can be read at high speed.

Although all the transistors included in the semiconductor device described as an example in this embodiment are n-channel transistors here, it is needless to say that p-channel transistors can be used. The technical nature of the invention disclosed herein is that a transistor including an oxide semiconductor with a sufficiently small off-state current and a transistor including a semiconductor material other than an oxide semiconductor which is capable of sufficiently-high-speed driving are provided in combination. Accordingly, it is not necessary to limit specific conditions, such as a material used for the semiconductor device or a structure of the semiconductor device, to the conditions described here.

The transistor 260 includes a channel formation region 216 provided in a substrate 200 including the first semiconductor material and impurity regions 220 between which the channel formation region 216 is sandwiched. Further, the transistor 260 includes metal compound regions 224 which are in contact with the impurity regions 220, a gate insulating layer 208 provided over the channel formation region 216, and the gate electrode 210 provided over the gate insulating layer 208. Note that in some cases, a transistor whose source electrode and drain electrode are not explicitly illustrated in the drawing may be referred to as a transistor for the sake of convenience. Further, in this case, in description of the connection between transistors, a source region and a drain region may be referred to as a source electrode and a drain electrode, respectively, in some cases. In other words, in this specification, the term "source electrode" may include a source region and the term "drain electrode" may include a drain region.

Further, an element isolation insulating layer 206 is provided over the substrate 200 so as to surround the transistor 260, and an insulating layer 228 and an insulating layer 230 are provided over the transistor 260. Although not shown, part of the metal compound regions 224 of the transistor 260 is connected to a wiring 256 or another wiring via an electrode functioning as a source electrode or a drain electrode. Note that a transistor whose source electrode and drain electrode are not explicitly illustrated in the drawing may be referred to as a transistor for the sake of convenience.

In order to obtain high integration, the transistor 260 preferably does not have a sidewall insulating layer as illustrated in FIGS. 5A and 5B. On the other hand, in the case where characteristics of the transistor 260 are emphasized, a sidewall insulating layer may be provided on a side surface of the gate electrode 210, and the impurity regions 220 may include an impurity region which has a different impurity concentration from the impurity regions 220 and is provided in a region overlapping with the sidewall insulating layer.

In this embodiment, a single crystal silicon substrate is used as the substrate 200 including the first semiconductor material. In the case of using a single crystal semiconductor substrate of silicon or the like, the reading operation of the semiconductor device can be performed at higher speed.

The transistor 262 includes a purified oxide semiconductor layer as the second semiconductor material. The transistor 262 includes the first electrode 242a and a second electrode 242b which function as a source electrode and a drain electrode over the insulating layer 230, and an oxide semiconductor layer 244 electrically connected to the first electrode and the second electrode. Further, the transistor 262 includes a gate insulating layer 246 covering the oxide semiconductor layer 244 and a gate electrode 248a positioned over the gate insulating layer 246 and overlapping with the oxide semiconductor layer 244. In addition, an insulating layer 243a is provided between the first electrode 242a and the oxide semiconductor layer 244 so as to overlap with the gate electrode 248a, and an insulating layer 243b is provided between the second electrode 242b and the oxide semiconductor layer 244 so as to overlap with the gate electrode 248a.

The insulating layer 243a and the insulating layer 243b reduce capacitance generated between the gate electrode and the source or drain electrode. However, a structure without the insulating layer 243a and the insulating layer 243b may also be employed.

Here, the oxide semiconductor layer 244 is preferably an oxide semiconductor layer which is purified by sufficiently removing an impurity such as hydrogen therefrom. Specifically, the concentration of hydrogen in the oxide semiconductor layer 244 is lower than or equal to $5\times10^{19}$ atoms/cm$^3$, preferably lower than or equal to $5\times10^{18}$ atoms/cm$^3$, and further preferably lower than or equal to $5\times10^{17}$ atoms/cm$^3$, for example. Note that the above concentration of hydrogen in the oxide semiconductor layer 244 is measured by secondary ion mass spectroscopy (SIMS). In the oxide semiconductor layer 244 which is purified by sufficiently reducing the concentration of hydrogen and in which a defect level in an energy gap due to oxygen deficiency is reduced by supplying a sufficient amount of oxygen, the carrier concentration resulted from hydrogen, an oxygen deficiency, or the like is less than $1\times10^{12}$/cm$^3$, preferably less than $1\times10^{11}$/cm$^3$, and further preferably less than $1.45\times10^{19}$/cm$^3$.

The off-state current can be sufficiently small in the transistor including the oxide semiconductor layer 244. For example, in a transistor in which the oxide semiconductor layer 244 has a thickness of 30 nm and a channel length of 2 μm, the off-state current (a gate bias: −3 V) per channel length of 1 μm at room temperature (25° C.) is less than or equal to 100 zA (1 zA (zeptoampere) is equal to $1\times10^{-21}$ A), preferably less than or equal to 10 zA.

In this embodiment, the purified oxide semiconductor layer is formed by employing such a method that after fluorine is added into an oxide semiconductor layer, the oxide semiconductor layer is subjected to heat treatment so as to remove an impurity therefrom. By using a purified oxide semiconductor in this manner, the transistor 262 with excellent off-state current characteristics can be obtained. Embodiment 2 can be referred to for the details of the oxide semiconductor layer 244.

Although the oxide semiconductor layer 244 which is processed to have an island shape is used in the transistor 262 of FIGS. 5A and 5B in order to suppress leakage current between elements due to miniaturization, a structure including the oxide semiconductor layer 244 which is not processed to have an island shape may be employed. In the case where the oxide semiconductor layer is not processed to have an island shape, contamination of the oxide semiconductor layer 244 due to etching in processing can be prevented.

In the semiconductor device illustrated in FIGS. 5A and 5B as an example, a top surface of the gate electrode 210 of the transistor 260 is exposed on a surface of the insulating layer 228 and is directly connected to the first electrode 242a functioning as a source or drain electrode of the transistor 262. The gate electrode 210 may be connected to the first electrode 242a via an opening and an electrode which are additionally provided for the contact. However, in the case of direct connection, the contact area can be reduced and high integration of the semiconductor device can be achieved.

For example, in the case of using the semiconductor device of this embodiment as a memory device, high integration is crucial for an increase of storage capacity per unit area. In addition, a step necessary for forming an opening and an electrode which are additionally formed for the contact can be omitted; therefore, a process for manufacturing a semiconductor device can be simplified.

The capacitor 264 in FIGS. 5A and 5B includes the first electrode 242a functioning as the source or drain electrode, the oxide semiconductor layer 244, the gate insulating layer 246, and an electrode 248b. That is, the first electrode 242a functions as one electrode of the capacitor 264, and the electrode 248b functions as the other electrode of the capacitor 264.

In the capacitor 264 illustrated in FIGS. 5A and 5B as an example, the oxide semiconductor layer 244 and the gate insulating layer 246 are sandwiched between the first electrode 242a and the electrode 248b; however, only the gate insulating layer 246 may be sandwiched for larger capacity. Further, the capacitor 264 may have a structure including an insulating layer formed in a manner similar to that of the insulating layer 243a. In the case where a capacitor is not needed, it is possible to employ a structure without the capacitor 264.

Further, an insulating layer 250 is provided over the transistor 262 and the capacitor 264, and an insulating layer 252 is provided over the insulating layer 250. In an opening formed in the gate insulating layer 246, the insulating layer 250, the insulating layer 252, and the like, an electrode 254 is provided. The wiring 256 is provided over the insulating layer 252 and is electrically connected to the second electrode 242b through the electrode 254. Note that the wiring 256 may be configured to be in direct contact with the second electrode 242b.

In addition, an electrode (not shown) connected to the metal compound region 224 may be connected to the second electrode 242b. In this case, if the electrode 254 and the electrode connected to the metal compound region 224 are disposed so as to overlap with each other, high integration of the semiconductor device can be achieved.

<Manufacturing Method of Semiconductor Device>

Next, an example of a manufacturing method of the semiconductor device will be described. First, a manufacturing method of the lower transistor 260 will be described below with reference to FIGS. 6A to 6D and FIGS. 7A to 7C, and then a manufacturing method of the upper transistor 262 and the capacitor 264 will be described with reference to FIGS. 8A to 8D and FIGS. 9A to 9C.

<Manufacturing Method of Lower Transistor>

Figure 6A:
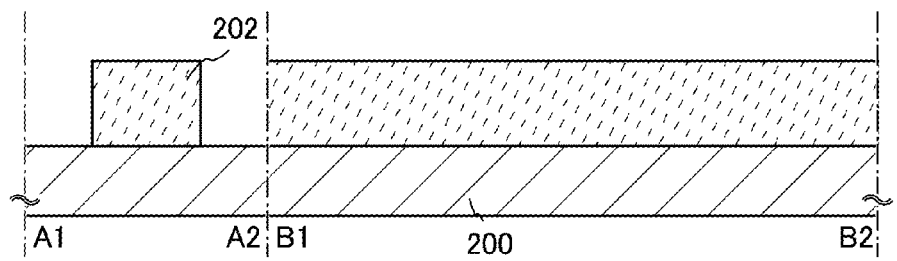
FIGS. 6A to 6D illustrate a manufacturing method of a semiconductor device of an embodiment.

First, the substrate 200 including a semiconductor material is prepared (FIG. 6A). As the substrate 200 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Here, an example of the case where a single crystal silicon substrate is used as the substrate 200 including a semiconductor material will be described.

Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate also includes a substrate having a structure in which a semiconductor layer is provided over an insulating substrate such as a glass substrate with an insulating layer interposed therebetween.

It is preferable to use a single crystal semiconductor substrate such as a single crystal silicon substrate as the substrate 200 including a semiconductor material because the transistor 260 can operate at higher speed.

A protective layer 202 serving as a mask for forming element isolation insulating layers is formed over the substrate 200 (FIG. 6A). As the protective layer 202, an insulating layer including a material such as silicon oxide, silicon nitride, or silicon oxynitride can be used, for example. Note that before and after this step, an impurity element giving n-type conductivity or an impurity element giving p-type conductivity can be added into the substrate 200 in order to control the threshold voltage of the transistor. When the semiconductor material included in the substrate 200 is silicon, phosphorus, arsenic, or the like can be used as the impurity giving n-type conductivity, and boron, aluminum, gallium, or the like can be used as the impurity giving p-type conductivity, for example.

Figure 6B:
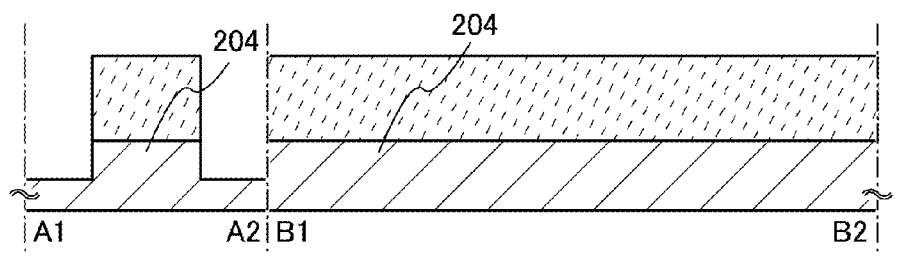

Next, part of the substrate 200 in a region that is not covered with the protective layer 202 (i.e., an exposed region) is removed by etching with the use of the protective layer 202 as a mask. Thus, a semiconductor region 204 which is apart from another semiconductor region is formed (FIG. 6B). As the etching, dry etching is preferably employed, but wet etching may be employed. An etching gas and an etchant can be selected as appropriate in accordance with a material of a layer to be etched.

Figure 6C:
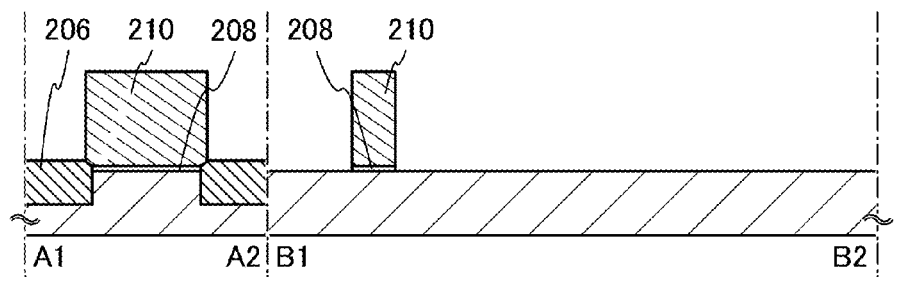

Then, an insulating layer is formed so as to cover the semiconductor region 204, and the insulating layer in a region overlapping with the semiconductor region 204 is selectively removed, so that the element isolation insulating layer 206 is formed (FIG. 6C). The insulating layer is formed using silicon oxide, silicon nitride, silicon oxynitride or the like. As a method for removing the insulating layer, polishing treatment such as chemical mechanical polishing (CMP), etching treatment, or the like can be given, and any of the above treatments may be used alone or in combination. Note that the protective layer 202 is removed after the formation of the semiconductor region 204 or after the formation of the element isolation insulating layer 206.

Note that as a formation method of the element isolation insulating layer 206, a method in which an insulating region is formed by introduction of oxygen or the like can be used as well as the method in which an insulating layer is selectively removed.

Next, an insulating layer is formed over a surface of the semiconductor region 204, and a layer including a conductive material is formed over the insulating layer.

The insulating layer is to be a gate insulating layer later, and may be formed by heat treatment (thermal oxidation treatment or thermal nitridation treatment) on the surface of the semiconductor region 204, for example. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD (chemical vapor deposition) method, a sputtering method, or the like. The insulating layer preferably has a single-layer structure or a stacked structure including a film which contains any of silicon oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$, (x>0, y>0)) to which nitrogen is added, hafnium aluminate ($HfAl_xO_y$, (x>0, y>0)) to which nitrogen is added, and the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the formation method of the layer including a conductive material, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched, so that the gate insulating layer 208 and the gate electrode 210 are formed (FIG. 6C).

Figure 6D:
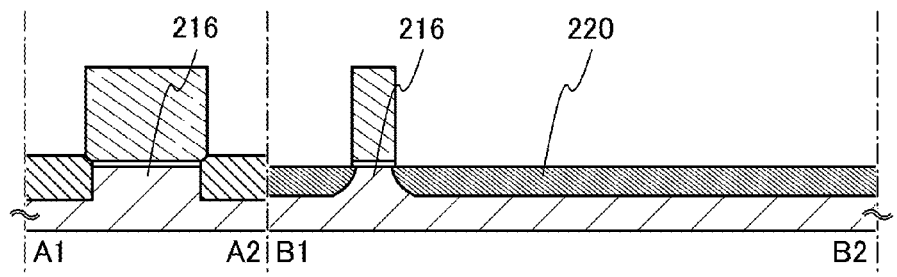

Next, phosphorus (P), arsenic (As), or the like is added into the semiconductor region 204, so that the channel formation region 216 and the impurity regions 220 are formed (FIG. 6D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably set high when the size of a semiconductor element is extremely decreased.

Note that a sidewall insulating layer may be formed in the periphery of the gate electrode 210 so that an impurity region in which an impurity element is included at a different concentration may be formed.

Figure 7A:
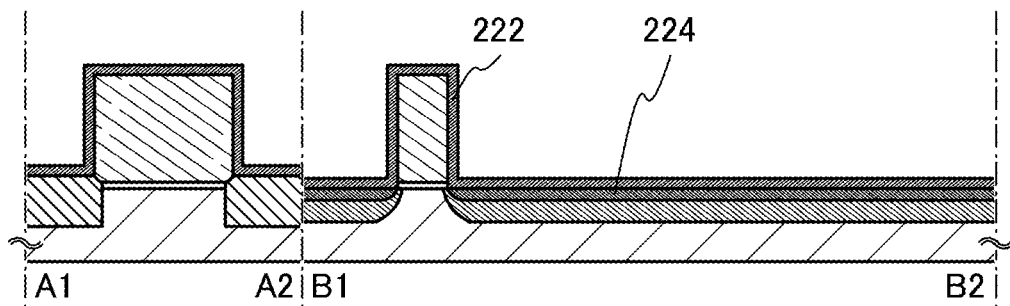
FIGS. 7A to 7C illustrate a manufacturing method of a semiconductor device of an embodiment.

Next, a metal layer 222 is formed so as to cover the gate electrode 210, the impurity regions 220, and the like (FIG. 7A). Any of a variety of film formation methods such as a vacuum evaporation method, a sputtering method, and a spin coating method is applicable as a formation method of the metal layer 222. The metal layer 222 is preferably formed using a metal material that becomes a low-resistance metal compound by reaction with the semiconductor material included in the semiconductor region 204. As such a metal material, titanium, tantalum, tungsten, nickel, cobalt, platinum, or the like can be used, for example.

Next, heat treatment is performed, whereby the metal layer 222 reacts with the semiconductor material. Thus, metal compound regions 224 which are in contact with the impurity regions 220 are formed (FIG. 7A). Note that in the case where the gate electrode 210 is formed using polycrystalline silicon or the like, a metal compound region is formed also in a region of the gate electrode 210 which is in contact with the metal layer 222.

As the heat treatment, irradiation with a flash lamp can be employed, for example. Although it is needless to say that another heat treatment method may be used, a method by which heat treatment can be completed in an extremely short time is preferably used in order to improve the controllability of chemical reaction in formation of the metal compound. Note that the metal compound regions are formed by reaction of the metal material with the semiconductor material and have sufficiently high conductivity. The formation of the metal compound regions can sufficiently reduce electric resistance and improve element characteristics. Note that the metal layer 222 is removed after the formation of the metal compound regions 224.

Figure 7B:
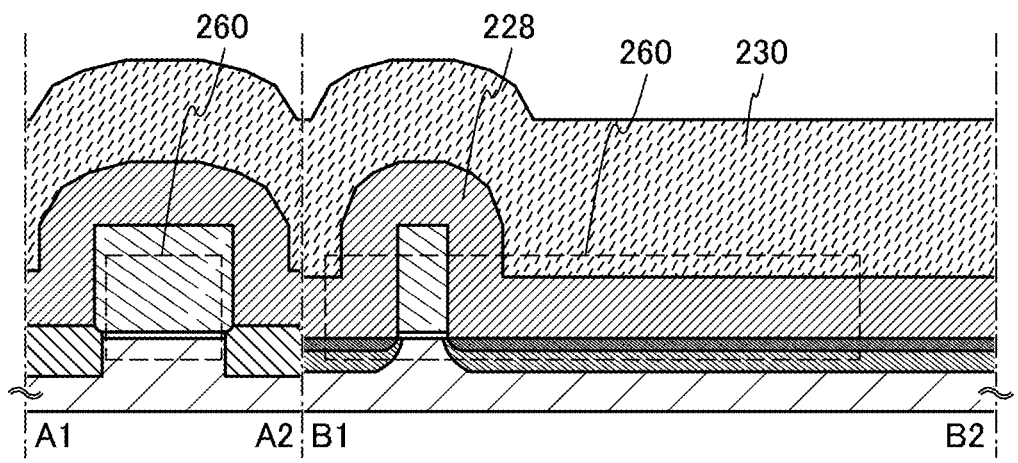

Then, the insulating layer 228 and the insulating layer 230 are formed so as to cover the components formed in the above steps (FIG. 7B). The insulating layer 228 and the insulating layer 230 can be formed using a material including an inorganic insulating material such as silicon oxide, silicon oxynitride, or aluminum oxide. In particular, the insulating layer 228 and the insulating layer 230 are preferably formed using a low dielectric constant (low-k) material, whereby capacitance caused by an overlap of electrodes or wirings can be sufficiently reduced. Note that a porous insulating layer including any of these materials may be used for the insulating layer 228 and the insulating layer 230. A porous insulating layer has lower dielectric constant than an insulating layer having high density; thus, capacitance due to electrodes or wirings can be further reduced.

In addition, a layer including an inorganic insulating material containing a large amount of nitrogen, such as silicon nitride oxide or silicon nitride, may be included in the insulating layer 228 or the insulating layer 230. Thus, an impurity such as water or hydrogen contained in the material included in the lower transistor 260 can be prevented from entering the oxide semiconductor layer 244 of the upper transistor 262 that is formed later. Note that in this case, it is difficult to remove the layer including an inorganic insulating material containing a large amount of nitrogen only by CMP treatment performed in a later step; therefore, CMP treatment and etching treatment are preferably used in combination.

For example, silicon oxynitride and silicon oxide can be used for forming the insulating layer 228 and the insulating layer 230, respectively. In this manner, when only an inorganic insulating material containing a large amount of oxygen, such as silicon oxynitride or silicon oxide, is used for forming the insulating layer 228 and the insulating layer 230, CMP treatment can be easily performed on the insulating layer 228 and the insulating layer 230 in a later step.

Note that a stacked structure of the insulating layer 228 and the insulating layer 230 is employed here; however, an embodiment of the invention disclosed herein is not limited to this. A single-layer structure or a stacked structure including three or more layers can also be used. For example, the following structure may be employed: silicon oxynitride and silicon oxide are used for the insulating layer 228 and the insulating layer 230, respectively, and a silicon nitride oxide film is formed between the insulating layer 228 and the insulating layer 230.

Figure 7C:
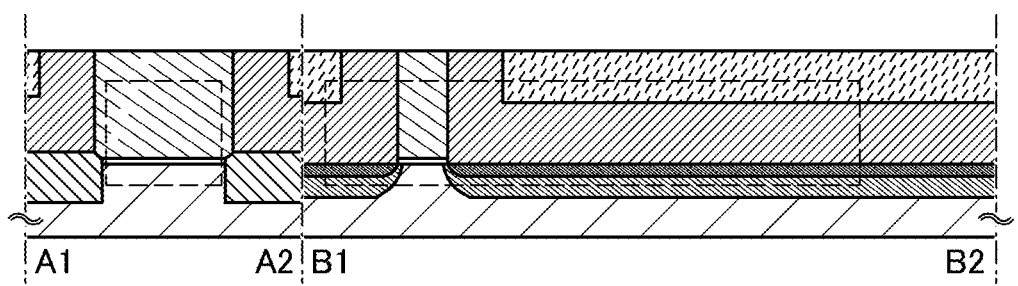

After that, as treatment before formation of the transistor 262, CMP treatment is performed on the insulating layer 228 and the insulating layer 230, so that surfaces of the insulating layer 228 and the insulating layer 230 are planarized and a top surface of the gate electrode 210 is exposed (FIG. 7C).

The CMP treatment may be performed once or plural times. When the CMP treatment is performed plural times, it is preferable that first polishing be performed at a high polishing rate and is followed by final polishing at a low polishing rate. By combining polishing with different polishing rates, planarity of the surfaces of the insulating layer 228 and the insulating layer 230 can be further improved.

In the case where an inorganic insulating material containing a large amount of nitrogen is included in the stacked structure of the insulating layer 228 and the insulating layer 230, it is difficult to remove the inorganic insulating material only by CMP treatment; therefore, CMP treatment and etching treatment are preferably used in combination. As the etching treatment for the inorganic insulating material containing a large amount of nitrogen, either dry etching or wet etching may be used. However, in view of miniaturization of elements, dry etching is preferably used. In addition, it is preferable that etching conditions (an etching gas, an etchant, an etching time, a temperature, or the like) be set as appropriate so that etching rates of the respective insulating layers are uniform and high etching selectivity with the gate electrode 210 can be obtained. In addition, as an etching gas for dry etching, for example, a gas containing fluorine (trifluoromethane ($CHF_3$)), a gas containing fluorine to which a rare gas such as helium (He) or argon (Ar) is added, or the like can be used.

When the top surface of the gate electrode 210 is exposed on the surface of the insulating layer 228, the top surface of the gate electrode 210 and the surface of the insulating layer 228 are preferably included in one surface.

Note that an electrode, a wiring, a semiconductor layer, an insulating layer, or the like may be further formed before and after the above steps. For example, an electrode which is connected to part of the metal compound regions 224 and functions as a source or drain electrode of the transistor 260 may be formed. In addition, a multilayer wiring structure in which an insulating layer and a conductive layer are stacked may be employed as a wiring structure, so that a highly-integrated semiconductor device can be realized.

<Manufacturing Method of Upper Transistor>

Figure 8A:
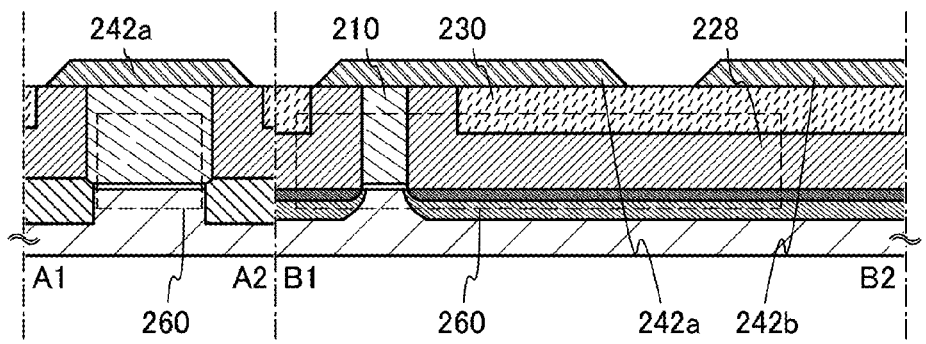
FIGS. 8A to 8D illustrate a manufacturing method of a semiconductor device of an embodiment.

Then, a conductive layer is formed over the gate electrode 210, the insulating layer 228, the insulating layer 230, and the like, and the conductive layer is selectively etched, so that the first electrode 242a functioning as a source or drain electrode and the second electrode 242b functioning as a source or drain electrode are formed (FIG. 8A). The first electrode 242a and the second electrode 242b can be formed using a material and a method similar to those of the electrodes functioning as source and drain electrodes described in Embodiment 2. Therefore, for the details, Embodiment 2 can be referred to.

At this time, the etching is performed so that end portions of the first electrode 242a and the second electrode 242b have a tapered shape. In the case where the end portions of the first electrode 242a and the second electrode 242b have a tapered shape, the end portions can be easily covered by an oxide semiconductor layer to be formed later and disconnection of the oxide semiconductor layer can be prevented. Further, the coverage with a gate insulating layer to be formed later is improved and disconnection of the gate insulating layer can be prevented.

Here, a taper angle is, for example, greater than or equal to 30° and less than or equal to 60°. Note that the taper angle is a tilt angle formed by a side surface and a bottom surface of a layer having a tapered shape (e.g., the first electrode 242a) in the case where the layer is observed from a direction perpendicular to a cross section (a plane perpendicular to the surface of a substrate).

The channel length (L) of the upper transistor is determined by a distance between a lower edge portion of the first electrode 242a and a lower edge portion of the second electrode 242b. Note that for light exposure for forming a mask used in the case where a transistor having a channel length (L) of less than 25 nm is formed, it is preferable to use extreme ultraviolet light whose wavelength is as short as several nanometers to several tens of nanometers. In the light exposure by extreme ultraviolet light, the resolution is high and the depth of focus is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Here, the first electrode 242a of the transistor 262 and the gate electrode 210 of the transistor 260 are directly connected to each other (FIG. 8A).

Figure 8B:
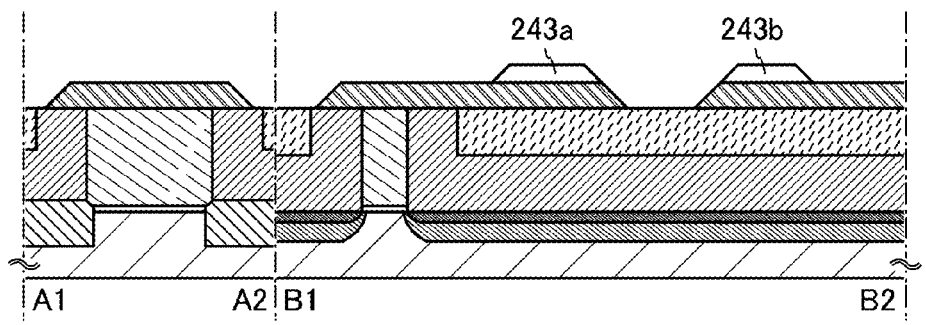

Next, the insulating layer 243a and the insulating layer 243b are formed over the first electrode 242a and the second electrode 242b, respectively (FIG. 8B). The insulating layer 243a and the insulating layer 243b are formed in the following manner: an insulating layer covering the first electrode 242a and the second electrode 242b is formed and is selectively etched. The insulating layer 243a and the insulating layer 243b are formed to overlap with part of a gate electrode formed later. When such an insulating layer is provided, the capacitance between the gate electrode and the source or drain electrode can be reduced.

The insulating layer 243a and the insulating layer 243b can be formed using a material including an inorganic insulating material such as silicon oxide, silicon oxynitride, silicon nitride, or aluminum oxide. In particular, a material with a low dielectric constant (a low-k material) is preferably used for forming the insulating layer 243a and the insulating layer 243b, because the capacitance between the gate electrode and the source or drain electrode can be sufficiently reduced. Note that a porous insulating layer formed using such a material may be used as the insulating layer 243a and the insulating layer 243b. A porous insulating layer has a lower dielectric constant than an insulating layer having high density; thus, the capacitance between the gate electrode and the source or drain electrode can be further reduced.

Note that in view of reduction in the capacitance between the gate electrode and the source or drain electrode, the insulating layer 243a and the insulating layer 243b are preferably formed; however, a structure without the insulating layer 243a and the insulating layer 243b may be employed.

Figure 8C:
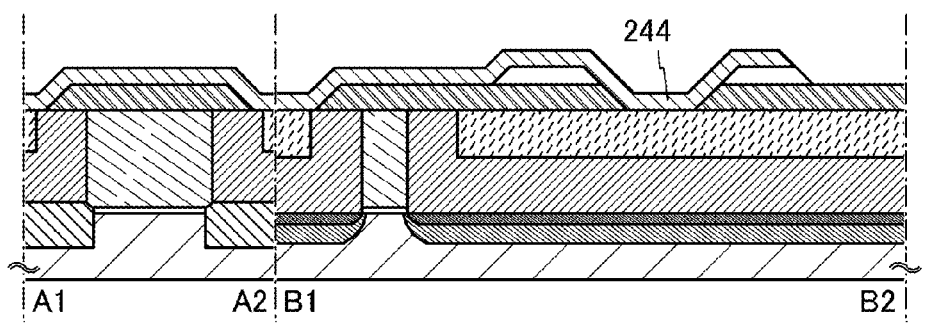

Next, an oxide semiconductor layer is formed so as to cover the first electrode 242a and the second electrode 242b, and then the oxide semiconductor layer is selectively etched, so that the oxide semiconductor layer 244 is formed (FIG. 8C). The oxide semiconductor layer 244 can be formed using a material and a method similar to those of the oxide semiconductor layer described in Embodiment 2. For the details, Embodiment 2 can be referred to.

Note that, as described in Embodiment 2, before the oxide semiconductor layer is formed by a sputtering method, reverse sputtering in which plasma is generated with an argon gas introduced is preferably performed, so that dust attached to a surface on which the oxide semiconductor layer is to be formed (e.g., the surface of the insulating layer 230) is removed.

Fluorine is added into the formed oxide semiconductor layer, and heat treatment (first heat treatment) is performed. To the method of the treatment for adding fluorine and the method of the heat treatment (the first heat treatment), any of the apparatuses and the methods described in Embodiment 2 can be applied. Therefore, for the details, Embodiment 2 can be referred to.

Through addition of fluorine into the deposited oxide semiconductor layer and the heat treatment (the first heat treatment), a residual impurity can be reduced, so that an i-type (intrinsic) or substantially i-type oxide semiconductor layer can be obtained. A transistor including the i-type (intrinsic) or substantially i-type oxide semiconductor layer in which a residual impurity has been reduced can realize extremely excellent characteristics such as a small variation in threshold voltage and a small off-state current.

The upper transistor of this embodiment may include fluorine in the oxide semiconductor layer in some cases. A halogen element in the oxide semiconductor layer is easily bonded to a metal atom having an unpaired electron so that dangling bond is terminated. Therefore, the metal atom can be prevented from being bonded to hydrogen or a hydroxyl group existing as an impurity, and formation of the impurity level can be prevented.

Note that the etching of the oxide semiconductor layer may be performed either before or after the heat treatment (the first heat treatment). Although dry etching is preferable in terms of element miniaturization, wet etching may also be used. An etching gas and an etchant can be selected as appropriate in accordance with a material of a layer to be etched. Note that in the case where leakage in an element is not a problem, the oxide semiconductor layer does not have to be processed into an island-shaped oxide semiconductor layer.

Figure 8D:
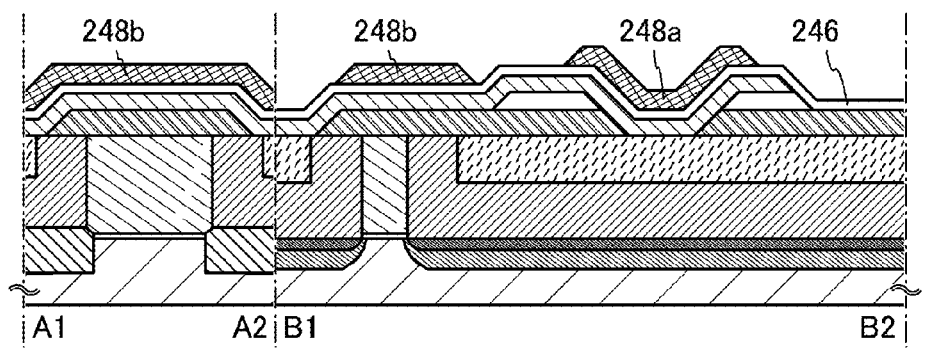

Next, the gate insulating layer 246 in contact with the oxide semiconductor layer 244 is formed, and then the gate electrode 248a and the electrode 248b are formed in a region overlapping with the oxide semiconductor layer 244 and a region overlapping with the first electrode 242a, respectively, over the gate insulating layer 246 (FIG. 8D). The gate insulating layer 246 can be formed using a material and a method similar to those of the gate insulating layer described in Embodiment 2.

The formed gate insulating layer 246 is preferably subjected to second heat treatment in an inert gas atmosphere or an oxygen atmosphere. The second heat treatment can be performed in a manner similar to that described in Embodiment 2. The second heat treatment can reduce variation in electric characteristics of the transistor. Further, in the case where the gate insulating layer 246 contains oxygen, oxygen can be supplied to the oxide semiconductor layer 244 to reduce oxygen vacancies in the oxide semiconductor layer 244, so that an i-type (intrinsic) or substantially i-type oxide semiconductor layer can be formed.

Note that in this embodiment, the second heat treatment is performed after the formation of the gate insulating layer 246; the timing of the second heat treatment is not limited thereto. For example, the second heat treatment may be performed after formation of the gate electrode.

By performing the first heat treatment after addition of fluorine as described above, the oxide semiconductor layer 244 can be purified so that impurities other than main components of the oxide semiconductor layer 244 are included therein as little as possible.

The gate electrode 248a can be formed using a material and a method similar to those of the gate electrode 611 described in Embodiment 2. In addition, the electrode 248b can be formed by selectively etching the conductive layer, at the same time as the formation of the gate electrode 248a. For the details, Embodiment 2 can be referred to.

Figure 9A:
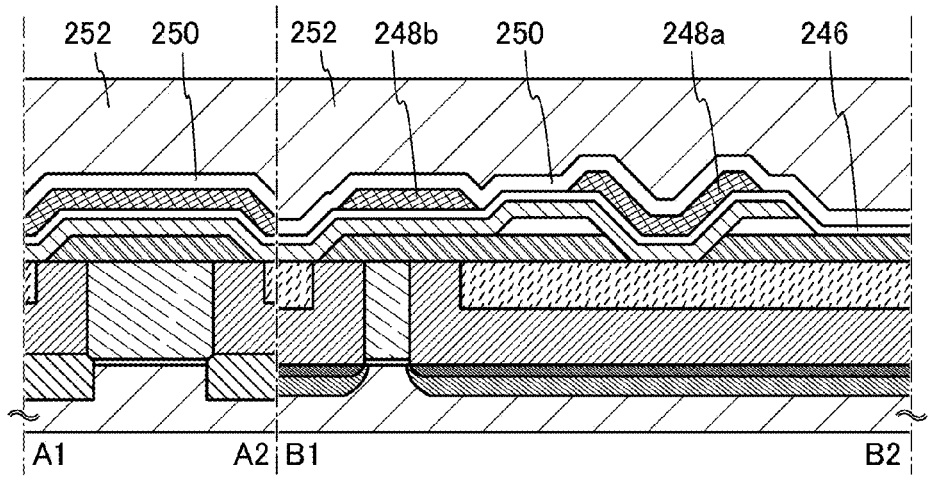
FIGS. 9A to 9C illustrate a manufacturing method of a semiconductor device of an embodiment.

Next, the insulating layer 250 and the insulating layer 252 are formed over the gate insulating layer 246, the gate electrode 248a, and the electrode 248b (FIG. 9A). The insulating layer 250 and the insulating layer 252 can be formed using materials and methods similar to those of the insulating layer 507 and the protective insulating layer 508 described in Embodiment 1. For the details, Embodiment 1 can be referred to.

Figure 9B:
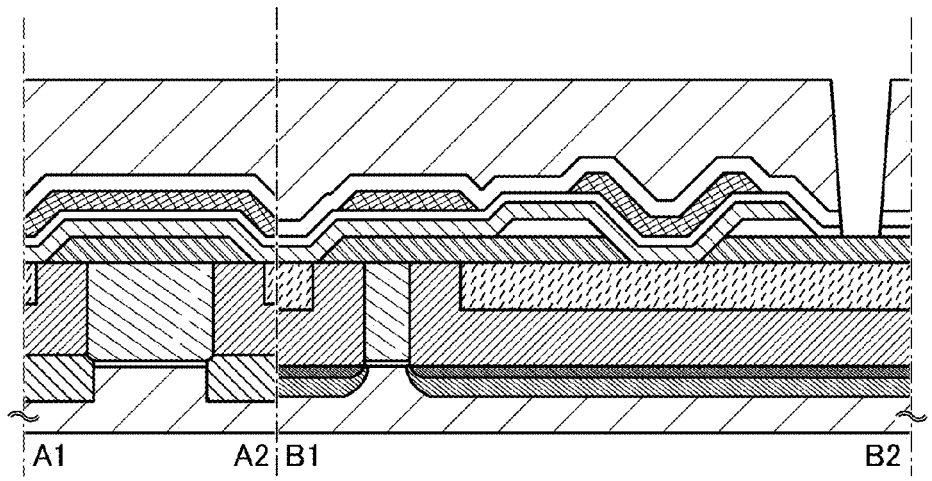

Next, an opening which reaches the second electrode 242b is formed in the gate insulating layer 246, the insulating layer 250, and the insulating layer 252 (FIG. 9B). The opening is formed by selective etching using a mask or the like.

Then, the electrode 254 is formed in the opening, and the wiring 256 in contact with the electrode 254 is formed over the insulating layer 252.

For example, the electrode 254 can be formed in the following manner: a conductive layer is formed in a region including the opening by a PVD (physical vapor deposition) method, a CVD method, or the like, and then, the conductive layer is partly removed by etching treatment, CMP, or the like.

Specifically, it is possible to employ a method, for example, in which a thin titanium film is formed in a region including the openings by a PVD method and a thin titanium nitride film is formed by a CVD method, and then, a tungsten film is formed so as to be embedded in the opening. Here, the titanium film formed by a PVD method has a function of reducing an oxide film (e.g., a natural oxide film) formed on a surface over which the titanium film is formed, to decrease the contact resistance with the lower electrode (here, the second electrode 242b) or the like. The titanium nitride film formed after the formation of the titanium film has a barrier function of preventing diffusion of the conductive material. After a barrier film is formed using titanium, titanium nitride, or the like, a copper film may be formed by plating.

Note that in the case where the electrode 254 is formed by removing part of the conductive layer, it is preferable that a surface of the conductive layer be processed so as to be flat. For example, when a thin titanium film or a thin titanium nitride film is formed in a region including the openings and then a tungsten film is formed so as to be embedded in the opening, excess tungsten, titanium, titanium nitride, or the like can be removed and the planarity of the surface can be improved by subsequent CMP treatment. In the case where the surface including the surface of the electrode 254 is planarized in such a manner, an electrode, a wiring, an insulating layer, a semiconductor layer, and the like can be favorably formed in later steps.

The wiring 256 can be formed using a material and a method similar to those of the wiring included in the gate electrode 611 described in Embodiment 2. For the details, Embodiment 2 can be referred to.

Figure 9C:
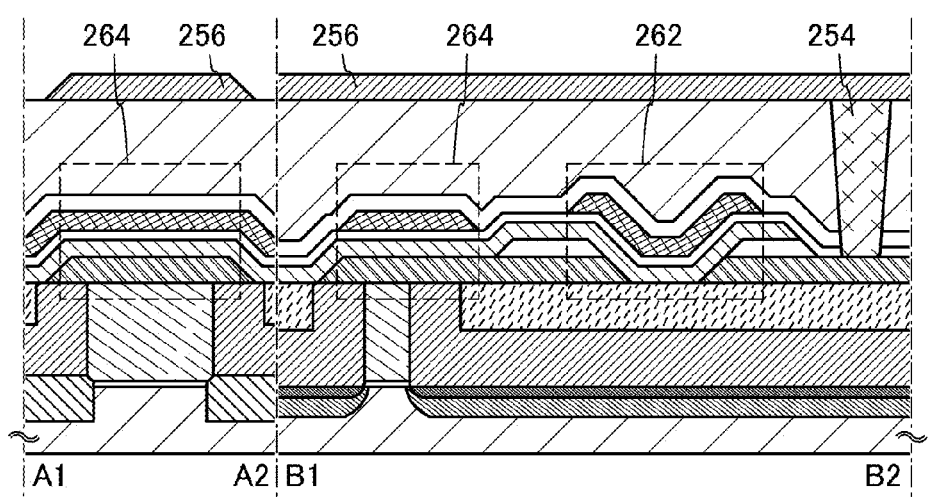

Through the above steps, the transistor 262 including the purified oxide semiconductor layer 244 and the capacitor 264 are completed (FIG. 9C).

With the use of the purified intrinsic oxide semiconductor layer 244, the off-state current of the transistor can be made sufficiently small. Then, by using such a transistor, a semiconductor device in which memory data can be stored for an extremely long time can be obtained.

Using the method of this embodiment described above as an example, the semiconductor device which includes the transistor including a semiconductor material other than an oxide semiconductor in the lower portion and the transistor including an oxide semiconductor in the upper portion can be manufactured.

When the gate electrode 210 and the first electrode 242a are directly connected to each other, higher integration of the semiconductor device can be achieved because the contact area can be reduced. Accordingly, a storage capacity per unit area of the semiconductor device which can be used as a memory device can be increased.

The structures, methods, and the like described in this embodiment can be combined as appropriate with any of the structures, methods, and the like described in the other embodiments.

Embodiment 5

In this embodiment, application examples of a semiconductor device according to an embodiment of the invention disclosed herein will be described with reference to FIGS. 13A-1, 13A-2, and 13B. Here, examples of a memory device will be described. Note that in a circuit diagram, "OS" is written beside a transistor in order to indicate that the transistor includes an oxide semiconductor.

Figures 1, 13A:
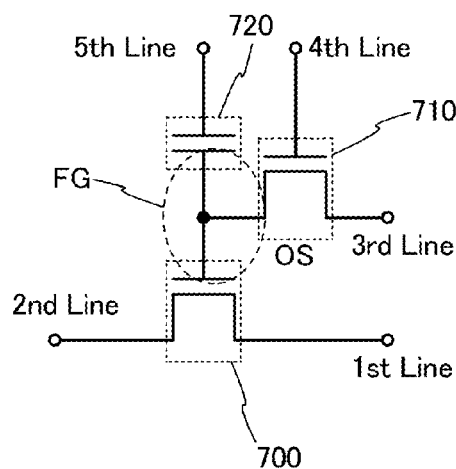
FIGS. 13A-1 13A-2, and 13B are circuit diagrams of semiconductor devices of an embodiment.

In the semiconductor device illustrated in FIG. 13A-1, a first wiring (a 1st Line) is electrically connected to a source electrode of a transistor 700, and a second wiring (a 2nd Line) is electrically connected to a drain electrode of the transistor 700. A third wiring (a 3rd Line) is electrically connected to the other of a source electrode and a drain electrode of a transistor 710, and a fourth wiring (a 4th Line) is electrically connected to a gate electrode of the transistor 710. A gate electrode of the transistor 700 and one of the source electrode and the drain electrode of the transistor 710 are electrically connected to one of electrodes of a capacitor 720. A fifth wiring (a 5th Line) is electrically connected to the other electrode of the capacitor 720.

Here, a transistor including an oxide semiconductor is used as the transistor 710. Here, as the transistor including an oxide semiconductor, for example, the transistor 262 described in the above embodiment can be used. A transistor including an oxide semiconductor has a characteristic of a significantly small off-state current. Therefore, when the transistor 710 is turned off, the potential of the gate electrode of the transistor 700 can be held for an extremely long time. By providing the capacitor 720, holding of charge given to the gate electrode of the transistor 700 and reading of the held data can be easily performed. Here, as the capacitor 720, for example, the capacitor 264 described in the above embodiment can be used.

In addition, a transistor including a semiconductor material other than an oxide semiconductor is used as the transistor 700. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can be operated at high speed easily. Here, as the transistor including a semiconductor material other than an oxide semiconductor, for example, the transistor 260 described in the above embodiment can be used.

Figure 13B:
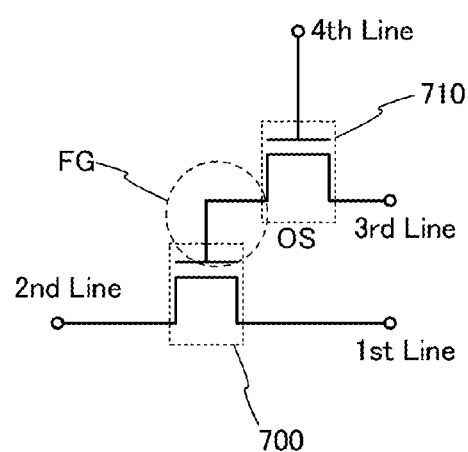

Alternatively, a structure without the capacitor 720 as illustrated in FIG. 13B can be employed.

The semiconductor device illustrated in FIG. 13A-1 can write, hold, and read data in the following manner, utilizing an advantage in that the potential of the gate electrode of the transistor 700 can be held.

First, writing and holding of data will be described. First, the potential of the fourth wiring is set to a potential at which the transistor 710 is on, so that the transistor 710 is turned on. Accordingly, the potential of the third wiring is supplied to the gate electrode of the transistor 700 and the capacitor 720. That is, predetermined charge is given to the gate electrode of the transistor 700 (writing). Here, one of two charges supplying different potentials (hereinafter, a charge supplying a low potential is referred to as a charge $Q_L$ and a charge supplying a high potential is referred to as a charge $Q_H$) is given to the gate electrode of the transistor 700. Note that charges giving three or more different potentials may be applied to improve a storage capacity. After that, the potential of the fourth wiring is set to a potential at which the transistor 710 is off, so that the transistor 710 is turned off. Thus, the charge given to the gate electrode of the transistor 700 is held (holding).

Since the off-state current of the transistor 710 is significantly small, the charge in the gate electrode of the transistor 700 is held for a long time.

Second, reading of data will be described. When supplying an appropriate potential (reading potential) to the fifth wiring while a predetermined potential (a constant potential) is supplied to the first wiring, the potential of the second wiring varies depending on the amount of charge held in the gate electrode of the transistor 700. This is because in general, when the transistor 700 is an n-channel transistor, an apparent threshold voltage $V_{th\_H}$ in the case where $Q_H$ is given to the gate electrode of the transistor 700 is lower than an apparent threshold voltage $V_{th\_L}$ in the case where $Q_L$ is given to the gate electrode of the transistor 700. Here, an apparent threshold voltage refers to the potential of the fifth wiring, which is needed to turn on the transistor 700. Thus, when the potential of the fifth wiring is set to a potential $V_0$ that is intermediate potential between $V_{th\_H}$ and $V_{th\_L}$, charge given to the gate electrode of the transistor 700 can be determined. For example, in the case where $Q_H$ is given in writing, when the potential of the fifth wiring is set to $V_0$ ($>V_{th\_H}$), the transistor 700 is turned on. In the case where $Q_L$ is given in writing, even when the potential of the fifth wiring is set to $V_0$ ($<V_{th\_L}$), the transistor 700 remains in an off state. Therefore, the held data can be read from the potential of the second wiring.

Note that in the case where memory cells are arrayed to be used, it is necessary to read data only from an intended memory cell. Thus, in order that data of a predetermined memory cell is read and data of the other memory cells is not read, in the case where the transistors 700 are connected in parallel among between the memory cells, a potential at which the transistor 700 is off regardless of a state of the gate electrode, that is, a potential lower than $V_{th\_H}$ may be supplied to fifth wirings of the memory cells whose data is not to be read. In the case where the transistors 700 are connected in series among the memory cells, a potential at which the transistor 700 is on regardless of the state of the gate electrode, that is, a potential higher than $V_{th\_L}$ may be supplied to the fifth wirings of the memory cells whose data is not to be read.

Third, rewriting of data will be described. Rewriting of data is performed in a manner similar to that of the above-described writing and holding of data. That is, the potential of the fourth wiring is set to a potential at which the transistor 710 is on, so that the transistor 710 is turned on. Accordingly, the potential of the third wiring (potential related to new data) is supplied to the gate electrode of the transistor 700 and the capacitor 720. After that, the potential of the fourth wiring is set to a potential at which the transistor 710 is off, so that the transistor 710 is turned off. Accordingly, charge related to new data is given to the gate electrode of the transistor 700.

In the semiconductor device according to the invention disclosed herein, data can be directly rewritten by another writing of data as described above. Therefore, extracting of charge from a floating gate with the use of high voltage needed in a flash memory or the like is unnecessary and thus, a reduction in operation speed, which is attributed to an erasing operation, can be suppressed. In other words, high-speed operation of the semiconductor device can be realized.

Note that the source electrode or the drain electrode of the transistor 710 is electrically connected to the gate electrode of the transistor 700, thereby having a function similar to that of a floating gate of a floating gate transistor used as a nonvolatile memory element. Therefore, a portion in the drawing where the source electrode or the drain electrode of the transistor 710 is electrically connected to the gate electrode of the transistor 700 is called a floating gate portion FG in some cases. When the transistor 710 is off, the floating gate portion FG can be regarded as being embedded in an insulator and thus charge is held in the floating gate portion FG The amount of off-state current of the transistor 710 including an oxide semiconductor is smaller than or equal to one hundred thousandth of the amount of off-state current of a transistor including a silicon semiconductor or the like; thus, loss of the charge accumulated in the floating gate portion FG due to leakage current from the transistor 710 is negligible. That is, with the transistor 710 including an oxide semiconductor, a nonvolatile memory device which can hold data without being supplied with power can be realized.

For example, when the off-state current of the transistor 710 is less than or equal to 10 zA (1 zA (zeptoampere) is $1\times10^{-21}$ A) at room temperature and the capacitance value of the capacitor 720 is approximately 10 fF, data can be held for $10^4$ seconds or longer. It is needless to say that the holding time depends on transistor characteristics and the capacitance value.

Further, in that case, the problem of deterioration of a gate insulating film (tunnel insulating film), which is pointed out in a conventional floating gate transistor, does not arise. That is, the deterioration of a gate insulating film due to injection of an electron into a floating gate, which has been conventionally regarded as a problem, can be solved. This means that there is no limit on the number of writing times in principle. Furthermore, high voltage needed for writing or erasing in a conventional floating gate transistor is unnecessary.

Figures 2, 13A:
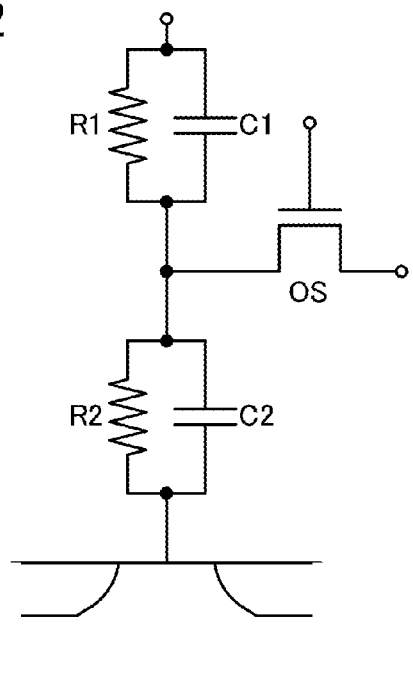

The components such as transistors in the semiconductor device in FIG. 13A-1 can be regarded as including a resistor and a capacitor as shown in FIG. 13A-2. That is, in FIG. 13A-2, the transistor 700 and the capacitor 720 are each regarded as including a resistor and a capacitor. Note that R1 and C1 denote the resistance value and the capacitance value of the capacitor 720, respectively. The resistance R1 corresponds to the resistance value of the insulating layer included in the capacitor 720. Further, R2 and C2 denote the resistance value and the capacitance value of the transistor 700, respectively. The resistance value R2 corresponds to the resistance value of a gate insulating layer at the time when the transistor 700 is on. The capacitance value C2 corresponds to the capacitance value of so-called gate capacitance (capacitance formed between the gate electrode and each of the source electrode and the drain electrode and capacitance formed between the gate electrode and the channel formation region).

The resistance value (also referred to as effective resistance) between the source electrode and the drain electrode in the case where the transistor 710 is off is denoted by ROS. When R1 and R2 satisfy the following relations of R1≥ROS and R2≥ROS under the condition that gate leakage of the transistor 710 is sufficiently small, a period for holding charge (also referred to as a data retention period) is determined mainly by the off-state current of the transistor 710.

On the other hand, when the above relations are not satisfied, it is difficult to secure a sufficient retention period even if the off-state current of the transistor 710 is sufficiently small. This is because a leakage current other than the off-state current of the transistor 710 (e.g., a leakage current generated between the source electrode and the gate electrode) is large. Thus, it is preferable that the semiconductor device disclosed in this embodiment satisfy the above relations.

Moreover, C1 and C2 preferably satisfy the relation: C1≥C2. This is because if C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be made small.

When the above relation is satisfied, a more favorable semiconductor device can be realized. Note that R1 and R2 are controlled by the gate insulating layer of the transistor 700 and the insulating layer of the capacitor 720. The same can be said to C1 and C2. Therefore, it is preferable that the material, the thickness, and the like of the gate insulating layer be set as appropriate to satisfy the above relations.

In the semiconductor device of this embodiment, the floating gate portion FG has a function equivalent to that of a floating gate of a floating gate transistor in a flash memory or the like, but the floating gate portion FG of this embodiment has an essentially different feature from that of the floating gate of the flash memory or the like. In a flash memory, since a voltage applied to a control gate is high, it is necessary to keep a proper distance between cells in order to prevent the potential from adversely affecting a floating gate of the adjacent cell. This is one of inhibiting factors in high integration of semiconductor devices. The factor is attributed to the following basic principle of a flash memory: a tunneling current is generated by application of a high electric field.

Further, because of the above principle of a flash memory, deterioration of an insulating film proceeds and thus another problem of the limit on the number of rewriting times (approximately $10^4$ to $10^5$ times) occurs.

The semiconductor device according to the invention disclosed herein is operated by switching of a transistor including an oxide semiconductor and does not use the above-described principle of charge injection by a tunneling current. That is, unlike a flash memory, a high electric field for injection of charge is not necessary. Accordingly, it is not necessary to consider an influence of a high electric field from a control gate on an adjacent cell, which facilitates high integration.

Further, since charge injection by a tunneling current is not utilized, there is no cause for deterioration of a memory cell. In other words, the semiconductor device according to the invention disclosed herein has higher durability and reliability than a flash memory.

In addition, the semiconductor device according to the invention has advantages over a flash memory in that a high electric field is unnecessary and a large peripheral circuit (such as a booster circuit) is unnecessary.

In the case where the dielectric constant εr1 of the insulating layer included in the capacitor 720 is different from the dielectric constant εr2 of the insulating layer included in the transistor 700, it is easy to satisfy C1≥C2 while 2·S2≥S1 (desirably, S2≥S1) is satisfied where S1 is the area of the insulating layer included in the capacitor 720 and S2 is the area of the insulating layer forming the gate capacitance of the transistor 700. That is, it is easy to satisfy C1≥C2 while it is satisfied that the area of the insulating layer included in the capacitor 720 is small. Specifically, for example, a film formed of a high-k material such as hafnium oxide or a stack including a film formed of a high-k material such as hafnium oxide and a film formed of an oxide semiconductor is used for the insulating layer included in the capacitor 720 so that εr1 can be set to 10 or more, preferably 15 or more, and silicon oxide is used for the insulating layer forming the gate capacitance so that εr2 can be set to 3 to 4.

A combination of such structures enables higher integration of the semiconductor device according to the invention disclosed herein.

Note that an n-channel transistor in which electrons are majority carriers is used in the above description; it is needless to say that a p-channel transistor in which holes are majority carriers can be used instead of the n-channel transistor.

As described above, the semiconductor device according to an embodiment of the invention disclosed herein has a non-volatile memory cell that includes a writing transistor in which a leakage current between a source and a drain in an off state (an off-state current) is small, a reading transistor including a semiconductor material different from that of the writing transistor, and a capacitor.

The off-state current of the writing transistor is preferably less than or equal to 100 zA ($1 \times 10^{-19}$ A), further preferably less than or equal to 10 zA ($1 \times 10^{-20}$ A), still further preferably less than or equal to 1 zA ($1 \times 10^{-21}$ A) at ambient temperature (e.g., 25° C.). In the case of a general silicon semiconductor, it is difficult to achieve such small off-state current. However, in a transistor obtained by processing an oxide semiconductor under an appropriate condition, a small off-state current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, the rise of a writing pulse given to the floating gate portion FG can be very sharp. Further, since the off-state current is small, the amount of charge held in the floating gate portion FG can be reduced. That is, by using a transistor including an oxide semiconductor as the writing transistor, rewriting of data can be performed at high speed.

Although there is no limitation on the off-state current of the reading transistor, a transistor that operates at high speed is preferably used as the reading transistor in order to increase the readout speed. For example, a transistor having a switching rate of 1 nanosecond or lower is preferably used as the reading transistor.

In this manner, when a transistor including an oxide semiconductor is used as a writing transistor, and a transistor including a semiconductor material other than an oxide semiconductor is used as a reading transistor, a semiconductor device capable of holding data for a long time and reading data at high speed, which can be used as a memory device, can be obtained.

The structures, methods, and the like described in this embodiment can be combined as appropriate with any of the structures, methods, and the like described in the other embodiments.

Embodiment 6

In this embodiment, application examples of a semiconductor device of an embodiment of the invention disclosed herein will be described with reference to FIGS. 14A and 14B and FIGS. 15A to 15C.

Figure 14A:
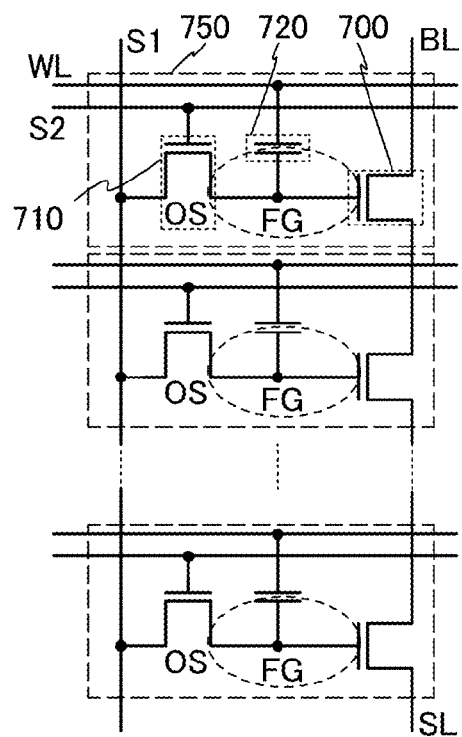
FIGS. 14A and 14B are circuit diagrams of semiconductor devices of an embodiment.
Figure 14B:
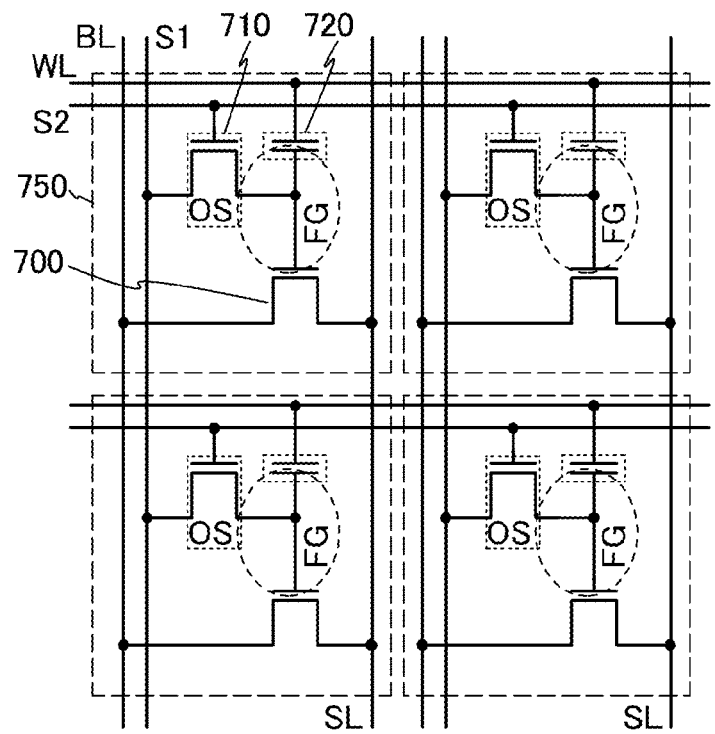

FIGS. 14A and 14B are examples of circuit diagrams of semiconductor devices each including a plurality of semiconductor devices (hereinafter also referred to as memory cells 750) illustrated in FIG. 13A-1. FIG. 14A is a circuit diagram of a so-called NAND semiconductor device in which the memory cells 750 are connected in series, and FIG. 14B is a circuit diagram of a so-called NOR semiconductor device in which the memory cells 750 are connected in parallel.

The semiconductor device in FIG. 14A includes a source line SL, a bit line BL, a first signal line S1, a plurality of second signal lines S2, a plurality of word lines WL, and the plurality of memory cells 750. In FIG. 14A, one source line SL and one bit line BL are provided; however, this embodiment is not limited to this structure. A plurality of source lines SL and a plurality of bit lines BL may be provided.

In each of the memory cells 750, a gate electrode of a transistor 700, one of a source electrode and a drain electrode of a transistor 710, and one of electrodes of a capacitor 720 are electrically connected to one another. The first signal line S1 and the other of the source electrode and the drain electrode of the transistor 710 are electrically connected to each other, and the second signal line S2 and the gate electrode of the transistor 710 are electrically connected to each other. The word line WL and the other of the electrodes of the capacitor 720 are electrically connected to each other.

Further, the source electrode of the transistor 700 included in the memory cell 750 is electrically connected to the drain electrode of the transistor 700 in an adjacent memory cell 750. The drain electrode of the transistor 700 included in the memory cell 750 is electrically connected to the source electrode of the transistor 700 in an adjacent memory cell 750. Note that the drain electrode of transistor 700 included in the memory cell 750 at one end among the plurality of memory cells connected in series is electrically connected to the bit line. The source electrode of the transistor 700 included in the memory cell 750 at the other end among the plurality of memory cells connected in series is electrically connected to the source line.

In the semiconductor device illustrated in FIG. 14A, writing operation and reading operation are performed per row. The writing operation is performed as follows. A potential at which the transistor 710 is on is applied to the second signal line S2 of a row where writing is to be performed, whereby the transistor 710 of the row where writing is to be performed is turned on. Accordingly, the potential of the first signal line S1 is supplied to the gate electrode of the transistor 700 of the specified row, and a predetermined charge is given to the gate electrode. In this manner, data can be written to the memory cell of the specified row.

Further, the reading operation is performed as follows. First, a potential at which the transistor 700 is on regardless of charge given to the gate electrode thereof is supplied to the word lines WL of the rows other than the row where reading is to be performed, so that the transistors 700 of the rows other than the row where reading is to be performed are turned on. Then, a potential (reading potential) at which an on state or an off state of the transistor 700 is determined depending on charge in the gate electrode of transistor 700 is supplied to the word line WL of the row where reading is to be performed. After that, a constant potential is supplied to the source line SL so that a reading circuit (not shown) connected to the bit line BL is operated. Here, the plurality of transistors 700 between the source line SL and the bit line BL are on except the transistor 700 of the row where reading is to be performed; therefore, conductance between the source line SL and the bit line BL is determined by a state (an on state or an off state) of the transistor 700 of the row where reading is to be performed. The conductance of the transistor 700 in the row where reading is performed varies depending on charge in the gate electrode thereof. Thus, a potential of the bit line BL varies accordingly. By reading the potential of the bit line with the reading circuit, data can be read from the memory cell of the specified row.

The semiconductor device illustrated in FIG. 14B includes a plurality of source lines SL, a plurality of bit lines BL, a plurality of first signal lines S1, a plurality of second signal lines S2, a plurality of word lines WL, and a plurality of memory cells 750. In each memory cell, the gate electrode of the transistor 700, one of the source electrode and the drain electrode of the transistor 710, and one of the electrodes of the capacitor 720 are electrically connected to one another. The source line SL and the source electrode of the transistor 700 are electrically connected to each other. The bit line BL and the drain electrode of the transistor 700 are electrically connected to each other. The first signal line S1 and the other of the source electrode and the drain electrode of the transistor 710 are electrically connected to each other, and the second signal line S2 and the gate electrode of the transistor 710 are electrically connected to each other. The word line WL and the other electrode of the capacitor 720 are electrically connected to each other.

In the semiconductor device illustrated in FIG. 14B, writing operation and reading operation are performed per row. The writing operation is performed in a manner similar to that of the semiconductor device in FIG. 14A. The reading operation is performed as follows. First, a potential at which the transistor 700 is off regardless of charge given to the gate electrode of the transistor 700 is supplied to the word lines WL of the rows other than the row where reading is to be performed, so that the transistors 700 of the rows other than the row where reading is to be performed are turned off. Then, a potential (reading potential) at which an on state or an off state of the transistor 700 is determined depending on charge in the gate electrode of the transistor 700 is supplied to the word line WL of the row where reading is to be performed. After that, a constant potential is supplied to the source lines SL so that a reading circuit (not shown) connected to the bit lines BL is operated. Here, conductance between the source lines SL and the bit lines BL is determined by a state (an on state or an off state) of the transistors 700 of the row where reading is performed. That is, a potential of the bit lines BL varies depending on charge in the gate electrodes of the transistors 700 of the row where reading is performed. By reading the potential of the bit lines with the reading circuit, data can be read from the memory cells of the specified row.

Although the amount of data which can be held in each of the memory cells 750 is one bit in the above description, the structure of the memory device of this embodiment is not limited to this. The amount of data which is held in each of the memory cells 750 may be increased by setting three or more levels of potentials supplied to the gate electrode of the transistor 700. For example, in the case where four levels of potentials are supplied to the gate electrode of the transistor 700, data of two bits can be stored in each of the memory cells.

Next, examples of a reading circuit which can be used for the semiconductor devices in FIGS. 14A and 14B or the like will be described with reference to FIGS. 15A to 15C.

Figure 15A:
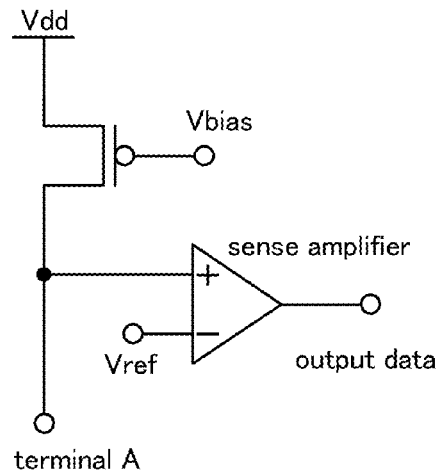
FIGS. 15A to 15C are circuit diagrams of semiconductor devices of an embodiment.

FIG. 15A schematically illustrates a reading circuit. The reading circuit includes a transistor and a sense amplifier circuit.

At the time of reading of data, a terminal A is connected to a bit line to which a memory cell from which data is read is connected. Further, a bias potential $V_{bias}$ is applied to a gate electrode of the transistor so that a potential of the terminal A is controlled.

The resistance of the memory cell 750 varies depending on stored data. Specifically, when the transistor 700 in a selected memory cell 750 is on, the memory cell has a low resistance; whereas when the transistor 700 in a selected memory cell 750 is off, the memory cell has a high resistance.

When the memory cell has a high resistance, the potential of the terminal A is higher than a reference potential $V_{ref}$ and the sense amplifier circuit outputs a potential corresponding to the potential of the terminal A. On the other hand, when the memory cell has a low resistance, the potential of the terminal A is lower than the reference potential $V_{ref}$ and the sense amplifier circuit outputs a potential corresponding to the potential of the terminal A.

Thus, by using the reading circuit, data can be read from the memory cell. Note that the reading circuit of this embodiment is one of examples. Another circuit may be used. The reading circuit may further include a precharge circuit. Instead of setting the reference potential $V_{ref}$, a reference bit line may be connected to the sense amplifier circuit.

Figure 15B:
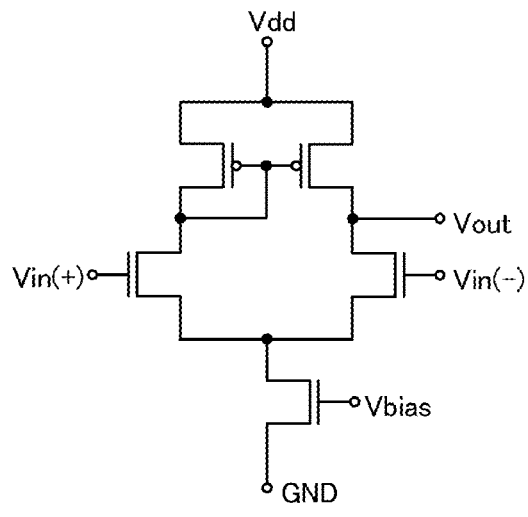

FIG. 15B illustrates a differential sense amplifier which is an example of sense amplifier circuits. The differential sense amplifier has an input terminal $V_{in}(+)$ and an input terminal $V_{in}(-)$, and an output terminal $V_{out}$, and amplifies the difference between $V_{in}(+)$ and $V_{in}(-)$. $V_{out}$ is approximately high output when $V_{in}(+) > V_{in}(-)$, and is approximately low output when $V_{in}(+) < V_{in}(-)$. In the case where the differential sense amplifier is used for the reading circuit, one of $V_{in}(+)$ and $V_{in}(-)$ is connected to the input terminal A, and the reference potential $V_{ref}$ is supplied to the other of $V_{in}(+)$ and $V_{in}(-)$.

Figure 15C:
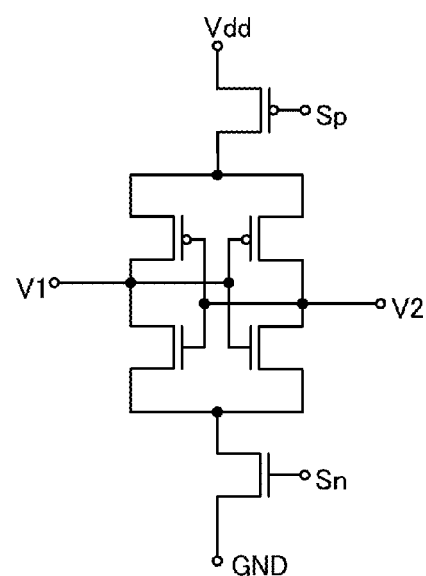

FIG. 15C illustrates a latch sense amplifier which is an example of sense amplifier circuits. The latch sense amplifier has input-output terminals V1 and V2 and input terminals of control signals Sp and Sn. First, the control signals Sp and Sn are set to a signal High and a signal Low, respectively, and a power supply potential ($V_{dd}$) is interrupted. Then, potentials to be compared are applied to $V_1$ and $V_2$. After that, the control signals Sp and Sn are set to a signal Low and a signal High, respectively, and a power supply potential ($V_{dd}$) is supplied. If the relation $V_{1in} > V_{2in}$ is satisfied for the potentials for comparison $V_{1in}$ and $V_{2in}$, an output from $V_1$ is a signal High and an output from $V_2$ is a signal Low, whereas an output from $V_1$ is a signal Low and an output from $V_2$ is a signal High if the relation $V_{1in} < V_{2in}$ is satisfied. By utilizing such relations, the difference between $V_{1in}$ and $V_{2in}$ can be amplified. In the case where the latch sense amplifier is used for the reading circuit, one of $V_1$ and $V_2$ is connected to the terminal A and the output terminal through a switch, and the reference potential $V_{ref}$ is supplied to the other of $V_1$ and $V_2$.

The structures, methods, and the like described in this embodiment can be combined as appropriate with any of the structures, methods, and the like described in the other embodiments.

Embodiment 7

In this embodiment, a liquid crystal display device to which a transistor of an embodiment of the present invention is applied, and an embodiment of a driving method of the transistor will be described with reference to FIG. 18, FIG. 19, FIG. 20, FIGS. 21A and 21B, and FIG. 22.

Figure 18:
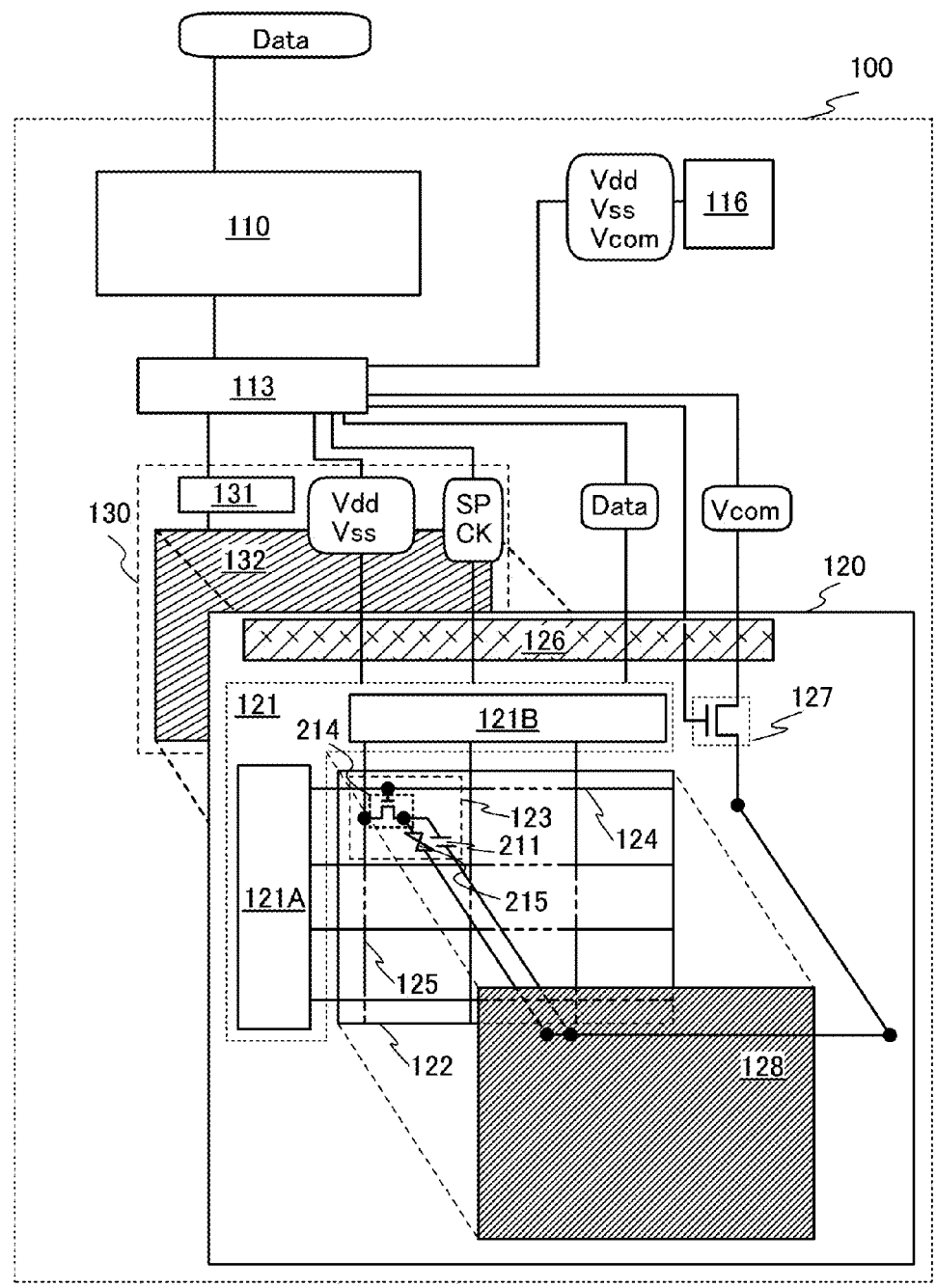
FIG. 18 is a block diagram showing a structure of a liquid crystal display device of an embodiment.

The block diagram of FIG. 18 illustrates components in a liquid crystal display device 100 described in this embodiment. The liquid crystal display device 100 includes an image processing circuit 110, a power supply 116, a display control circuit 113, and a display panel 120. In the case where the liquid crystal display device 100 is a transmissive liquid crystal display device or a transflective liquid crystal display device, a backlight unit 130 is provided as a light source.

An image signal (an image signal Data) is supplied to the liquid crystal display device 100 from an external device connected thereto. Power supply potentials (a high power supply potential Vdd, a low power supply potential Vss, and a common potential Vcom) are supplied to the display control circuit 113 when the power supply 116 is turned on. Control signals (a start pulse SP and a clock signal CK) are supplied by the display control circuit 113.

Note that the high power supply potential Vdd is a potential higher than a reference potential, and the low power supply potential Vss is a potential lower than or equal to the reference potential. Both the high power supply potential Vdd and the low power supply potential Vss are preferably potentials at which a transistor can operate. Note that the high power supply potential Vdd and the low power supply potential Vss may be collectively referred to as a power supply voltage in some cases.

The common potential Vcom can be any potential as long as it is a fixed potential serving as a reference with respect to a potential of an image signal supplied to a pixel electrode. For example, the common potential Vcom may be a ground potential.

The image signal Data may be inverted in accordance with dot inversion driving, source line inversion driving, gate line inversion driving, frame inversion driving, or the like as appropriate and input to the liquid crystal display device 100. It is preferable that the image signal Data be a digital signal because it can be easily calculated (e.g., a difference between image signals can be easily detected). In the case where the image signal Data is an analog signal, such a structure that the image signal is converted into a digital signal by an A/D converter or the like and supplied to the liquid crystal display device 100 is preferably employed.

In this embodiment, the common potential Vcom which is a fixed potential is applied to a common electrode 128 and one of electrodes of a capacitor 211 from the power supply 116 through the display control circuit 113.

The display control circuit 113 is a circuit which supplies an image signal processed in the image processing circuit 110, the control signals (specifically, signals for controlling switching between supply and stop of a control signal, such as the start pulse SP and the clock signal CK), and the power supply potentials (the high power supply potential Vdd, the low power supply potential Vss, and the common potential Vcom) to the display panel 120 and which also supplies a backlight control signal (specifically, a signal with which a backlight control circuit 131 controls on and off of a backlight 132) to the backlight unit 130.

The image processing circuit 110 analyzes, calculates, and/or processes the input image signal (the image signal Data) and outputs the processed image signal together with a control signal to the display control circuit 113.

For example, the image processing circuit 110 analyzes the input image signal Data and determines whether the signal is for a moving image or a still image, and outputs a control signal including the determination result to the display control circuit 113. Moreover, the image processing circuit 110 can extract data for a one-frame still image from the image signal Data including data for a still image, and output the extracted data to the display control circuit 113, together with a control signal indicating that the extracted data is for a still image. Furthermore, the image processing circuit 110 can sense data for a moving image from the image signal Data including data for a moving image, and output data for successive frames to the display control circuit 113, together with a control signal indicating that the sensed data is for a moving image.

The image processing circuit 110 operates the liquid crystal display device of this embodiment in a different manner in accordance with the input image signal Data. In this embodiment, a mode of operation performed when the image processing circuit 110 determines an image as a still image is a still image display mode, whereas a mode of operation performed when the image processing circuit 110 determines an image as a moving image is a moving image display mode.

The image processing circuit 110 described as an example in this embodiment may have a function of switching the display mode. The function of switching the display mode is a function of switching the display mode between a moving image display mode and a still image display mode without a judgment by the image processing circuit 110 in such a manner that a user selects an operation mode of the liquid crystal display device by hand or using an external connection device.

Note that the above-described function is one example of functions which the image processing circuit 110 has, and a variety of image processing functions may be selected depending on usage of the display device.

The display panel 120 includes a pair of substrates (a first substrate and a second substrate). A liquid crystal layer is sandwiched between the pair of substrates, and a liquid crystal element 215 is formed. Over the first substrate, a driver circuit portion 121, a pixel portion 122, a terminal portion 126, and a switching element 127 are provided. On the second substrate, the common electrode 128 (also referred to as a common electrode or a counter electrode) is provided. In this embodiment, a common connection portion (also referred to as a common contact) is provided for the first substrate or the second substrate so that a connection portion over the first substrate can be connected to the common electrode 128 on the second substrate.

A plurality of gate lines 124 (scan lines) and a plurality of source lines 125 (signal lines) are provided in the pixel portion 122 and a plurality of pixels 123 are provided in matrix so that the pixels are surrounded by the gate lines 124 and the source lines 125. Note that in the display panel described as an example in this embodiment, the gate lines 124 are extended from a gate line driver circuit 121A and the source lines 125 are extended from a source line driver circuit 121B.

Figure 19:
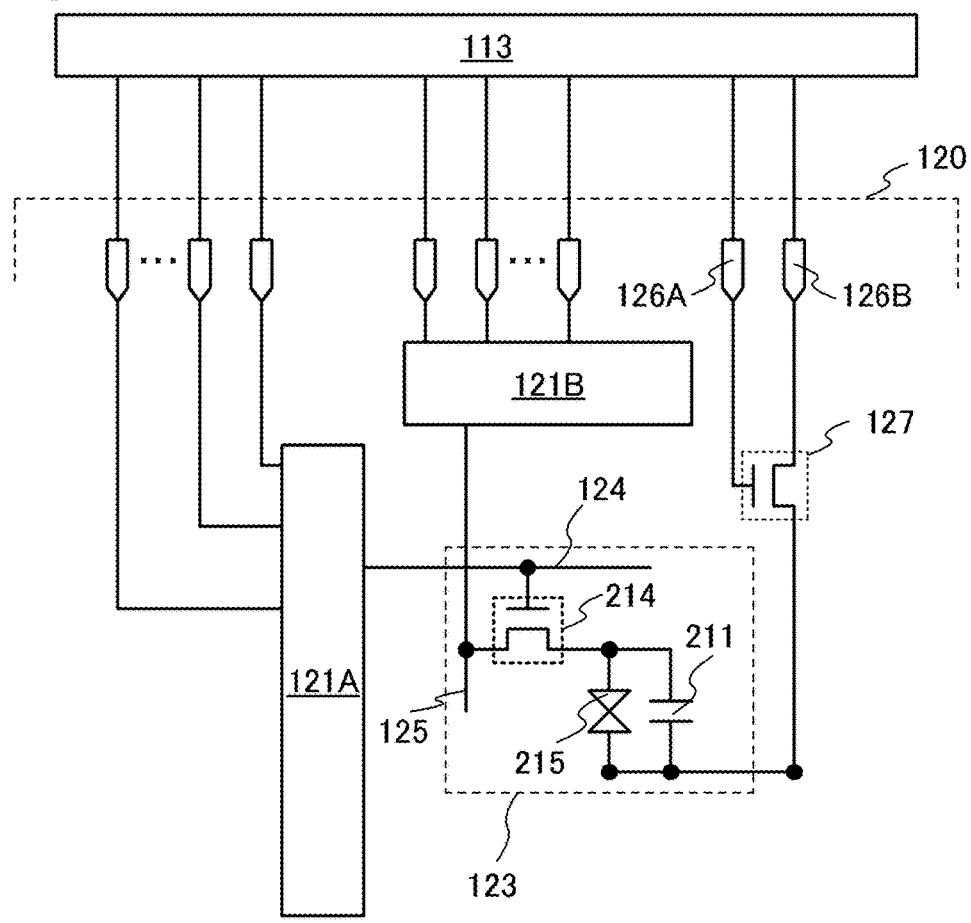
FIG. 19 illustrates a structure of a liquid crystal display device of an embodiment.

The pixels 123 each include a transistor 214 as a switching element, and the capacitor 211 and the liquid crystal element 215 which are connected to the transistor 214 (FIG. 19).

In the transistor 214, a gate electrode is connected to one of the plurality of gate lines 124 provided in the pixel portion 122, one of a source electrode and a drain electrode is connected to one of the plurality of source lines 125, and the other of the source electrode and the drain electrode is connected to one of the electrodes of the capacitor 211 and one of electrodes (a pixel electrode) of the liquid crystal element 215.

As the transistor 214, a transistor having a small off-state current is preferably used; any of the transistors described in Embodiments 1 to 3 is preferable. If the transistor 214 has a small off-state current, charge can be stably held in the liquid crystal element 215 and the capacitor 211 in an off state. In the case where the transistor 214 has a sufficiently small off-state current, the pixel 123 can also be formed without the capacitor 211.

With this configuration, the pixel 123 can maintain the state of data written before the transistor 214 is turned off for a long period, so that power consumption can be reduced.

The liquid crystal element 215 is an element which controls transmission or non-transmission of light utilizing an optical modulation action of liquid crystal. The optical modulation action of liquid crystal is controlled by an electric field applied to the liquid crystal. A direction of the electric field applied to the liquid crystal depends on a liquid crystal material, a driving method, and an electrode structure and can be selected as appropriate. For example, in the case where a driving method in which an electric field is applied in a direction of a thickness of liquid crystal (so-called a vertical direction) is used, a pixel electrode and a common electrode are provided on the first substrate and the second substrate respectively, so that the liquid crystal is interposed between the first substrate and the second substrate. In the case where a driving method in which an electric field is applied in an in-plane direction of a substrate (so-called a horizontal direction) to a liquid crystal is used, a pixel electrode and a common electrode may be provided on the same side with respect to the liquid crystal. The pixel electrode and the common electrode may have a variety of opening patterns.

As examples of a liquid crystal applied to a liquid crystal element, the following can be given: a nematic liquid crystal, a cholesteric liquid crystal, a smectic liquid crystal, a discotic liquid crystal, a thermotropic liquid crystal, a lyotropic liquid crystal, a low-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

In addition, the following can be used as a driving mode of a liquid crystal: a TN (twisted nematic) mode, an STN (super twisted nematic) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and the like. Alternatively, an IPS (in-plane-switching)

mode, an FFS (fringe field switching) mode, an MVA (multi-domain vertical alignment) mode, a PVA (patterned vertical alignment) mode, an ASM (axially symmetric aligned micro-cell) mode, or the like can be used. Note that there is no particular limitation on a liquid crystal material, a driving method, and an electrode structure in this embodiment as long as the liquid crystal element controls transmission or non-transmission of light by the optical modulation action.

In the liquid crystal element described as an example in this embodiment, the liquid crystal orientation is controlled by an electric field in a vertical direction which is generated between the pixel electrode provided on the first substrate side and the common electrode provided on the second substrate side and facing the pixel electrode.

The terminal portion 126 is an input terminal which supplies predetermined signals (the high power supply potential Vdd, the low power supply potential Vss, the start pulse SP, the clock signal CK, the image signal Data, the common potential Vcom, and the like) which are output from the display control circuit 113, to the driver circuit portion 121.

The driver circuit portion 121 includes the gate line driver circuit 121A and the source line driver circuit 121B. The gate line driver circuit 121A and the source line driver circuit 121B are driver circuits for driving the pixel portion 122 including the plurality of pixels and each include a shift register circuit (also referred to as a shift register).

Note that the gate line driver circuit 121A and the source line driver circuit 121B may be formed over the same substrate as the pixel portion 122 or may be formed over another substrate.

The high power source potential Vdd, the low power source potential Vss, the start pulse SP, the clock signal CK, and the image signal Data which are controlled by the display control circuit 113 are supplied to the driver circuit portion 121.

A transistor can be used as the switching element 127. A gate electrode of the switching element 127 is connected to a terminal 126A, and the switching element 127 supplies the common potential Vcom to the common electrode 128 in accordance with a control signal that is output from the display control circuit 113. One of a source electrode and a drain electrode of the switching element 127 may be connected to a terminal 126B, and the other of the source electrode and the drain electrode may be connected to the common electrode 128 so that the common potential Vcom is supplied from the display control circuit 113 to the common electrode 128. The switching element 127 may be formed over the same substrate as the driver circuit portion 121 or the pixel portion 122, or may be formed over another substrate.

In addition, by using any of the transistors having a small off-state current described in Embodiments 1 to 3 as the switching element 127, a reduction over time in the voltage applied to both terminals of the liquid crystal element 215 can be suppressed.

The common electrode 128 is electrically connected to a common potential line which supplies the common potential Vcom controlled by the display control circuit 113 through the common connection portion.

As a specific example of the common connection portion, a conductive particle in which an insulating sphere is covered with a thin metal film is interposed between the common electrode 128 and the common potential line, whereby the common electrode 128 and the common potential line can be electrically connected to each other. Note that a plurality of common connection portions may be provided in the display panel 120.

The liquid crystal display device may include a photometric circuit. The liquid crystal display device provided with the photometric circuit can detect brightness of the environment where the liquid crystal display device is placed. When the photometric circuit detects that the liquid crystal display device is used in a dim environment, the display control circuit 113 controls light from the backlight 132 to have higher intensity so that visibility of the display screen is secured. In contrast, when the photometric circuit detects that the liquid crystal display device is used under extremely bright external light (e.g., under direct sunlight outdoors), the display control circuit 113 controls light from the backlight 132 to have lower intensity so that power consumption of the backlight 132 is reduced. Thus, the display control circuit 113 can control a driving method of a light source such as a backlight or a sidelight in accordance with a signal input from the photometric circuit.

The backlight unit 130 includes the backlight control circuit 131 and the backlight 132. The backlight 132 may be selected and combined in accordance with the use of the liquid crystal display device 100. For the backlight 132, a light-emitting diode (LED) or the like can be used. For example, a light-emitting element emitting white light (e.g., an LED) can be provided for the backlight 132. A backlight signal which controls a backlight and a power supply potential are supplied from the display control circuit 113 to the backlight control circuit 131.

If needed, an optical film (such as a polarizing film, a retardation film, or an anti-reflection film) can be used in combination as appropriate. A light source such as a backlight that is used in a semi-transmissive liquid crystal display device may be selected and combined in accordance with the use of the liquid crystal display device 100, and a cold cathode tube, a light-emitting diode (LED), or the like can be used. Further, a surface light source may be formed using a plurality of LED light sources, a plurality of electroluminescent (EL) light sources, or the like. As the surface light source, LEDs of three or more colors may be used and an LED emitting white light may be used. Note that a color filter is not always provided in the case where light-emitting diodes of RGB or the like are arranged in a backlight and a successive additive color mixing method (a field sequential method) in which color display is performed by time division is employed.

Next, a driving method of the liquid crystal display device 100 illustrated in FIG. 18 will be described with reference to FIG. 19, FIG. 20, FIGS. 21A and 21B, and FIG. 22. The driving method of the liquid crystal display device described in this embodiment is a display method in which the frequency of writing in the display panel varies in accordance with properties of a display image. Specifically, in the case where image signals in successive frames are different from each other (i.e., a moving image is displayed), a display mode in which an image signal is written in each frame period is used. On the other hand, in the case where image signals in successive frames have the same image (i.e., a still image is displayed), a display mode is used in which writing of image signals is not performed or the writing frequency is extremely reduced in a period in which the same image is being displayed; the voltage applied to the liquid crystal element is held by setting potentials of the pixel electrode and the common electrode which apply the voltage to the liquid crystal element in a floating state; and accordingly a still image is displayed without an additional supply of potential.

The liquid crystal display device combines a moving image and a still image and displays images on the screen. The moving image refers to an image which is recognized as an image that is moving by the human eyes by rapidly switching a plurality of different images which are obtained by time division into a plurality of frames. Specifically, by switching images at least 60 times (60 frames) per second, the images are recognized as a moving image with little flicker by the human eyes. In contrast, unlike a moving image and a partial moving image, a still image refers to an image which does not change in successive frame periods, for example, between an n-th frame and an (n+1)-th frame though a plurality of images which are time-divided into a plurality of frame periods are switched at high speed.

First, electric power is supplied by turning on the power supply 116 of the liquid crystal display device. The display control circuit 113 supplies the power supply potentials (the high power supply potential Vdd, the low power supply potential Vss, and the common potential Vcom) and the control signals (the start pulse SP and the clock signal CK) to the display panel 120.

The image signal (the image signal Data) is supplied to the liquid crystal display device 100 from the external device connected thereto. The image processing circuit 110 of the liquid crystal display device 100 analyzes an image signal that is input thereto. Here, a case in which whether the image signal is for a moving image or a still image is judged and a different signal is output depending on whether the image signal is for a moving image or a still image will be described.

For example, when the input image signal (the image signal Data) is switched from a moving image signal to a still image signal, the image processing circuit 110 extracts data for a still image from the input image signal, and outputs the extracted data together with a control signal indicating that the extracted data is for a still image to the display control circuit 113. Furthermore, when the input image signal (the image signal Data) is switched from a still image signal to a moving image signal, the image processing circuit 110 outputs an image signal including data for a moving image together with a control signal indicating that the image signal is for a moving image to the display control circuit 113.

Next, signals supplied to the pixels will be described with reference to an equivalent circuit diagram of the liquid crystal display device illustrated in FIG. 19 and a timing chart shown in FIG. 20.

Figure 20:
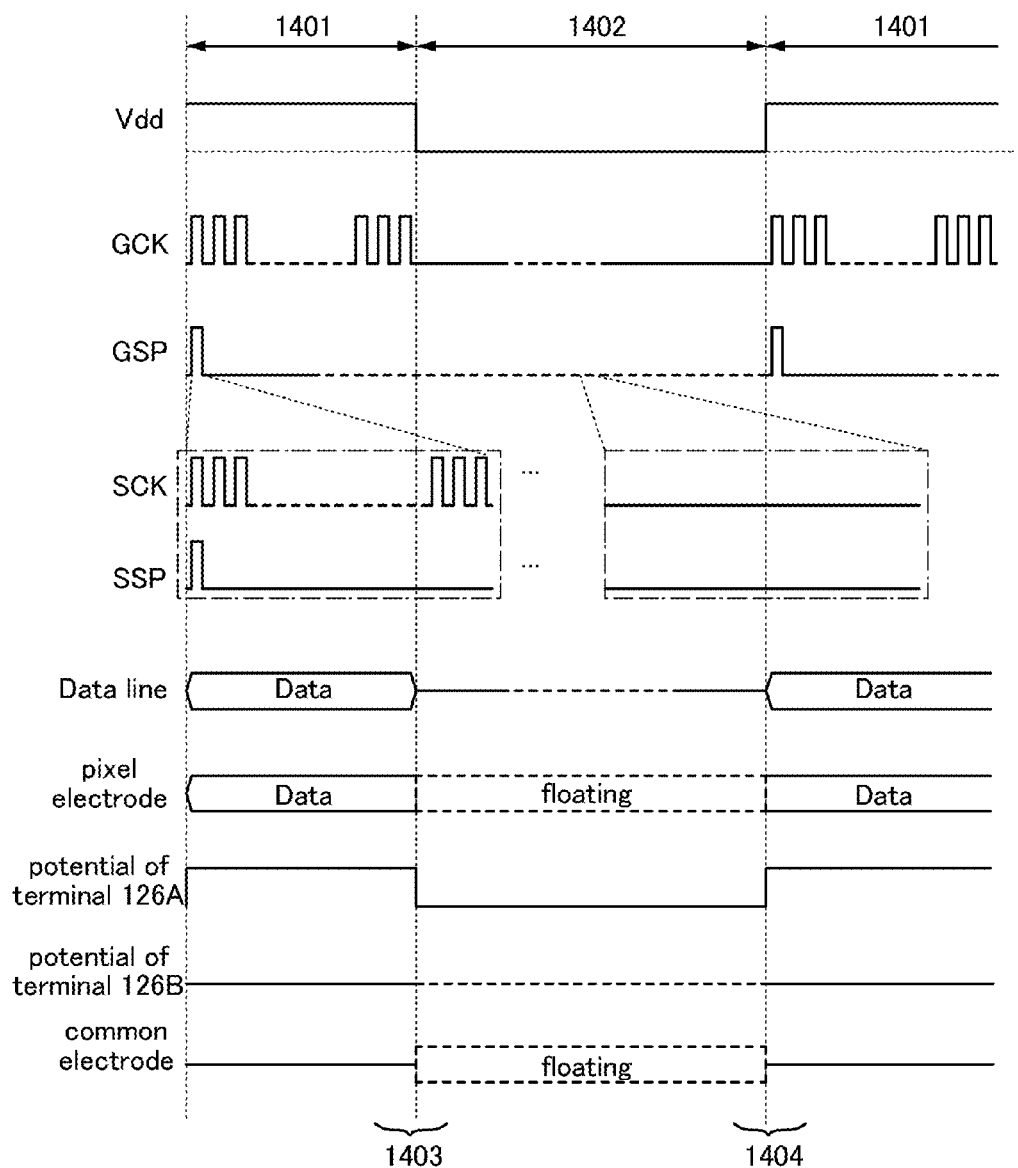
FIG. 20 is a timing chart showing operations of a liquid crystal display device of an embodiment.

In FIG. 20, a clock signal GCK and a start pulse GSP that the display control circuit 113 supplies to the gate line driver circuit 121A are shown. In addition, a clock signal SCK and a start pulse SSP that the display control circuit 113 supplies to the source line driver circuit 121B are shown in FIG. 20. To describe output timing of the clock signals, the waveforms of the clock signals are indicated with simple square waves in FIG. 20.

In FIG. 20, a potential of the source line (Data line) 125, a potential of the pixel electrode, a potential of the terminal 126A, a potential of the terminal 126B, and a potential of the common electrode are illustrated.

In FIG. 20, a period 1401 corresponds to a period during which image signals for displaying a moving image are written. In the period 1401, image signals and a common potential are supplied to each pixel of the pixel portion 122 and the common electrode.

Further, a period 1402 corresponds to a period during which a still image is displayed. In the period 1402, the supply of image signals to each pixel of the pixel portion 122 and the common potential to the common electrode is stopped. Note that FIG. 20 shows a structure in which supply of signals is performed so that the driver circuit portion stops operating during the period 1402; however, it is preferable to employ a structure in which image signals are regularly written depending on the length of the period 1402 and the refresh rate so as to prevent deterioration of a still image.

First, the timing chart in the period 1401 during which image signals for displaying a moving image are written will be described. In the period 1401, a clock signal is always supplied as the clock signal GCK and a pulse corresponding to vertical synchronization frequency is supplied as the start pulse GSP. Moreover, in the period 1401, a clock signal is always supplied as the clock signal SCK and a pulse corresponding to one gate selection period is supplied as the start pulse SSP.

The image signal Data is supplied to the pixels in each row through the source line 125 and a potential of the source line 125 is supplied to the pixel electrode depending on the potential of the gate line 124.

The display control circuit 113 supplies a potential which brings the switching element 127 into electrical conduction to the terminal 126A of the switching element 127 and also supplies a common potential to the common electrode through the terminal 126B.

Next, the timing chart in the period 1402 during which a still image is displayed will be described. In the period 1402, the supply of the clock signal GCK, the start pulse GSP, the clock signal SCK, and the start pulse SSP is stopped. Further, in the period 1402, the supply of the image signal Data to the source line 125 is stopped. In the period 1402 during which the supply of the clock signal GCK and the start pulse GSP is stopped, the transistor 214 is off, and the potential of the pixel electrode becomes in a floating state.

In addition, the display control circuit 113 supplies a potential which brings the switching element 127 out of electrical conduction to the terminal 126A of the switching element 127, so that the potential of the common electrode becomes in a floating state.

In the period 1402, both electrodes of the liquid crystal element 215, i.e., the pixel electrode and the common electrode, are put in the floating state; thus, a still image can be displayed without additional supply of potential.

The stop of the supply of a clock signal and a start pulse to the gate line driver circuit 121A and the source line driver circuit 121B enables low power consumption.

In particular, in the case where a transistor having a small off-state current is used for the transistor 214 and the switching element 127, a reduction over time in the voltage applied to both terminals of the liquid crystal element 215 can be suppressed.

Figure 21A:
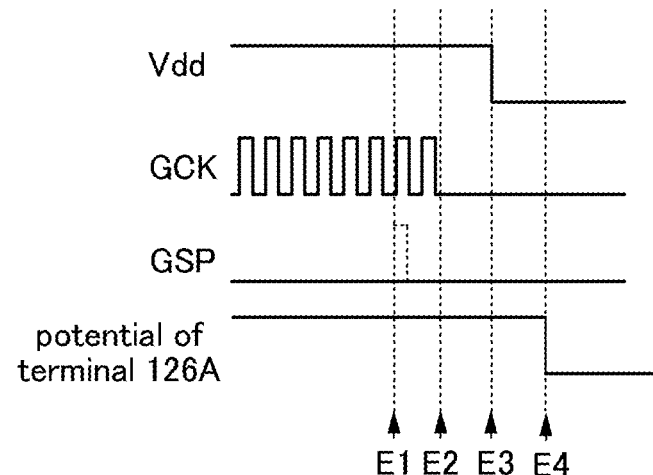
FIGS. 21A and 21B are timing charts showing operations of a display control circuit in a liquid crystal display device of an embodiment.
Figure 21B:
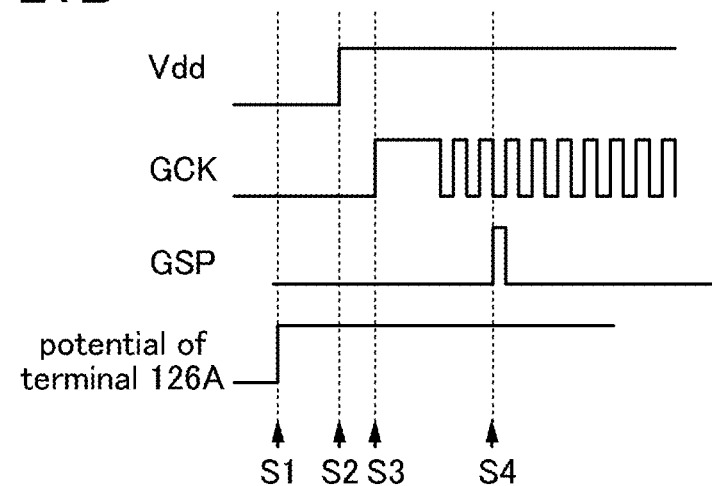

Next, operations of the display control circuit in a period during which the displayed image is switched from a moving image to a still image (a period 1403 in FIG. 20) and in a period during which the displayed image is switched from a still image to a moving image (a period 1404 in FIG. 20) will be described with reference to FIGS. 21A and 21B. In FIGS. 21A and 21B, the high power supply potential Vdd, the clock signal (here, GCK), the start pulse signal (here, GSP), and the potential of the terminal 126A which are output from the display control circuit are shown.

The operation of the display control circuit in the period 1403 during which the displayed image is switched from the moving image to the still image is shown in FIG. 21A. The display control circuit stops the supply of the start pulse GSP (E1 in FIG. 21A, a first step). Then, after pulse output reaches the last stage of the shift register, the supply of a plurality of clock signals GCK is stopped (E2 in FIG. 21A, a second step). Then, the power supply voltage is changed from the high power supply potential Vdd to the low power supply potential Vss (E3 in FIG. 21A, a third step). Next, the potential of the terminal 126A is changed to a potential which brings the switching element 127 out of electrical conduction (E4 in FIG. 21A, a fourth step).

Through the above procedures, the supply of the signals to the driver circuit portion 121 can be stopped without causing a malfunction of the driver circuit portion 121. Since a malfunction generated when the displayed image is switched from a moving image to a still image causes a noise and the noise is held as a still image, a liquid crystal display device mounted with a display control circuit with few malfunctions can display a still image with little image deterioration.

Next, the operation of the display control circuit in the period 1404 during which the displayed image is switched from the still image to the moving image is shown in FIG. 21B. The display control circuit changes the potential of the terminal 126A to a potential which brings the switching element 127 into electrical conduction (S1 in FIG. 21B, a first step). Next, the power supply voltage is changed from the low power supply potential Vss to the high power supply potential Vdd (S2 in FIG. 21B, a second step). Then, a high potential of a pulse signal which has a longer pulse width than the normal clock signal GCK to be supplied later is applied as the clock signal GCK, and then a plurality of normal clock signals GCK are supplied (S3 in FIG. 21B, a third step). Next, the start pulse signal GSP is supplied (S4 in FIG. 21B, a fourth step).

Through the above procedures, the supply of the drive signals to the driver circuit portion 121 can be restarted without causing a malfunction of the driver circuit portion 121. Potentials of the wirings are sequentially changed back to those at the time of displaying a moving image, whereby the driver circuit portion can be driven without causing a malfunction.

Figure 22:
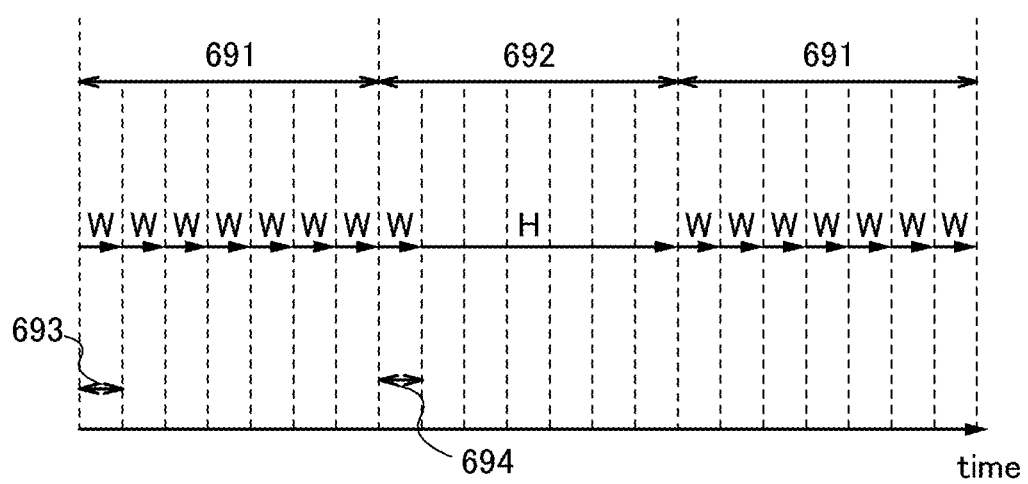
FIG. 22 schematically shows the frequency of writing image signals in frame periods in a period of displaying a moving image and a period of displaying a still image in an embodiment.

FIG. 22 schematically shows writing frequency of image signals in each frame period in a period 691 during which a moving image is displayed or in a period 692 during which a still image is displayed. In FIG. 22, "W" indicates a period during which an image signal is written, and "H" indicates a period during which the image signal is held. In addition, a period 693 in FIG. 22 indicates one frame period; however, the period 693 may be a different period.

In the structure of the liquid crystal display device of this embodiment, an image signal of a still image displayed in the period 692 is written in a period 694, and the image signal written in the period 694 is held in the other period in the period 692.

In the liquid crystal display device described as an example in this embodiment, the frequency of writing an image signal in a period during which a still image is displayed can be reduced. As a result, low power consumption at the time of displaying a still image can be achieved.

In the case where the same images are written plural times to display a still image, visual recognition of switching between the images might cause eyestrain. In the liquid crystal display device of this embodiment, the frequency of writing image signals is reduced, whereby there is an effect of making eyestrain less severe.

Specifically, by using any of the transistors having a small off-state current described in Embodiments 1 to 3 for each pixel and a switching element of a common electrode, the liquid crystal display device of this embodiment can have a long period (time) of holding a voltage in a storage capacitor. As a result, the frequency of writing image signals can be remarkably reduced, so that consumed power at the time of displaying a still image can be significantly reduced and eyestrain can be less severe.

This embodiment can be combined with any of the other embodiments described in this specification as appropriate.

Embodiment 8

In this embodiment, application of the semiconductor device described in any of the above embodiments to an electronic device will be described with reference to FIGS. 16A to 16F. In this embodiment, cases where the above semiconductor device is applied to electronic devices such as a computer, a mobile phone (also referred to as a mobile telephone or a mobile telephone device), a portable information terminal (including a portable game machine, an audio reproducing device, and the like), a camera such as a digital camera or a digital video camera, an electronic paper, or a television device (also referred to as a television or a television receiver) will be described.

Figure 16A:
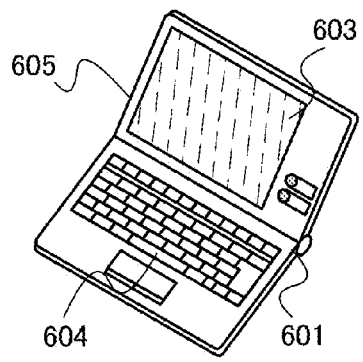
FIGS. 16A to 16F are electronic devices including a semiconductor device of an embodiment.

FIG. 16A illustrates a laptop personal computer which includes a housing 601, a housing 605, a display portion 603, a keyboard 604, and the like. In the housing 601 and the housing 605, the semiconductor device of any of the above embodiments which includes a combination of a transistor including an oxide semiconductor and a transistor including a semiconductor material other than an oxide semiconductor is provided. Therefore, the laptop personal computer capable of holding data for a long time and reading data at high speed can be obtained.

Figure 16D:
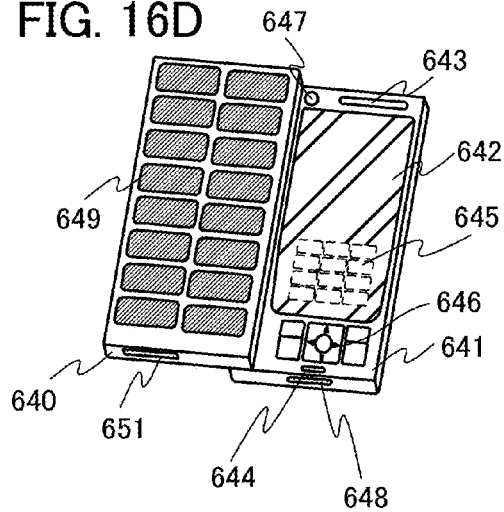
Figure 16B:
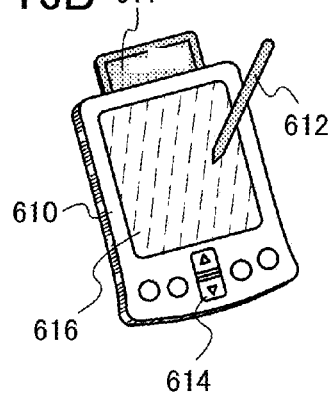

FIG. 16B illustrates a portable information terminal (personal digital assistance (PDA)) which includes a main body 610 provided with a display portion 616, an external interface 617, operation buttons 614, and the like. In addition, a stylus 612 which controls the portable information terminal and the like are provided. In the main body 610, the semiconductor device of any of the above embodiments which includes a combination of the transistor including an oxide semiconductor and a transistor including a semiconductor material other than an oxide semiconductor is provided. Therefore, the portable information terminal capable of holding data for a long time and reading data at high speed can be obtained.

Figure 16E:
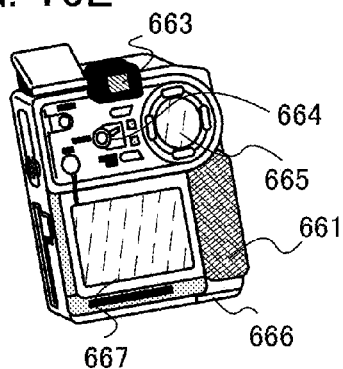
Figure 16C:
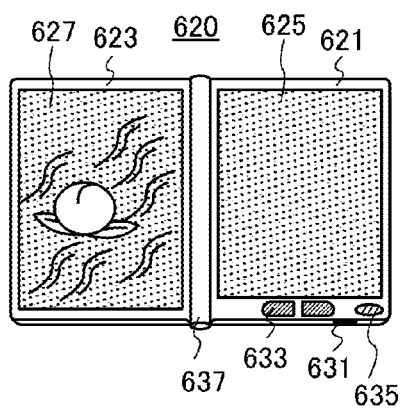

FIG. 16C illustrates an electronic book reader 620 which is mounted with electronic paper and includes two housings, a housing 621 and a housing 623. The housing 621 and the housing 623 are provided with a display portion 625 and a display portion 627, respectively. The housing 621 is connected to the housing 623 by a hinge 637, so that the electronic book reader 620 can be opened and closed using the hinge 637 as an axis. The housing 621 is provided with a power button 631, operation keys 633, a speaker 635, and the like. In at least one of the housing 621 and the housing 623, the semiconductor device of any of the above embodiments which includes a combination of a transistor including an oxide semiconductor and a transistor including a semiconductor material other than an oxide semiconductor is provided. Therefore, the electronic book reader capable of holding data for a long time and reading data at high speed can be obtained.

FIG. 16D illustrates a mobile phone which includes two housings, a housing 640 and a housing 641. Moreover, the housing 640 and the housing 641 developed as illustrated in FIG. 16D can be slid so that one is lapped over the other. Therefore, the size of the mobile phone can be reduced, which makes the mobile phone suitable for being carried around. The housing 641 includes a display panel 642, a speaker 643, a microphone 644, a pointing device 646, a camera lens 647, an external connection terminal 648, and the like. The housing 640 includes a solar cell 649 for charging the mobile phone, an external memory slot 651, and the like. The display panel 642 is provided with a touch-panel function. A plurality of operation keys 645 which are displayed as images is illustrated by dashed lines in FIG. 16D. In addition, an antenna is incorporated in the housing 641. In at least one of the housing 640 and the housing 641, the semiconductor device of any of the above embodiments which includes a combination of a transistor including an oxide semiconductor and a transistor including a semiconductor material other than an oxide semiconductor is provided. Therefore, the mobile phone capable of holding data for a long time and reading data at high speed can be obtained.

FIG. 16E illustrates a digital camera which includes a main body 661, a display portion 667, an eyepiece portion 663, an operation switch 664, a display portion 665, a battery 666, and the like. In the main body 661, the semiconductor device of any of the above embodiments which includes a combination of a transistor including an oxide semiconductor and a transistor including a semiconductor material other than an oxide semiconductor is provided. Therefore, the digital camera capable of holding data for a long time and reading data at high speed can be obtained.

Figure 16F:
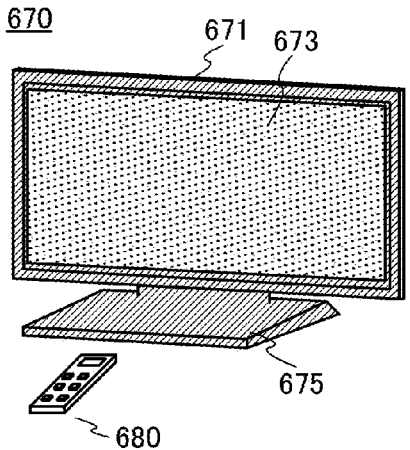

FIG. 16F illustrates a television device 670 which includes a housing 671, a display portion 673, a stand 675, and the like. The television device 670 can be operated with an operation switch of the housing 671 or a remote controller 680. In the housing 671 and the remote controller 680, the semiconductor device of any of the above embodiments which includes a combination of a transistor including an oxide semiconductor and a transistor including a semiconductor material other than an oxide semiconductor is provided. Therefore, the television device capable of holding data for a long time and reading data at high speed can be obtained.

As described above, the electronic devices described in this embodiment are each mounted with the semiconductor device according to any of the above embodiments. In this manner, electronic devices having characteristics of small size, high-speed operation, and low power consumption can be realized.

Embodiment 9

In this embodiment, the kinetic energy of an ion which is added with an ion implantation apparatus or the like was compared with bond energies between a metal and hydrogen, between a metal and a hydroxyl group, and between oxygen and hydrogen in a hydroxyl group that is bonded to a metal in an In—Ga—Zn—O-based oxide semiconductor (amorphous IGZO or a-IGZO) layer. From this comparison, it was confirmed that the bond between a metal included in the oxide semiconductor and hydrogen, the bond between a metal and a hydroxyl group, and the bond between oxygen and hydrogen in a hydroxyl group that is bonded to a metal can be cut by adding a halogen element having a high kinetic energy into the oxide semiconductor layer. Note that the bond energies between a metal and hydrogen, between a metal and a hydroxyl group, and between oxygen and hydrogen in a hydroxyl group that is bonded to a metal in the oxide semiconductor (a-IGZO) layer were calculated using first-principle simulation.

Figure 17:
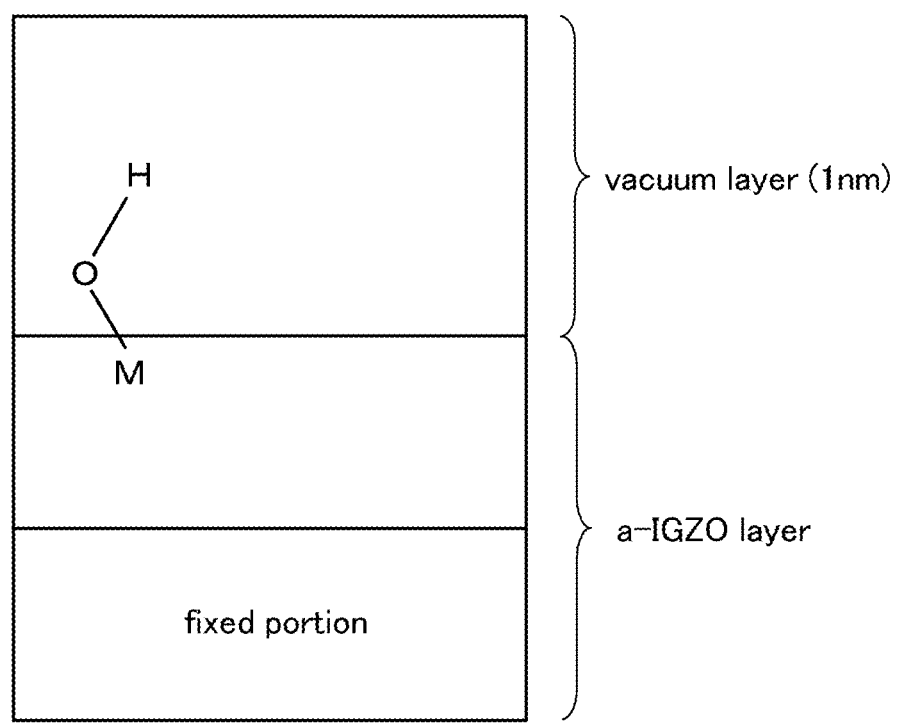
FIG. 17 is a schematic diagram illustrating an example of a simulation model.

In a surface slab model of an a-IGZO layer, a target element or the like of the bond energy simulation is bonded to a metal atom on a surface of the layer, and bond energies were calculated. Here, the surface slab model is a structure in which a surface of a layer in which an atom exists is generated at an interface between the layer in which an atom exists and a vacuum layer in which an atom does not exist, by stacking the two layers in a certain one direction (e.g., a z-axis direction), in a simulation cell to which periodic boundary conditions are applied. For example, in FIG. 17, a surface of an a-IGZO layer is generated at an interface between the a-IGZO layer and a vacuum layer. FIG. 17 shows a case where a hydroxyl group (OH group) is bonded to a metal atom on the surface of the a-IGZO layer. Also in FIG. 17, the atom position is fixed in a lower half of the a-IGZO layer.

Specifically, energies of the following structures were calculated: a surface slab model of an a-IGZO (structure 1); a structure in which a hydrogen (H) atom is bonded to a metal (In, Ga, or Zn) on a surface of the structure 1 (structure 2); a structure in which an oxygen (O) atom is bonded to a metal (In, Ga, or Zn) on a surface of the structure 1 (structure 3); and a structure in which a hydroxyl (OH) group is bonded to a metal (In, Ga, or Zn) on a surface of the structure 1 (structure 4). In addition, in order to obtain an energy between a hydrogen atom and a hydroxyl group, an energy of a hydrogen atom in an isolated state (structure 5) and an energy of a hydroxyl group in an isolated state (structure 6) were calculated.

(Formation Procedure of Models)

Through classical molecular dynamics simulation, first-principle molecular dynamics simulation, and first-principle structure optimization, an a-IGZO bulk model was formed. A surface slab model was formed using the bulk model and the structure of the surface slab model was optimized by first-principle simulation.

(Simulation Conditions)

Materials Explorer (manufactured by Fujitsu Limited) was used for the classical molecular dynamics simulation. In a simulation cell, 84 atoms in total (the ratio of the atoms was In:Ga:Zn:O=1:1:1:4) were randomly arranged, and the density was set to 5.9 g/cm$^3$. The temperature was gradually lowered from 5500 K to 1500 K in the NVT ensemble, and then annealing was performed at 1500 K. The total calculation time was 12.44 ns with time intervals of 0.2 fs. As for potentials, a Born-Mayer-Huggins potential was applied to a metal-oxygen bond and an oxygen-oxygen bond, and a Lennard-Jones potential was applied to a metal-metal bond. Charges were set as follows: +3 for In, +3 for Ga, +2 for Zn, and −2 for O.

CASTEP (manufactured by Accelrys Software Inc.) was used as the first-principle simulation program. CASTEP is a simulation program on the basis of the density functional theory and simulation is conducted using a pseudopotential and a plane wave. The LDA was used for the functional and an ultrasoft type was used for the pseudopotential. The cut-off energy was 380 eV, and a 2×2×1 k-point grid was used.

(Definition of Bond Energy)

The bond energies were calculated using the definitional identities noted in Formula 1.

$$E_{M-H} = \{E(a\text{-IGZO\_M}) + E(H)\} - E(a\text{-IGZO\_M-H})$$

$$E_{MO-H} = \{E(a\text{-IGZO\_M-O}) + E(H)\} - E(a\text{-IGZO\_M-O--H})$$

$$E_{M-OH} = \{E(a\text{-IGZO\_M}) + E(O\text{--H})\} - E(a\text{-IGZO\_M-O--H}) \quad \text{[FORMULA 1]}$$

In Formula 1, $E_{M-H}$ indicates a bond energy between a metal of an a-IGZO and hydrogen. $E_{MO-H}$ indicates a bond energy between oxygen and hydrogen in a hydroxyl group which is bonded to a metal in an a-IGZO. $E_{M-OH}$ indicates a bond energy between a metal and a hydroxyl group in an a-IGZO. E(a-IGZO_M) indicates an energy of a slab structure including 84 atoms of an amorphous IGZO (the structure 1). E(a-IGZO_M-H) indicates an energy of a structure in which a hydrogen atom (H) is added to a metal M (In, Ga, or Zn) on a surface of the 84 atoms of the amorphous IGZO (the structure 2). E(a-IGZO_M-O) indicates an energy of a structure in which an oxygen atom (O) is added to a metal M (In, Ga, or Zn) on a surface of the 84 atoms of the amorphous IGZO (the structure 3). E(a-IGZO_M-O—H) indicates an energy of a structure in which a hydroxyl (OH) group is added to a metal M (In, Ga, or Zn) on a surface of the 84 atoms of the amorphous IGZO (the structure 4). E(H) indicates an energy of a hydrogen atom (the structure 5). E(O—H) indicates an energy of a hydroxyl group (the structure 6).

The values of bond energy when the metal M is varied, which are obtained from the calculation, are shown in Table 1.

TABLE 1

| Metal M | Bond Energy (eV) | | |
|---|---|---|---|
| | $E_{M-H}$ | $E_{MO-H}$ | $E_{M-OH}$ |
| In | 2.74 | 4.83 | 4.75 |
| Ga | 2.35 | 3.79 | 4.61 |
| Zn | 1.21 | 4.95 | 3.84 |

From the above results, it was found that bond energies between a metal and hydrogen, between a metal and a hydroxyl group, and between oxygen and hydrogen in a hydroxyl group that is bonded to a metal were all several electron volts. Meanwhile, the kinetic energy of an ion of a halogen element which is added in this embodiment of this specification can be 5 keV to 100 keV with an ion doping apparatus, which is significantly higher than the above bond energies. This shows that addition of a halogen element having a high kinetic energy into an oxide semiconductor layer can cut, for example, a bond between a metal of an oxide semiconductor and hydrogen, a bond between a metal and a hydroxyl group, or a bond between oxygen and hydrogen in a hydroxyl group that is bonded to a metal.

This application is based on Japanese Patent Application serial no. 2010-049263 filed with Japan Patent Office on Mar. 5, 2010, the entire contents of which are hereby incorporated by reference.

EXPLANATION OF REFERENCE

100: liquid crystal display device, 110: image processing circuit, 113: display control circuit, 116: power supply, 120: display panel, 121: driver circuit portion, 121A: gate line driver circuit, 121B: source line driver circuit, 122: pixel portion, 123: pixel, 124: gate line, 125: source line, 126: terminal portion, 126A: terminal, 126B: terminal, 127: switching element, 128: common electrode, 130: backlight unit, 131: backlight control circuit, 132: backlight, 200: substrate, 202: protective layer, 204: semiconductor region, 206: element isolation insulating layer, 208: gate insulating layer, 210: gate electrode, 211: capacitor, 214: transistor, 215: liquid crystal element, 216: channel formation region, 220: impurity region, 222: metal layer, 224: metal compound region, 228: insulating layer, 230: insulating layer, 242a: electrode, 242b: electrode, 243a: insulating layer, 243b: insulating layer, 244: oxide semiconductor layer, 246: gate insulating layer, 248a: gate electrode, 248b: electrode, 250: insulating layer, 252: insulating layer, 254: electrode, 256: wiring, 260: transistor, 262: transistor, 264: capacitor, 500: substrate, 502: gate insulating layer, 507: insulating layer, 508: protective insulating layer, 511: gate electrode, 513a: oxide semiconductor layer, 513b: oxide semiconductor layer, 513c: oxide semiconductor layer, 515a: electrode, 515b: electrode, 550: transistor, 600: substrate, 601: housing, 602: gate insulating layer, 603: display portion, 604: keyboard, 605: housing, 608: protective insulating layer, 610: main body, 611: gate electrode, 612: stylus, 613a: oxide semiconductor layer, 613b: oxide semiconductor layer, 613c: oxide semiconductor layer, 614: operation buttons, 615a: electrode, 615b: electrode, 616: display portion, 617: external interface, 620: electronic book reader, 621: housing, 623: housing, 625: display portion, 627: display portion, 631: power button, 633: operation keys, 635: speaker, 637: hinge, 640: housing, 641: housing, 642: display panel, 643: speaker, 644: microphone, 645: operation keys, 646: pointing device, 647: camera lens, 648: external connection terminal, 649: solar cell, 650: transistor, 651: external memory slot, 661: main body, 663: eyepiece portion, 664: operation switch, 665: display portion, 666: battery, 667: display portion, 670: television device, 671: housing, 673: display portion, 675: stand, 680: remote controller, 691: period, 692: period, 693: period, 694: period, 700: transistor, 710: transistor, 720: capacitor, 750: memory cell, 1000: substrate, 1002: gate insulating layer, 1007: insulating layer, 1008: protective insulating layer, 1011: gate electrode, 1013a: oxide semiconductor layer, 1013b: oxide semiconductor layer, 1013c: oxide semiconductor layer, 1013d: oxide semiconductor layer, 1015a: electrode, 1015b: electrode, 1050: transistor, 1401: period, 1402: period, 1403: period, and 1404: period.

The invention claimed is:

1. A manufacturing method of a semiconductor device, comprising the steps of:

forming a gate electrode over a substrate having an insulating surface;

forming a gate insulating layer over the gate electrode;

forming an oxide semiconductor layer overlapping with the gate electrode and in contact with the gate insulating layer, the oxide semiconductor layer comprising indium;

adding a halogen element into the oxide semiconductor layer after the formation of the oxide semiconductor layer;

performing first heat treatment on the oxide semiconductor layer after the addition of the halogen element;

adding oxygen into the oxide semiconductor layer by ion doping or ion implantation after the first heat treatment;

forming a source electrode and a drain electrode each having an end portion overlapping with the gate electrode and in contact with the oxide semiconductor layer after the addition of oxygen into the oxide semiconductor layer; and forming an insulating layer overlapping with a channel formation region of the oxide semiconductor layer and in contact with the oxide semiconductor layer.

2. The manufacturing method of a semiconductor device according to claim 1, wherein second heat treatment is performed after the addition of oxygen into the oxide semiconductor layer.

3. The manufacturing method of a semiconductor device according to claim 1, wherein the first heat treatment is performed at a temperature higher than or equal to 250° C. and lower than or equal to 600° C.

4. The manufacturing method of a semiconductor device according to claim 1, wherein third heat treatment is performed after the step of forming the oxide semiconductor layer.

5. The manufacturing method of a semiconductor device according to claim 1, wherein the halogen element is fluorine.

6. The manufacturing method of a semiconductor device according to claim 1, wherein the halogen element is added into the oxide semiconductor layer by one of plasma doping, ion doping, and ion implantation.

7. A manufacturing method of a semiconductor device, comprising a step of forming a second transistor using the manufacturing method of a semiconductor device according to claim 1, over an insulating film formed over a first transistor.

8. A manufacturing method of a semiconductor device, comprising the steps of:
   forming an oxide semiconductor layer comprising indium;
   adding a halogen element into the oxide semiconductor layer after the formation of the oxide semiconductor layer;
   performing first heat treatment on the oxide semiconductor layer after the addition of the halogen element; and
   adding oxygen into the oxide semiconductor layer by ion doping or ion implantation after the first heat treatment.

9. The manufacturing method of a semiconductor device according to claim 8, wherein the halogen element is fluorine.

10. The manufacturing method of a semiconductor device according to claim 8, wherein the halogen element is added into the oxide semiconductor layer by one of plasma doping, ion doping, and ion implantation.

11. A manufacturing method of a semiconductor device, comprising the steps of:
    forming a source electrode and a drain electrode over a substrate having an insulating surface;
    forming an oxide semiconductor layer covering an end portion of the source electrode and an end portion of the drain electrode, the oxide semiconductor layer comprising indium;
    adding a halogen element into the oxide semiconductor layer after the formation of the oxide semiconductor layer;
    performing first heat treatment on the oxide semiconductor layer after the addition of the halogen element;
    adding oxygen into the oxide semiconductor layer by ion doping or ion implantation after the first heat treatment;
    forming a gate insulating layer overlapping with the end portion of the source electrode and the end portion of the drain electrode and in contact with the oxide semiconductor layer after the addition of oxygen into the oxide semiconductor layer; and
    forming a gate electrode overlapping with the end portion of the source electrode and the end portion of the drain electrode and in contact with the gate insulating layer.

12. The manufacturing method of a semiconductor device according to claim 11, wherein second heat treatment is performed after the addition of oxygen into the oxide semiconductor layer.

13. The manufacturing method of a semiconductor device according to claim 11, wherein the first heat treatment is performed at a temperature higher than or equal to 250° C. and lower than or equal to 600° C.

14. The manufacturing method of a semiconductor device according to claim 11, wherein third heat treatment is performed after the step of forming the oxide semiconductor layer.

15. The manufacturing method of a semiconductor device according to claim 11, wherein the halogen element is fluorine.

16. The manufacturing method of a semiconductor device according to claim 11, wherein the halogen element is added into the oxide semiconductor layer by one of plasma doping, ion doping, and ion implantation.

17. A manufacturing method of a semiconductor device, comprising a step of forming a second transistor using the manufacturing method of a semiconductor device according to claim 11, over an insulating film formed over a first transistor.

* * * * *